(12) United States Patent
Hosek et al.

(10) Patent No.: US 12,296,473 B2
(45) Date of Patent: *May 13, 2025

(54) TRANSPORT APPARATUS WITH PULLEY WITH A NON-CIRCULAR PROFILE

(71) Applicant: Persimmon Technologies Corporation, Wakefield, MA (US)

(72) Inventors: Martin Hosek, Salem, MA (US); Leonard T. Lilliston, Roxbury, MA (US); Jacob Lipcon, Arlington, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/211,810

(22) Filed: Jun. 20, 2023

(65) Prior Publication Data

US 2023/0347505 A1 Nov. 2, 2023

Related U.S. Application Data

(63) Continuation of application No. 15/067,684, filed on Mar. 11, 2016, now Pat. No. 11,691,268.

(60) Provisional application No. 62/275,884, filed on Jan. 7, 2016, provisional application No. 62/264,436, filed on Dec. 8, 2015, provisional application No. 62/137,458, filed on Mar. 24, 2015, provisional application No. 62/135,490, filed on Mar. 19, 2015, (Continued)

(51) Int. Cl.
*B25J 9/04* (2006.01)
*B25J 9/10* (2006.01)
*H01L 21/677* (2006.01)

(52) U.S. Cl.
CPC ............... *B25J 9/042* (2013.01); *B25J 9/043* (2013.01); *B25J 9/104* (2013.01); *H01L 21/67742* (2013.01); *Y10S 901/15* (2013.01); *Y10S 901/21* (2013.01); *Y10S 901/27* (2013.01); *Y10S 901/28* (2013.01); *Y10S 901/29* (2013.01)

(58) Field of Classification Search
CPC ....................................... B25J 9/042
See application file for complete search history.

(56) References Cited

U.S. PATENT DOCUMENTS

| 4,674,947 A | 6/1987 | Hamada et al. |
| 4,865,577 A | 9/1989 | Freudenstein |

(Continued)

FOREIGN PATENT DOCUMENTS

| CN | 1765004 A | 4/2004 |
| CN | 1902031 A | 1/2007 |

(Continued)

*Primary Examiner* — Gerald McClain
(74) *Attorney, Agent, or Firm* — McCarter & English, LLP

(57) ABSTRACT

An apparatus having a drive unit having a first drive axis rotatable about a first axis of rotation and a second drive axis rotatable about a second axis of rotation, the second drive axis being coaxial with and partially within the first drive axis and axially rotatable within the first drive axis. A robot arm has an upper arm connected to the drive unit at the first drive axis, a forearm coupled to the upper arm, the forearm being coupled to the upper arm at a first rotary joint and rotatable about the first rotary joint, the first rotary joint being actuatable by a first band arrangement coupled to the second drive axis, and an end effector coupled to the forearm.

19 Claims, 51 Drawing Sheets

Related U.S. Application Data provisional application No. 62/132,066, filed on Mar. 12, 2015.

(56) References Cited

U.S. PATENT DOCUMENTS

| | | | |
|---|---|---|---|
| 4,895,554 A | 1/1990 | Isamu | |
| 4,917,556 A | 4/1990 | Stark et al. | |
| 5,083,896 A | 1/1992 | Uehara et al. | |
| 5,374,147 A | 12/1994 | Hiroki et al. | |
| 5,382,803 A * | 1/1995 | Asakawa | H01L 21/67201 |
| | | | 250/442.11 |
| 5,584,647 A | 12/1996 | Uehara et al. | |
| 5,950,495 A | 9/1999 | Ogawa | |
| 6,102,649 A | 8/2000 | Ogawa | |
| 6,109,860 A | 8/2000 | Ogawa | |
| 6,126,381 A | 10/2000 | Bacchi et al. | |
| 6,155,768 A | 12/2000 | Bacchi et al. | |
| 6,190,114 B1 | 2/2001 | Ogawa | |
| 6,293,746 B1 | 9/2001 | Ogawa | |
| 6,315,512 B1 | 11/2001 | Tabrizi et al. | |
| 6,547,510 B1 | 4/2003 | Beaulieu | |
| 6,593,718 B1 | 7/2003 | Yamazoe | 318/568.11 |
| 6,601,468 B2 | 8/2003 | Grover et al. | |
| 6,663,333 B2 | 12/2003 | Kinnard et al. | |
| 6,669,434 B2 | 12/2003 | Namba | |
| 6,737,826 B2 | 5/2004 | Gilchrist | |
| 6,748,293 B1 | 6/2004 | Larsen | |
| 6,837,883 B2 | 1/2005 | Moll et al. | |
| 6,893,204 B1 | 5/2005 | Suzuki | |
| 7,086,822 B2 | 8/2006 | Maeda | |
| 7,114,907 B2 | 10/2006 | Ogawa et al. | |
| 7,306,423 B2 | 12/2007 | Ogawa | |
| 7,578,649 B2 | 8/2009 | Caveney | |
| 7,837,425 B2 | 11/2010 | Saeki | |
| 7,946,800 B2 | 5/2011 | Hosek et al. | |
| 7,988,399 B2 | 8/2011 | Van Der Meulen | |
| 8,322,963 B2 | 12/2012 | Hudgens et al. | |
| 8,562,271 B2 | 10/2013 | Hofmeister | |
| 8,784,033 B2 | 7/2014 | Kremerman | |
| 8,833,196 B2 | 9/2014 | Furuichi | |
| 8,910,984 B2 * | 12/2014 | Akae | B25J 15/0028 |
| | | | 294/111 |
| 9,190,306 B2 | 11/2015 | Blank | |
| 9,248,568 B2 | 2/2016 | Caveney | |
| 9,325,228 B2 | 4/2016 | Hudgens | |
| 9,457,464 B2 | 10/2016 | Kremerman | |
| 9,742,250 B2 | 8/2017 | Kremerman | |
| 2002/0078778 A1 | 6/2002 | Grover et al. | |
| 2002/0082612 A1 | 6/2002 | Moll et al. | |
| 2003/0012624 A1 | 1/2003 | Kinnard et al. | |
| 2005/0079042 A1 | 4/2005 | Maeda | |
| 2007/0002002 A1 | 1/2007 | Caveney et al. | |
| 2007/0020082 A1 * | 1/2007 | Caveney | H01L 21/67766 |
| | | | 414/744.5 |
| 2009/0003976 A1 | 1/2009 | Hofmeister | |
| 2009/0053016 A1 | 2/2009 | Van Der Meulen | |
| 2009/0095111 A1 | 4/2009 | Kitahara et al. | |
| 2009/0263215 A1 | 10/2009 | Hudgens et al. | |
| 2010/0178147 A1 | 7/2010 | Kremerman | |
| 2012/0045308 A1 | 2/2012 | Kremerman | |
| 2012/0141235 A1 | 6/2012 | Krupyshev | |
| 2012/0232690 A1 | 9/2012 | Gilchrist et al. | |
| 2013/0121798 A1 * | 5/2013 | Hosek | H01L 21/677 |
| | | | 414/800 |
| 2013/0149076 A1 | 6/2013 | Cox | |
| 2013/0156534 A1 | 6/2013 | Furukawa | |
| 2014/0205416 A1 | 7/2014 | Hosek et al. | |
| 2014/0286741 A1 | 9/2014 | Kremerman et al. | |
| 2014/0365004 A1 | 12/2014 | Hosek et al. | 700/248 |
| 2014/0365011 A1 | 12/2014 | Hosek et al. | |
| 2015/0071737 A1 | 3/2015 | Hofmeister et al. | |
| 2017/0028546 A1 * | 2/2017 | Wilkas | H01L 21/67742 |
| 2020/0384634 A1 * | 12/2020 | Muthukamatchy | |
| | | | H01L 21/02104 |

FOREIGN PATENT DOCUMENTS

| | | |
|---|---|---|
| CN | 102326244 A | 1/2012 |
| CN | 102476383 A | 5/2012 |
| CN | 103811385 A | 5/2014 |
| GB | 2193482 A | 2/1988 |
| JP | S-6342142 A | 2/1988 |
| JP | S-64500072 A | 1/1989 |
| JP | 64-56983 U | 10/1989 |
| JP | 02083182 A | 3/1990 |
| JP | H0825151 B2 | 3/1996 |
| JP | H-09285982 A | 11/1997 |
| JP | 10217167 A | 8/1998 |
| JP | H-10217167 A | 8/1998 |
| JP | 11033950 A | 2/1999 |
| JP | 2001077174 A | 3/2001 |
| JP | 2001-217296 A | 8/2001 |
| JP | 2002158272 A | 5/2002 |
| JP | 2004288718 A | 10/2004 |
| JP | 2004288719 A | 10/2004 |
| JP | 2005161416 A | 6/2005 |
| JP | 2005229087 A | 8/2005 |
| JP | 2007511104 A | 4/2007 |
| JP | 2007152490 A | 6/2007 |
| JP | 2009503811 A | 1/2009 |
| JP | 2009049200 A | 3/2009 |
| JP | 2010527149 A | 8/2010 |
| JP | 2013544034 A | 12/2013 |
| WO | WO-8706561 A1 | 11/1987 |
| WO | WO-99/56920 A1 | 11/1999 |
| WO | WO-00/18547 A1 | 4/2000 |
| WO | WO-02/34477 A1 | 5/2002 |
| WO | WO-2008144664 A1 | 11/2008 |
| WO | WO-2012/129254 A2 | 9/2012 |
| WO | WO-2013008310 A1 | 1/2013 |
| WO | WO-2014/113364 A1 | 7/2014 |

* cited by examiner

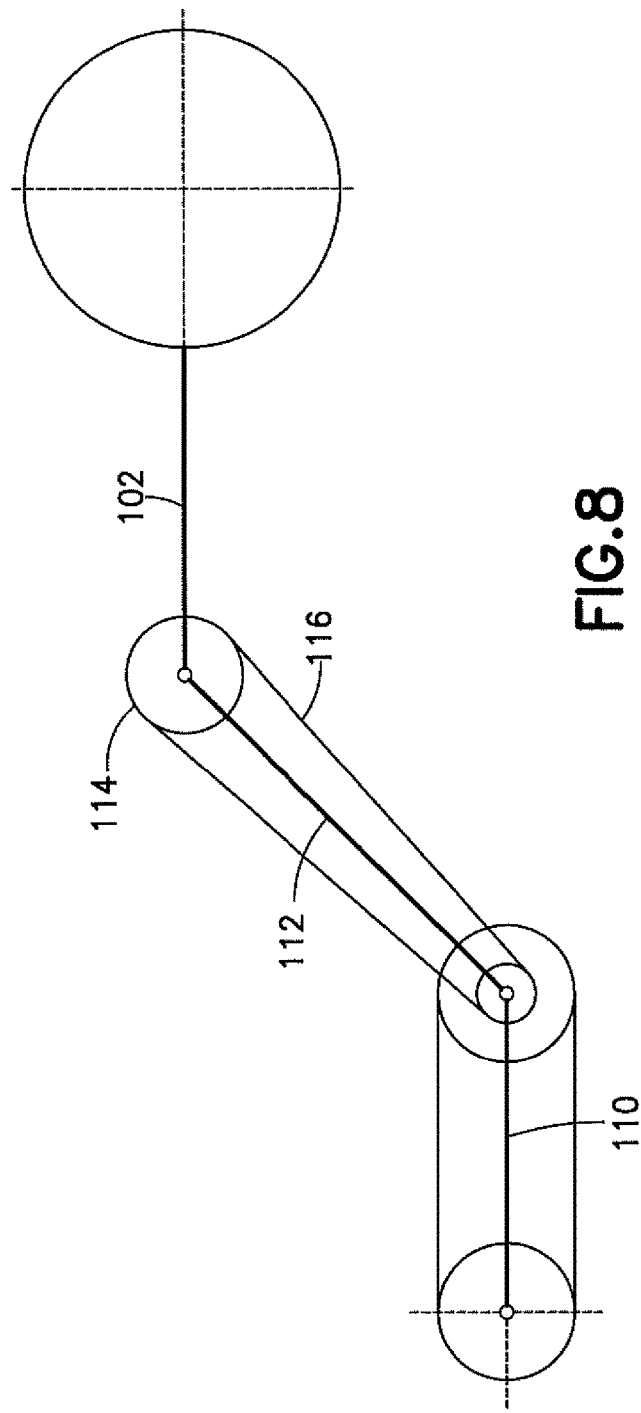
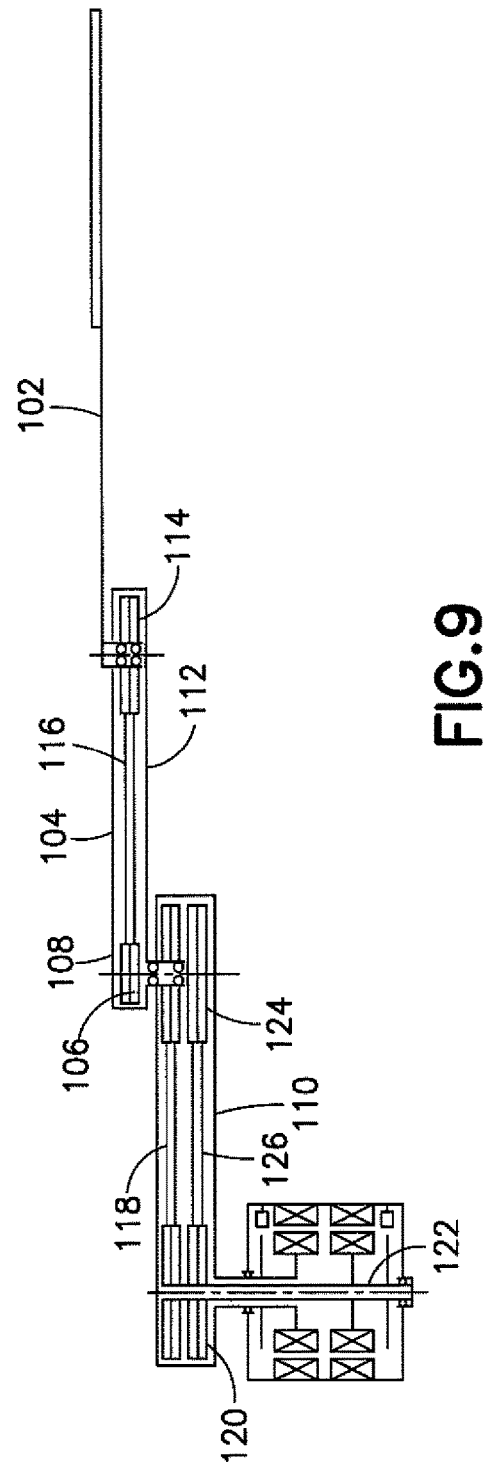
FIG. 8
FIG. 9

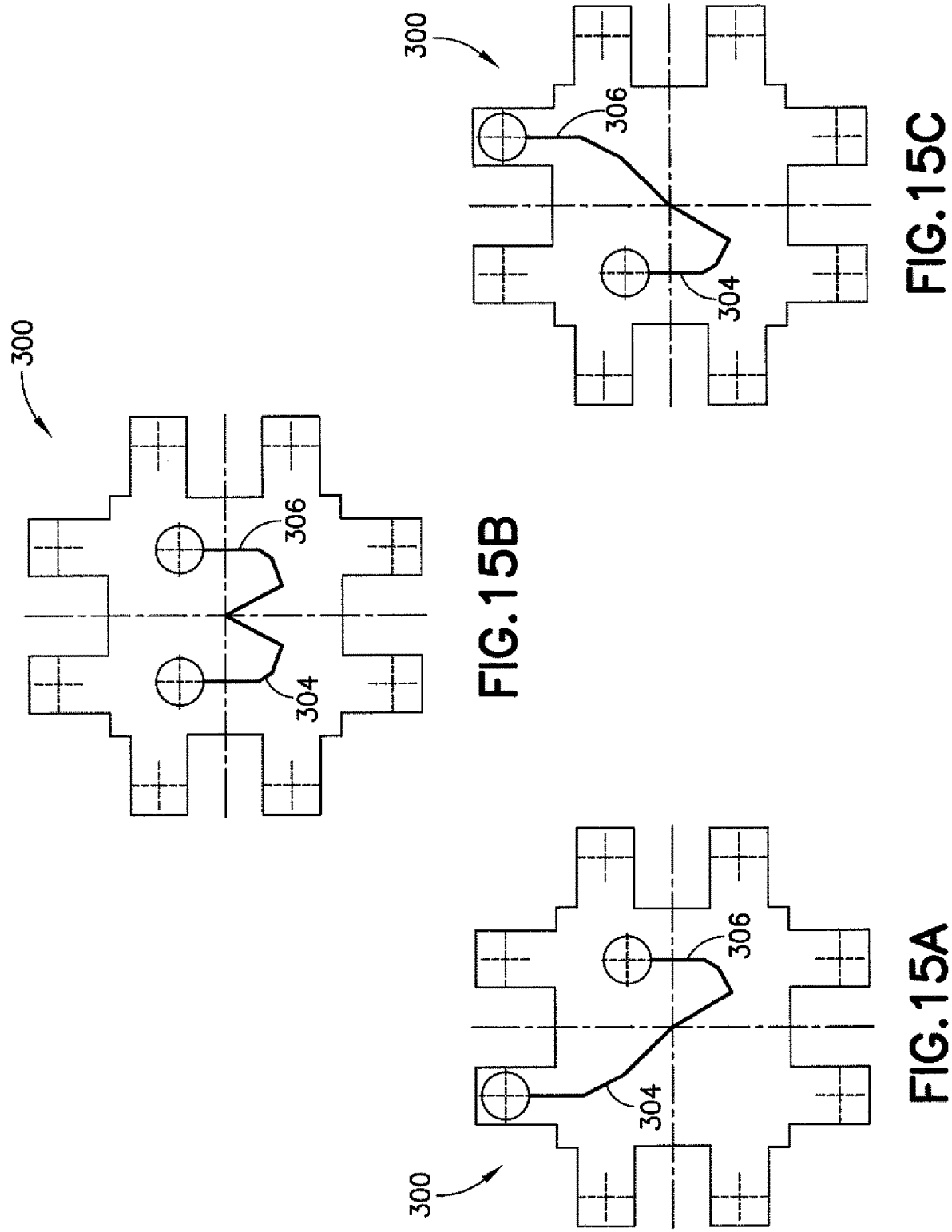

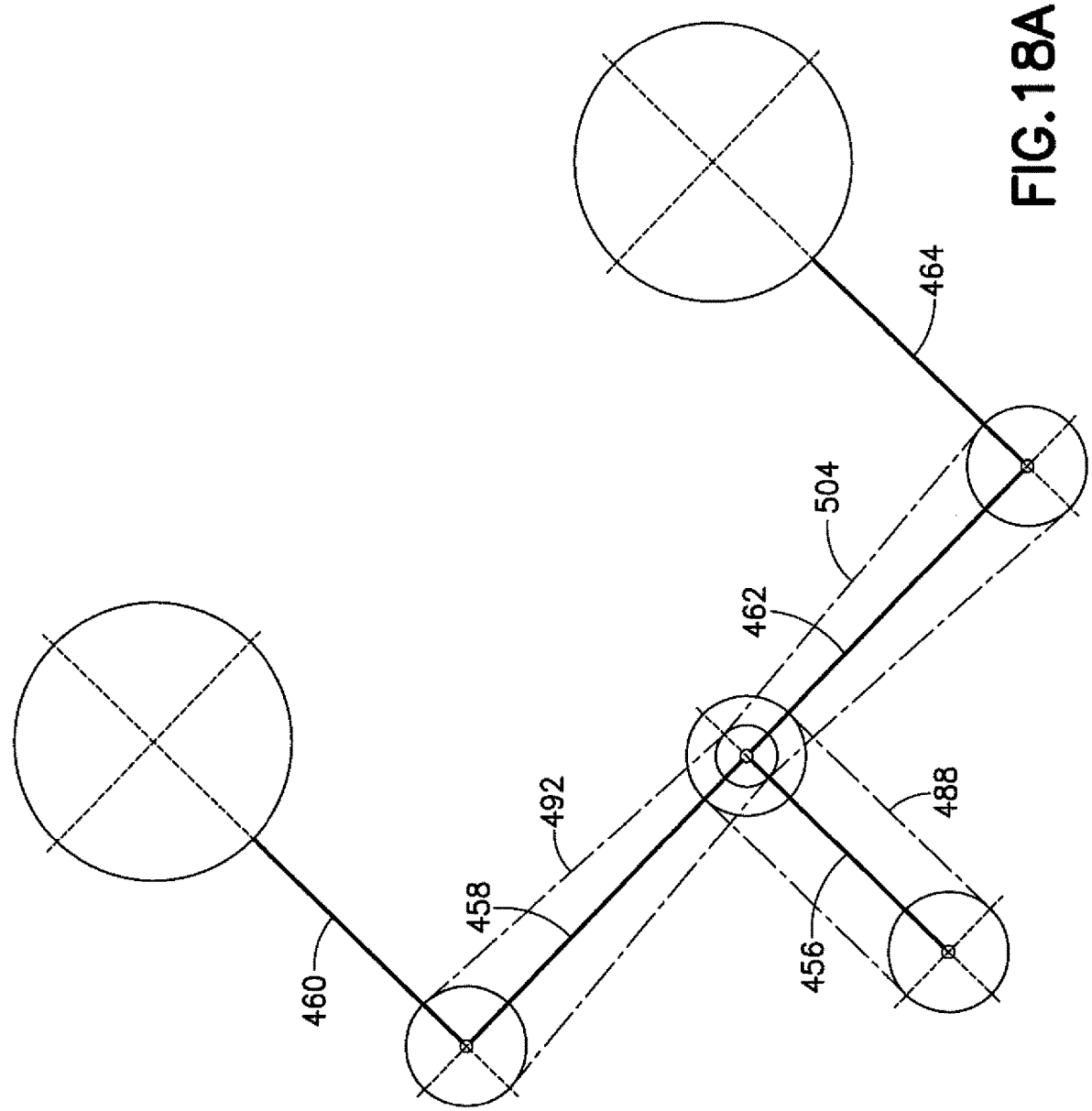

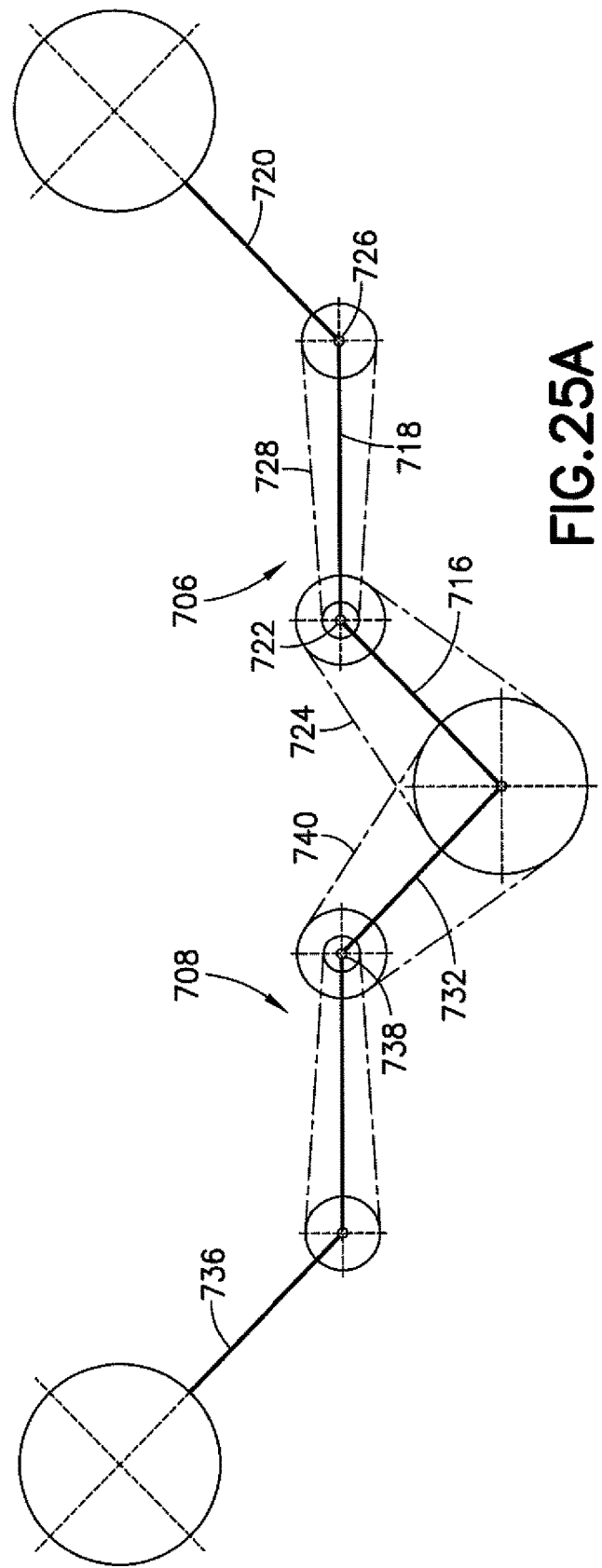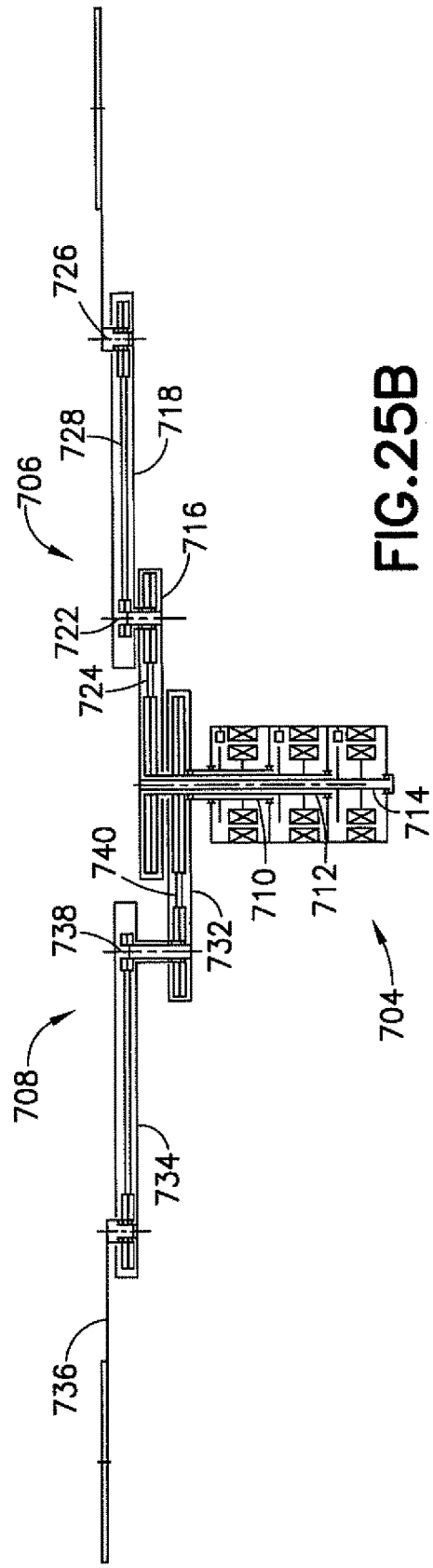

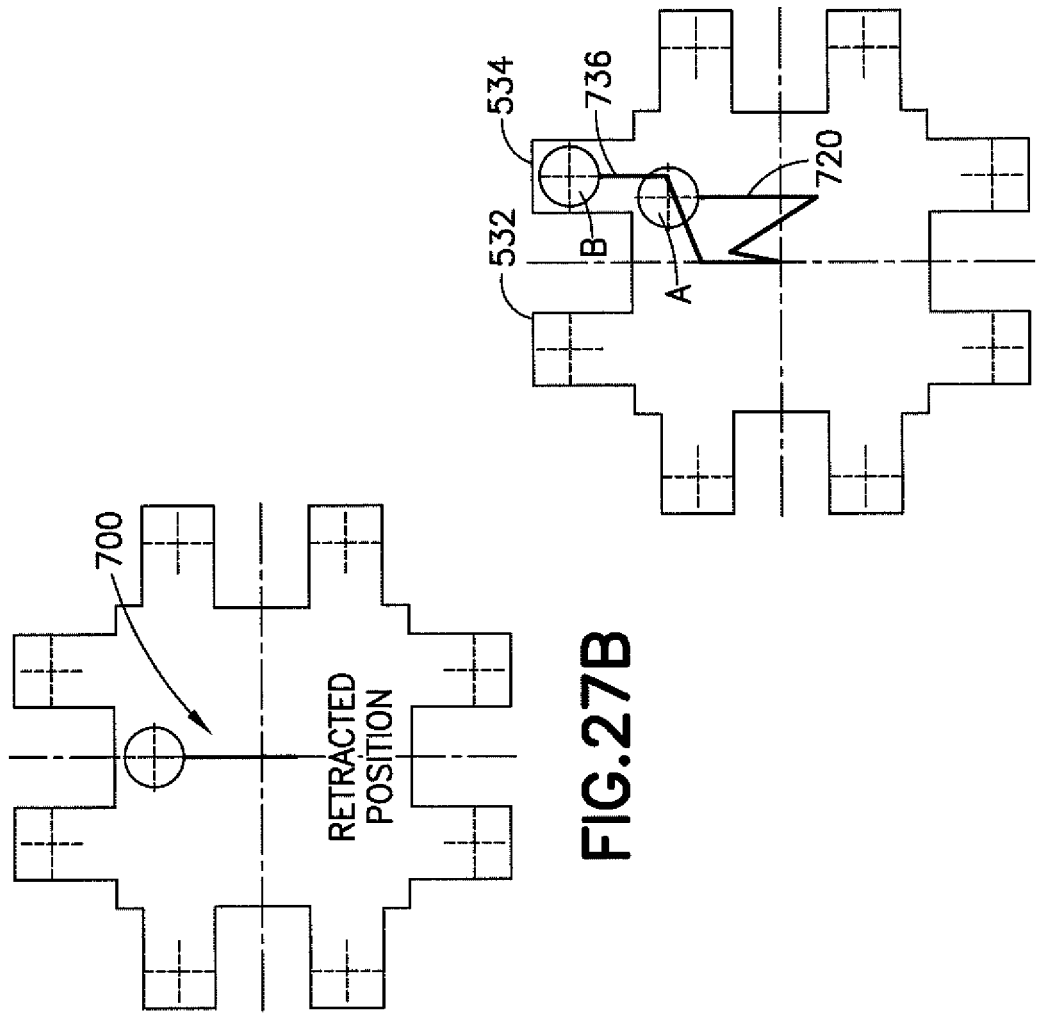
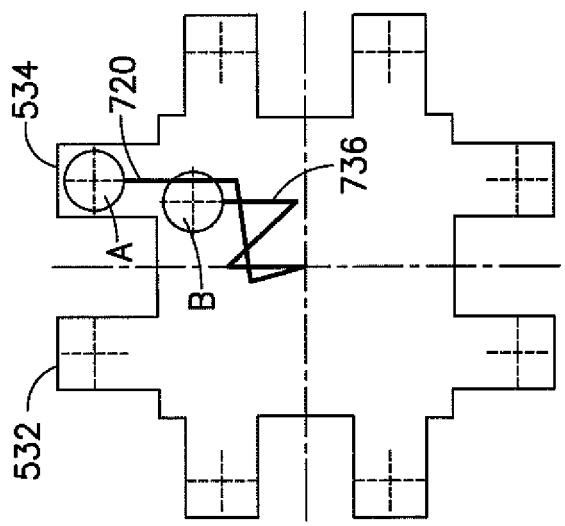

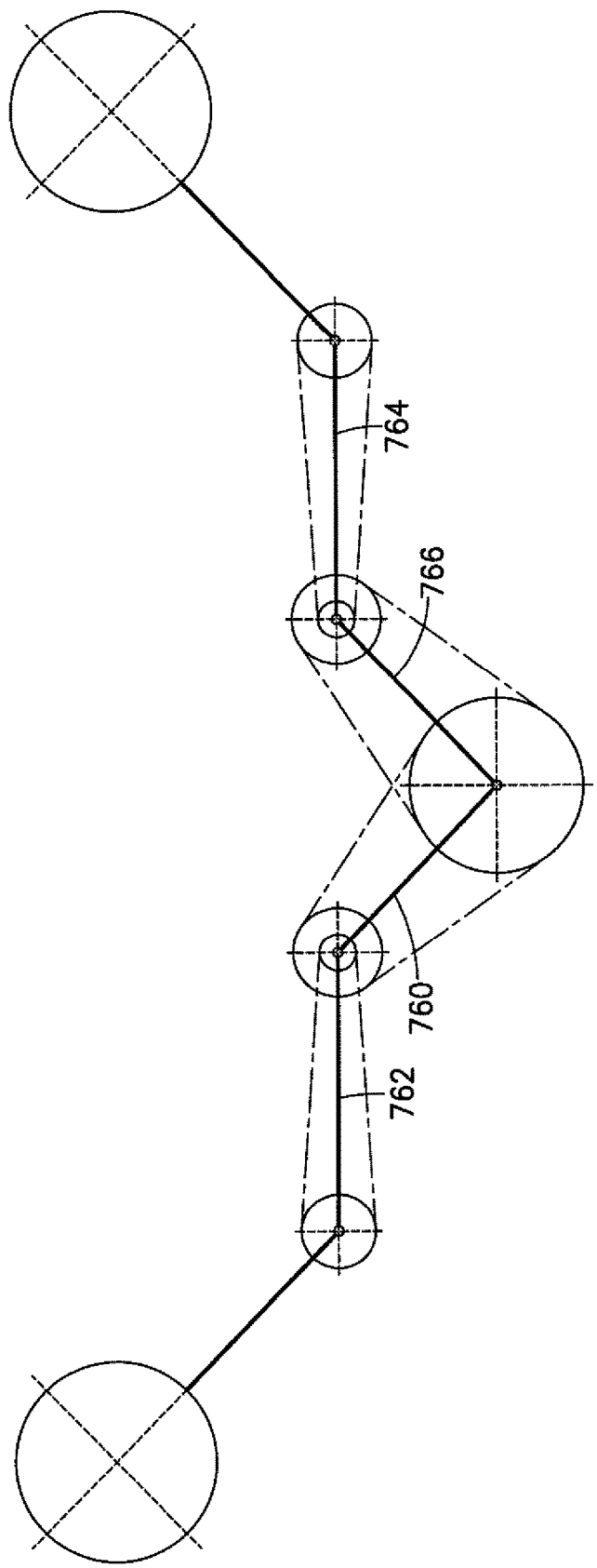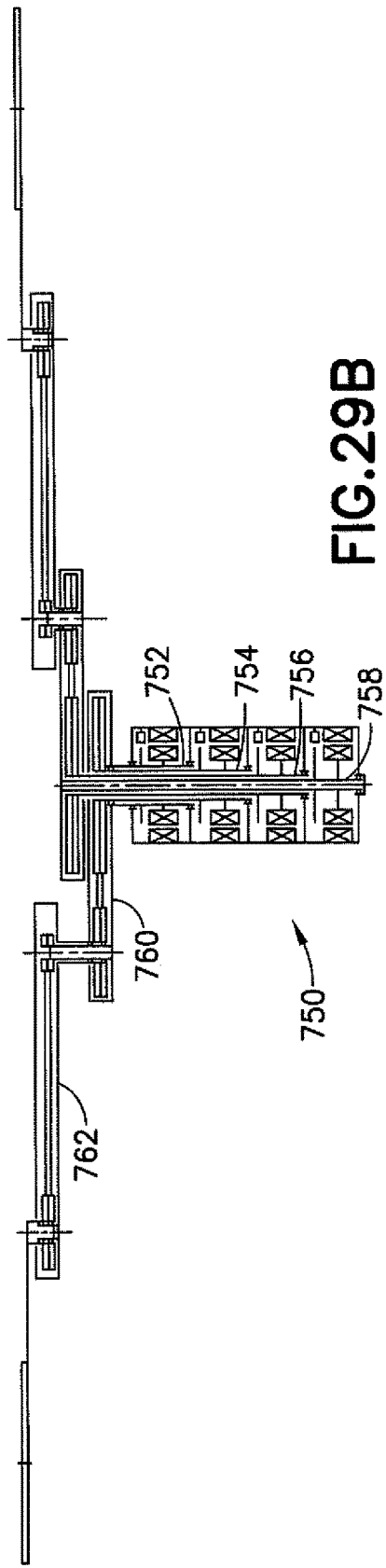

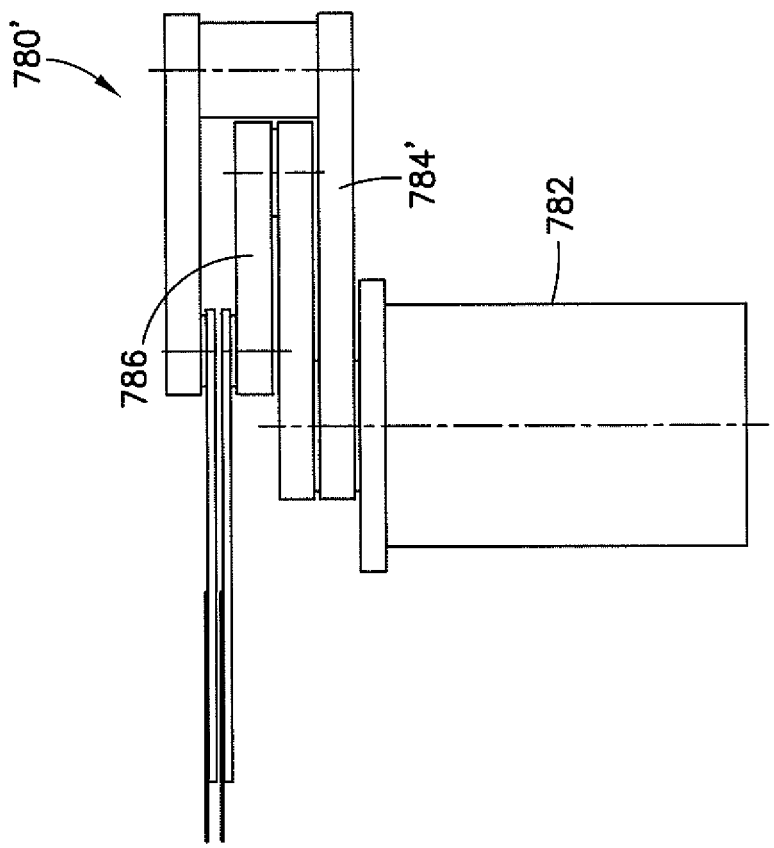
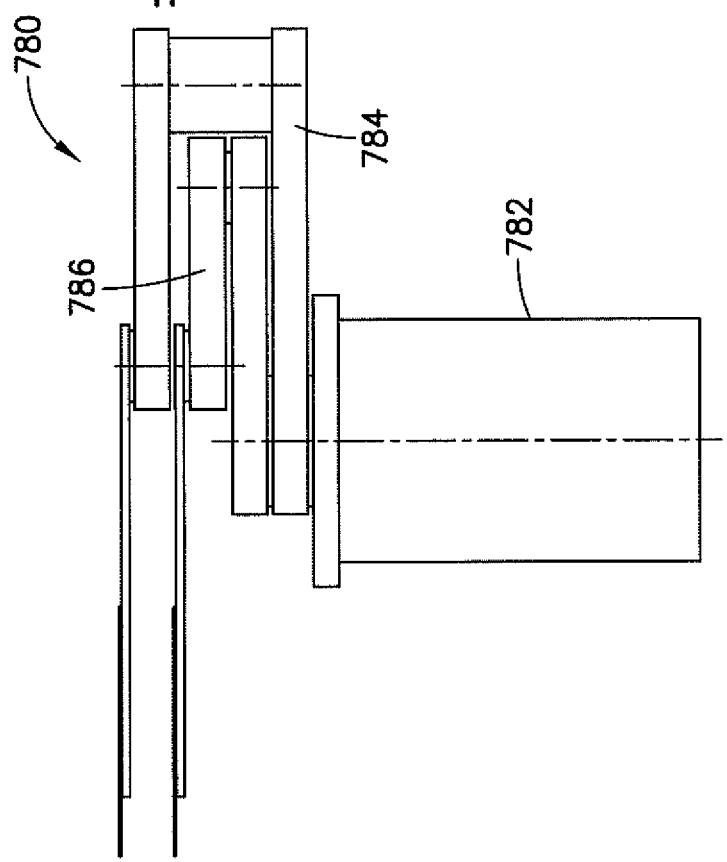

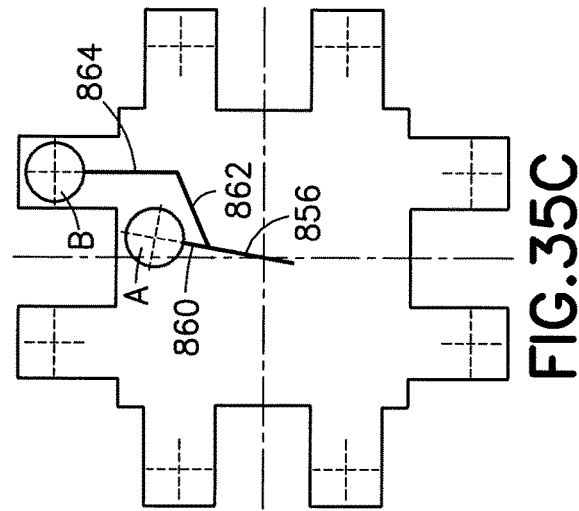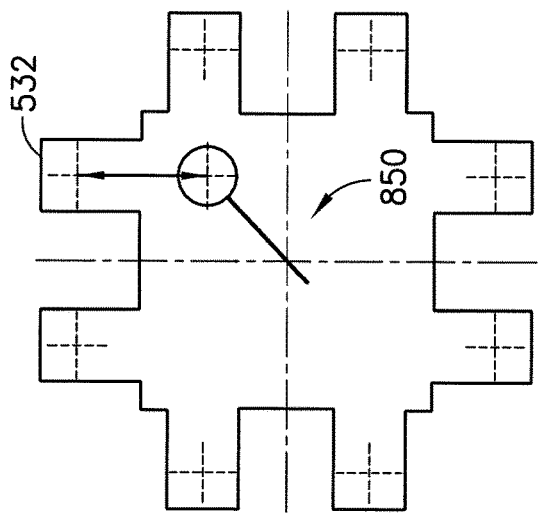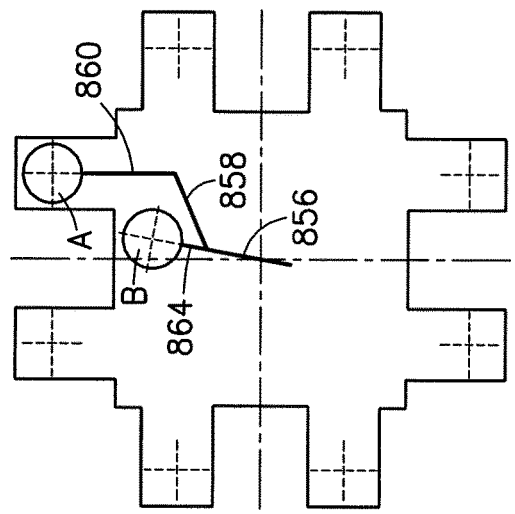

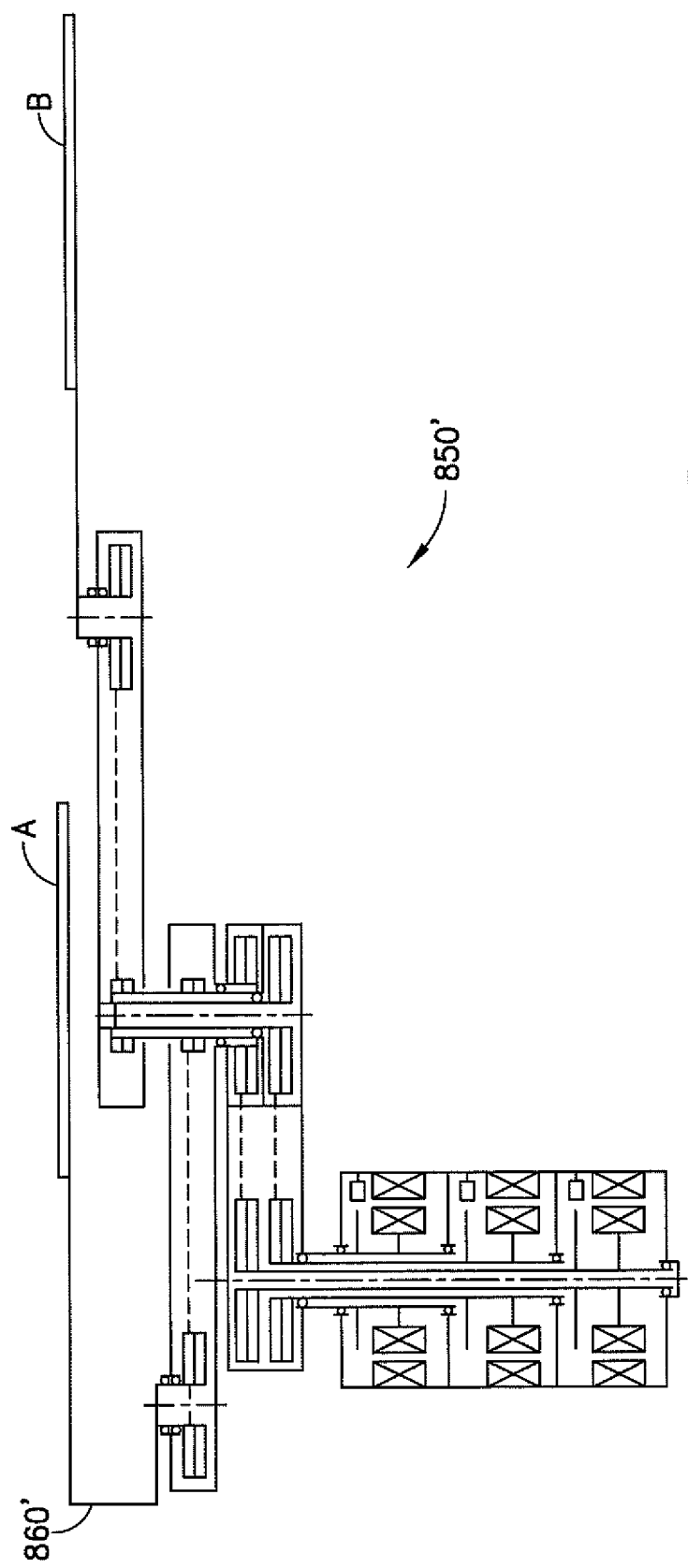

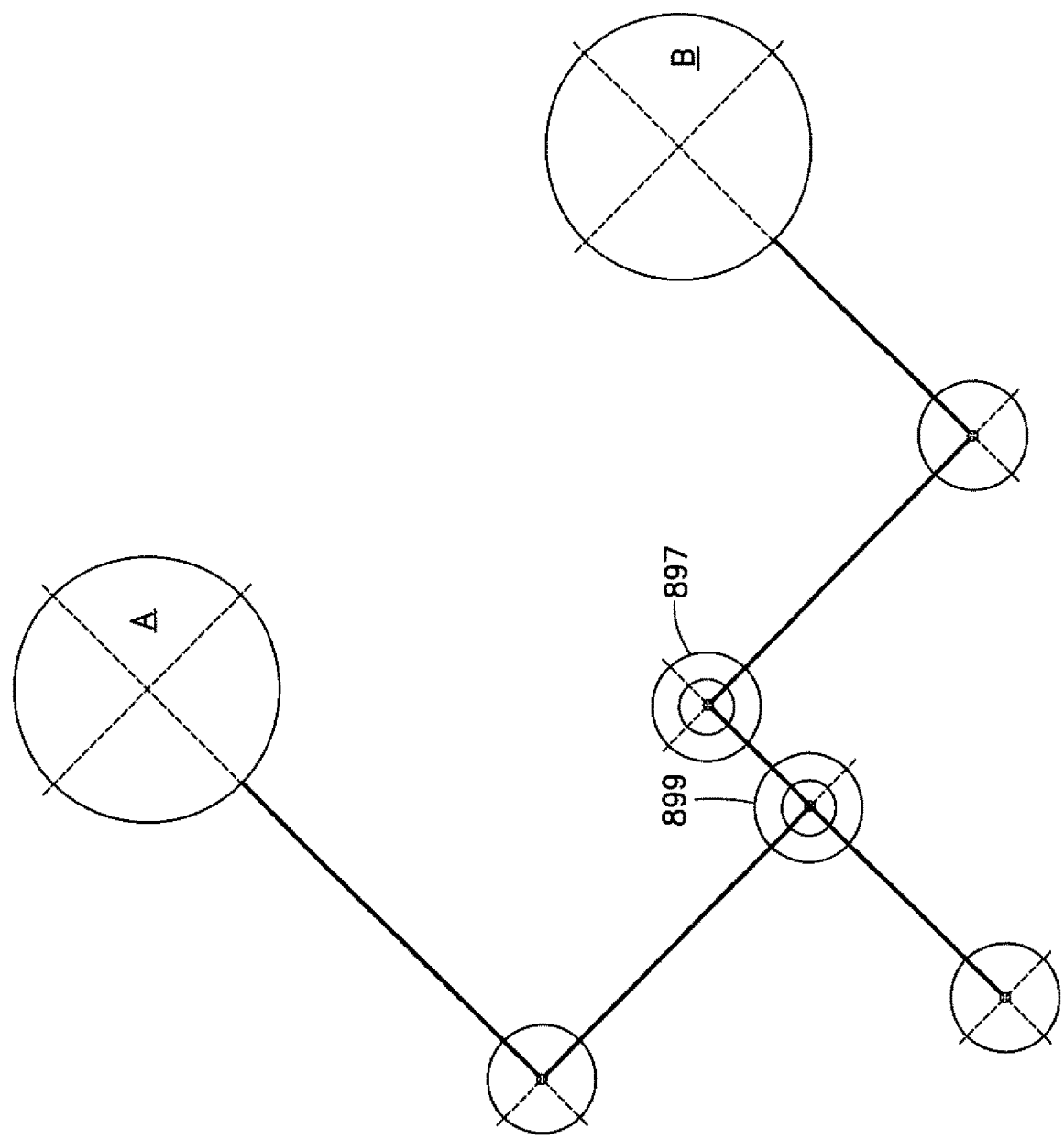

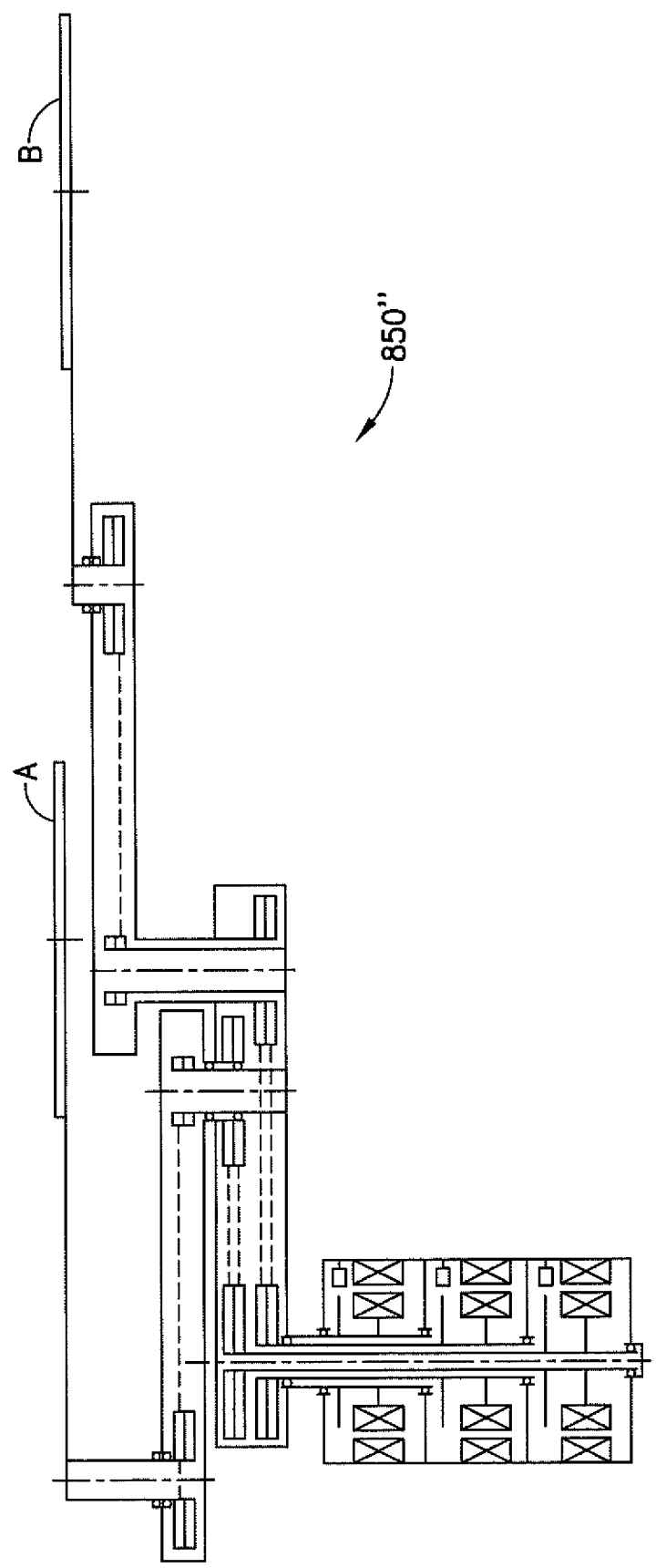

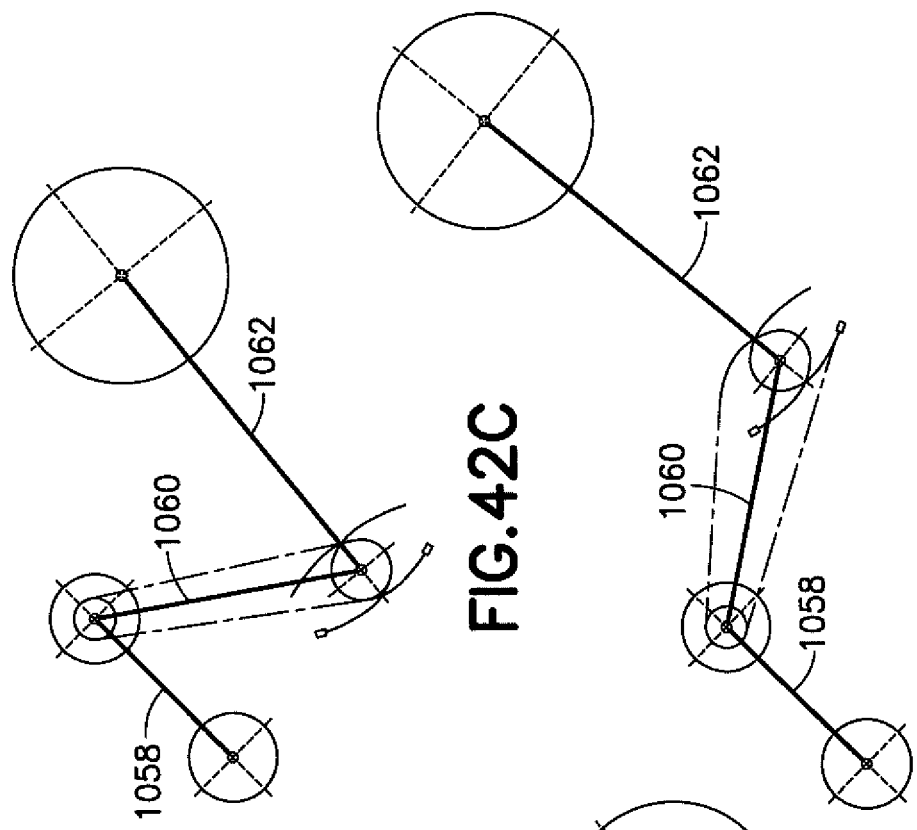
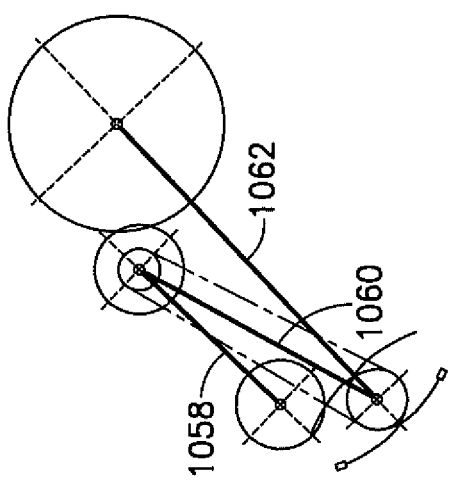
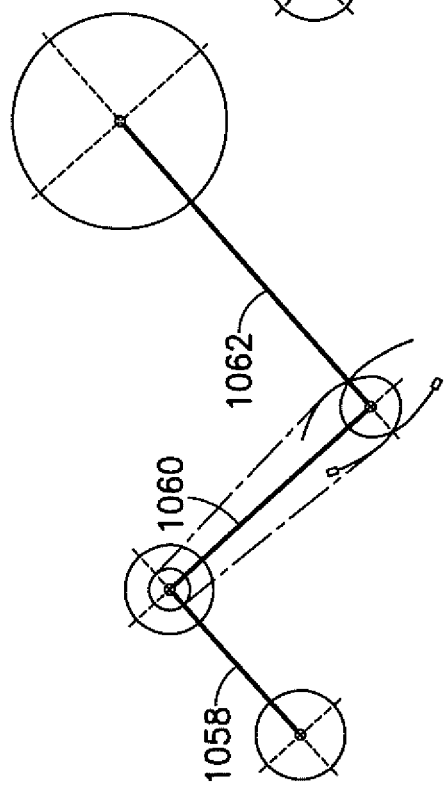
FIG. 42B  FIG. 42C  FIG. 42D  FIG. 42E

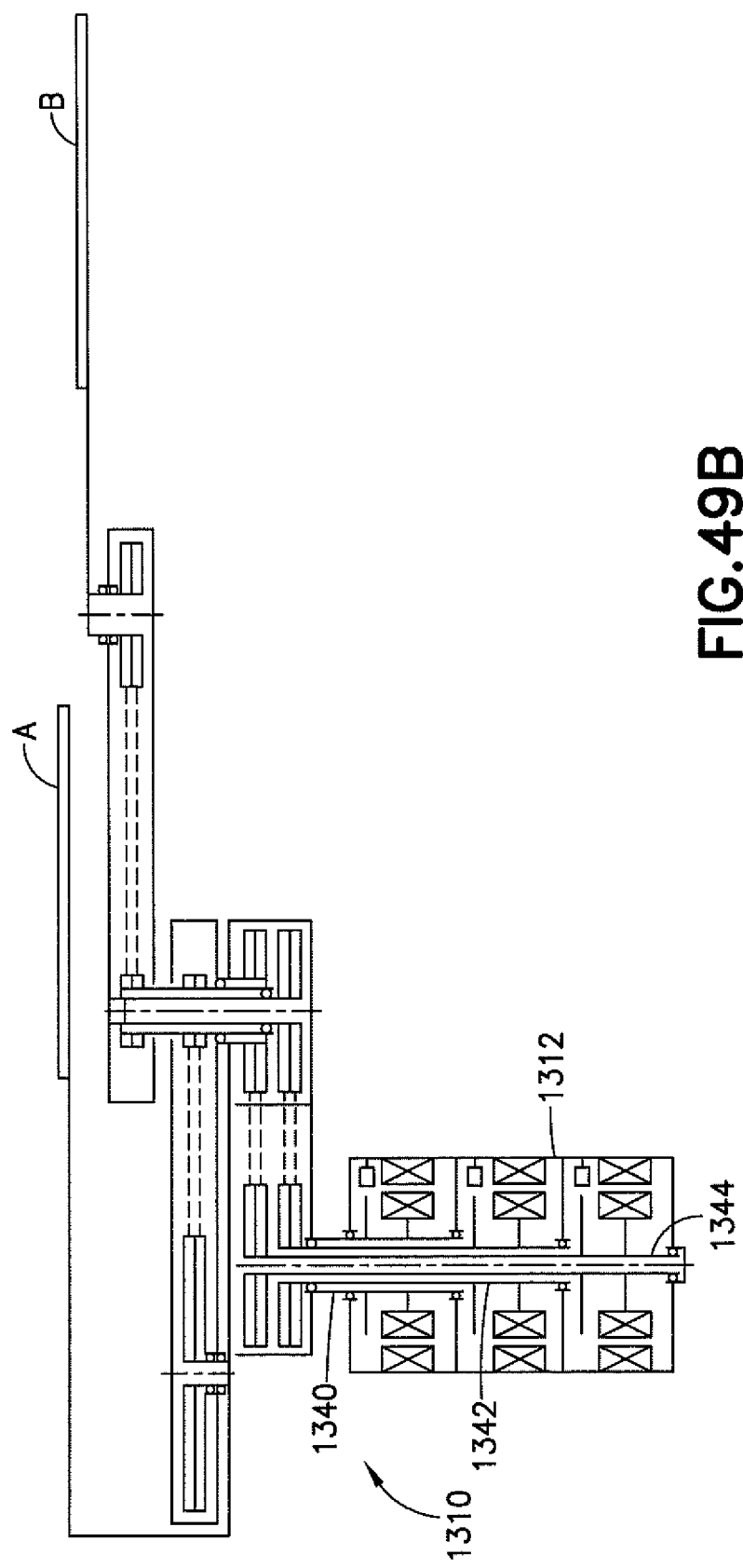

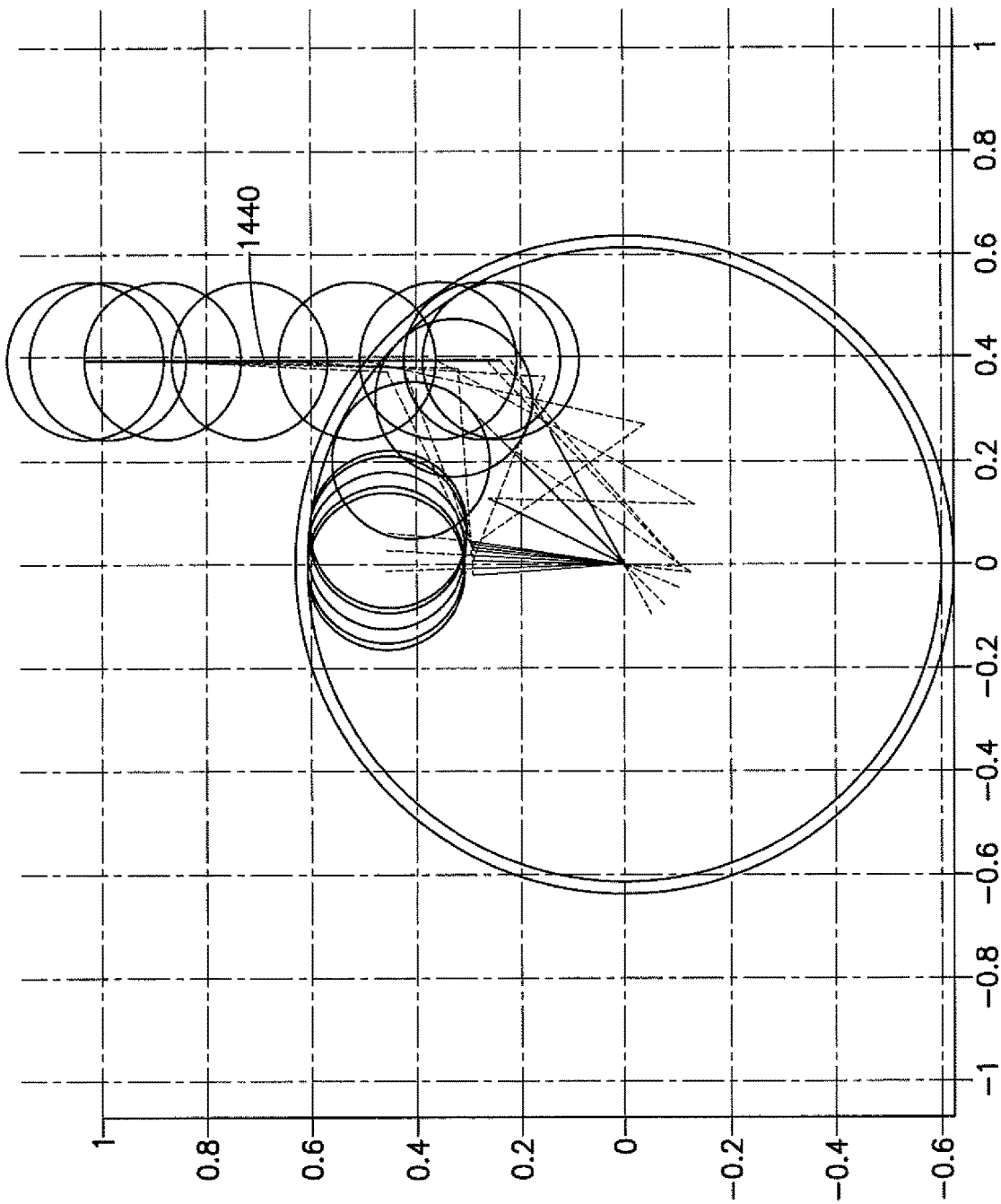

TRANSPORT APPARATUS WITH PULLEY WITH A NON-CIRCULAR PROFILE

CROSS REFERENCE TO RELATED APPLICATION

This application is a continuation of copending U.S. patent application Ser. No. 15/067,684 filed Mar. 11, 2016, which claims priority under 35 USC 119(e) to U.S. Provisional Patent Application No. 62/132,066 filed Mar. 12, 2015, U.S. Provisional Patent Application No. 62/135,490 filed Mar. 19, 2015, U.S. Provisional Patent Application No. 62/137,458 filed Mar. 24, 2015, U.S. Provisional Patent Application No. 62/264,436 filed Dec. 8, 2015, U.S. Provisional Patent Application No. 62/275,884 filed Jan. 7, 2016, which are hereby incorporated by reference in their entireties.

BACKGROUND

Technical Field

The exemplary and non-limiting embodiments relate generally to a robot having an end effector and, more particularly, to a robot having slaved end effector motion.

Brief Description of Prior Developments

Vacuum, atmospheric and controlled environment processing for applications such as associated with manufacturing of semiconductor, LED, Solar, MEMS or other devices utilize robotics and other forms of automation to transport substrates and carriers associated with substrates to and from storage locations, processing locations or other locations. Such transport of substrates may be moving individual substrates, groups of substrates with single arms transporting one or more substrates or with multiple arms, each transporting one or more substrate. Much of the manufacturing, for example, as associated with semiconductor manufacturing is done in a clean or vacuum environment where footprint and volume are at a premium. Further, much of the automated transport is conducted where minimization of transport times results in reduction of cycle time and increased throughput and utilization of the associated equipment.

SUMMARY

The following summary is merely intended to be exemplary. The summary is not intended to limit the scope of the claims.

In accordance with one aspect, an apparatus has a drive unit having a first drive axis rotatable about a first axis of rotation and a second drive axis rotatable about a second axis of rotation, the second drive axis being coaxial with and partially within the first drive axis and axially rotatable within the first drive axis. A robot arm has an upper arm connected to the drive unit at the first drive axis, a forearm coupled to the upper arm, the forearm being coupled to the upper arm at a first rotary joint and rotatable about the first rotary joint, the first rotary joint being actuatable by a first band arrangement coupled to the second drive axis, and an end effector coupled to the forearm, the end effector being coupled to the forearm at a second rotary joint and rotatable about the second rotary joint, the second rotary joint being actuatable by a second band arrangement coupled to the first rotary joint. The second band arrangement is configured to provide a variable transmission ratio.

In accordance with another aspect, an apparatus has a drive unit having a first drive axis rotatable about a first axis of rotation, a second drive axis rotatable about a second axis of rotation, and a third drive axis rotatable about a third axis of rotation, the second drive axis being coaxial with and partially within the first drive axis and axially rotatable within the first drive axis, and the third drive axis being coaxial with and partially within the second drive axis and axially rotatable within the second drive axis. A robot arm has an upper arm connected to the drive unit at the first drive axis, a forearm coupled to the upper arm, the forearm being coupled to the upper arm at a first rotary joint and rotatable about the first rotary joint, the first rotary joint being actuatable by a single-stage band arrangement comprising a first shoulder pulley actuatable by the third drive axis, a first elbow pulley partially forming the first rotary joint, and a belt, band or cable configured to transmit motion between the first shoulder pulley and the first elbow pulley, a first end effector and a second end effector coupled to the forearm, the first end effector and the second end effector being coupled to the forearm at a second rotary joint, orientation of the first end effector and the second end effector being controlled via a two-stage band arrangement. A first stage of the two-stage band arrangement comprises a second shoulder pulley actuatable by the second drive axis, a second elbow pulley partially forming the first rotary joint, and an upper band, belt, or cable configured to transmit motion between the second shoulder pulley and the second elbow pulley. A second stage of the two-stage band arrangement comprises a third elbow pulley coupled to the second elbow pulley, a first wrist pulley coupled to the first end effector, and a first lower belt, band, or cable configured to transmit motion between the third elbow pulley and the first wrist pulley, and wherein the second stage of the two-stage band arrangement further comprises a fourth elbow pulley coupled to the second elbow pulley, a second wrist pulley coupled to the second effector, and a second lower belt, band, or cable configured to transmit motion between the fourth elbow pulley and the second wrist pulley. At least one of the motion between the first shoulder pulley and the first elbow pulley, the motion between the second shoulder pulley and the second elbow pulley, the motion between the third elbow pulley and the first wrist pulley, and the motion between the fourth elbow pulley and the second wrist pulley are at a variable transmission ratio.

In accordance with another aspect, an apparatus has a drive unit having a first drive axis rotatable about a first axis of rotation, a second drive axis rotatable about a second axis of rotation, and a third drive axis rotatable about a third axis of rotation, the second drive axis being coaxial with and partially within the first drive axis and axially rotatable within the first drive axis, and the third drive axis being coaxial with and partially within the second drive axis and axially rotatable within the second drive axis. A first robot arm has a first upper arm connected to the drive unit at the first drive axis, a first forearm coupled to the first upper arm, the first forearm being coupled to the first upper arm at a first rotary joint, the first rotary joint being actuatable by the second drive axis using a first band arrangement, and a first end effector coupled to the first forearm, the first end effector being coupled to the first forearm at a third rotary joint, the third rotary joint being actuatable by the first rotary joint using a third band arrangement. A second robot arm has a second upper arm connected to the drive unit at the third drive axis, a second forearm coupled to the second upper arm, the second forearm being coupled to the second upper arm at a second rotary joint, the second rotary joint being actuatable by the second drive axis using a second band arrangement, and a second end effector coupled to the second forearm, the second end effector being coupled to the second forearm at a fourth rotary joint, the fourth rotary joint being actuatable by the second rotary joint using a fourth band arrangement. At least one of the first band arrangement, the second band arrangement, the third band arrangement, and the fourth band arrangement has a variable transmission ratio.

BRIEF DESCRIPTION OF THE DRAWINGS

The foregoing aspects and other features are explained in the following description, taken in connection with the accompanying drawings, wherein:

FIG. 8 is a top view of a transport apparatus;
FIG. 9 is a side view of a transport apparatus;
FIGS. 15A-15C are top views of a transport apparatus;
FIG. 18A is a top view of a transport apparatus;
FIG. 25A is a top view of a transport apparatus;
FIG. 25B is a side view of a transport apparatus;
FIGS. 27A-27C are top views of a transport apparatus;
FIG. 29A is a top view of a transport apparatus;
FIG. 29B is a side view of a transport apparatus;
FIG. 30A is a side view of a transport apparatus;
FIG. 30B is a side view of a transport apparatus;
FIGS. 35A-35C are top views of a transport apparatus;
FIG. 37B is a side view of a transport apparatus;
FIG. 38A is a top view of a transport apparatus;
FIG. 38B is a side view of a transport apparatus;
FIGS. 42B-42E are top views of a transport apparatus;
FIG. 49B is a side view of a transport apparatus;
FIG. 50 is a top view of a transport apparatus.

DETAILED DESCRIPTION OF EMBODIMENTS

Figure 1:
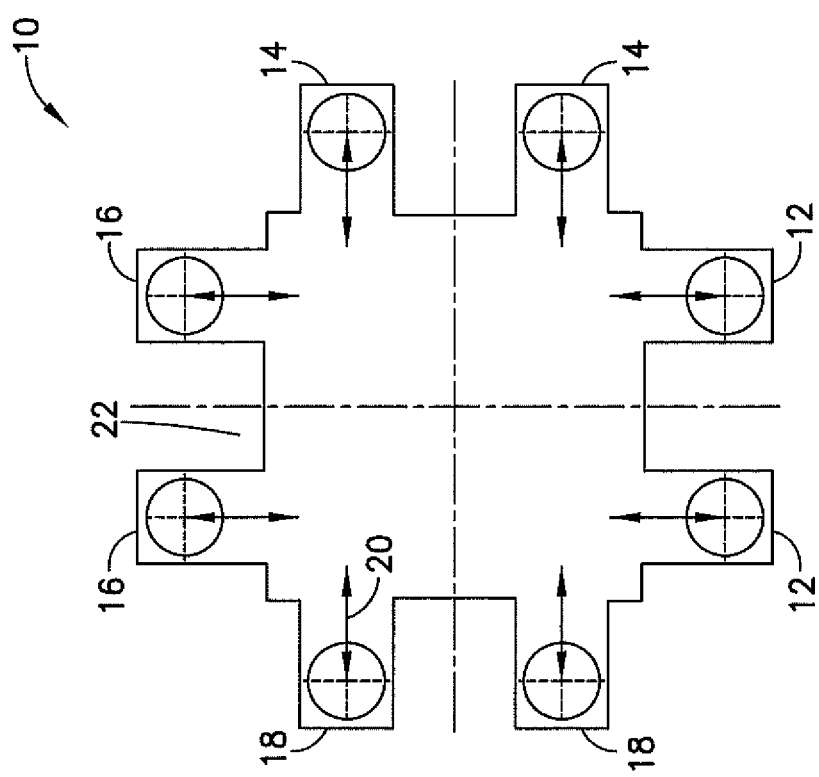
FIG. 1 is a top view of a transport apparatus.

Referring to FIG. 1, there is shown a top view of a transport apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used. Disclosed here in are multi-link, for example, three-link robot arm mechanisms which may be used to transfer material to and/or from side-by-side, for example, laterally offset stations in a semiconductor wafer processing tool.

An example layout of a semiconductor wafer processing tool 10 is diagrammatically depicted in the top view of FIG. 1. In this particular example, the tool features 4 pairs of side-by-side stations, e.g., one pair of load locks 12 and 3 pairs of process module stations 14, 16, 18. The present three-link arm mechanisms are designed to provide access to each of the stations in the tool along a predefined path, e.g., substantially straight-line path, with predefined orientation of the end-effector, e.g., along the straight-line path 20, as illustrated in the example of FIG. 1. The straight line paths may be parallel to each other on a given facet 22 or alternately angled relative to each other. In alternate aspects, any suitable path or combination of paths may be defined, linear, circular or any suitable shape or combination of shapes.

Figure 2:
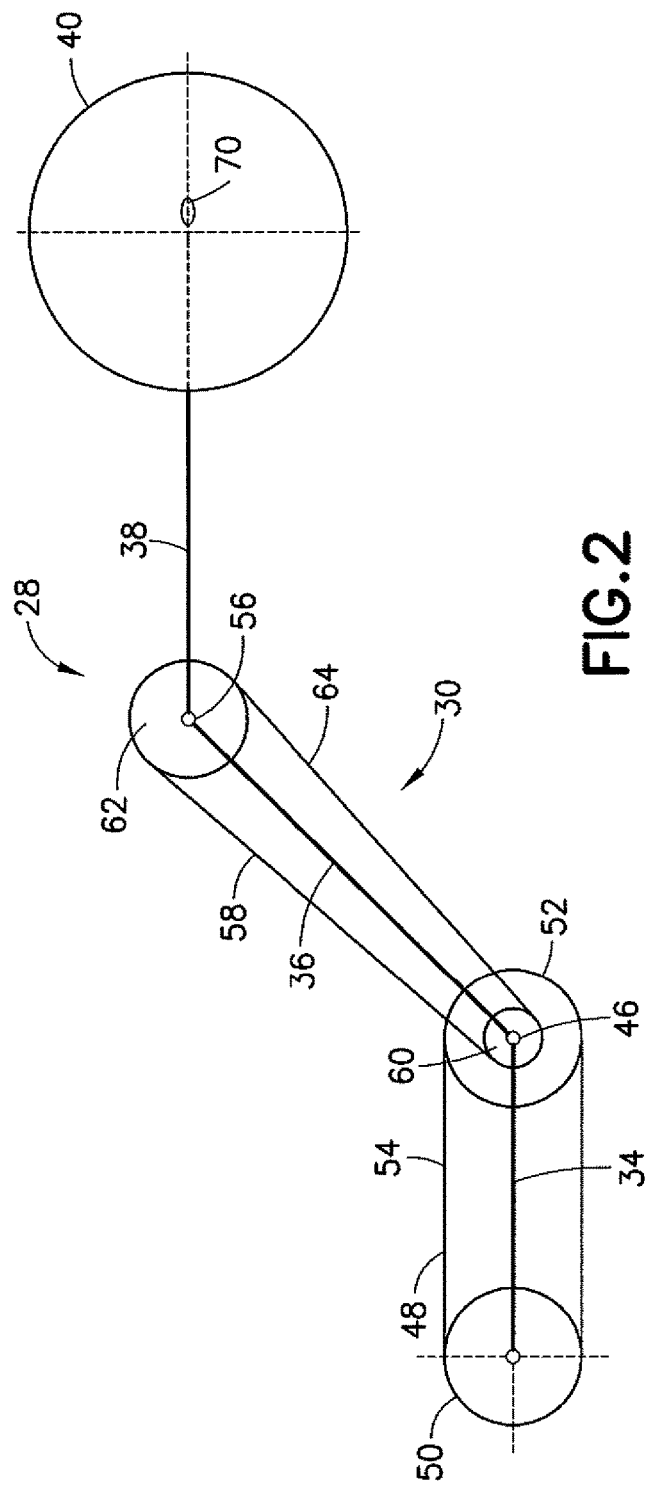
FIG. 2 is a top view of a transport apparatus.
Figure 3A:
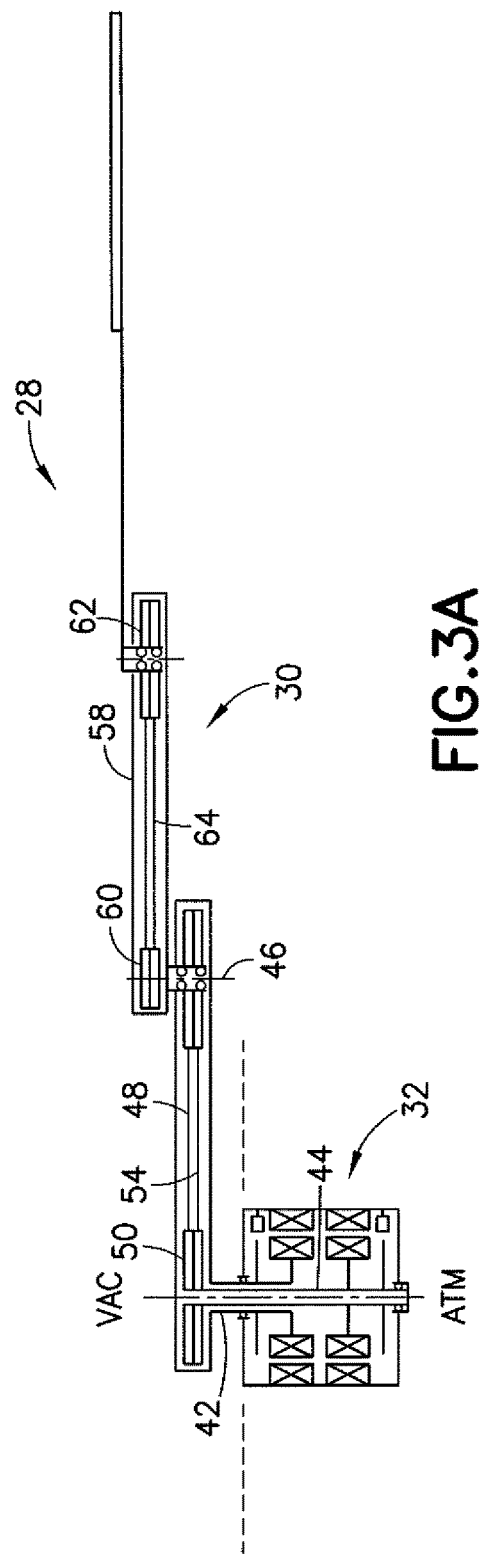
FIG. 3A is a side view of a transport apparatus.
Figure 3B:
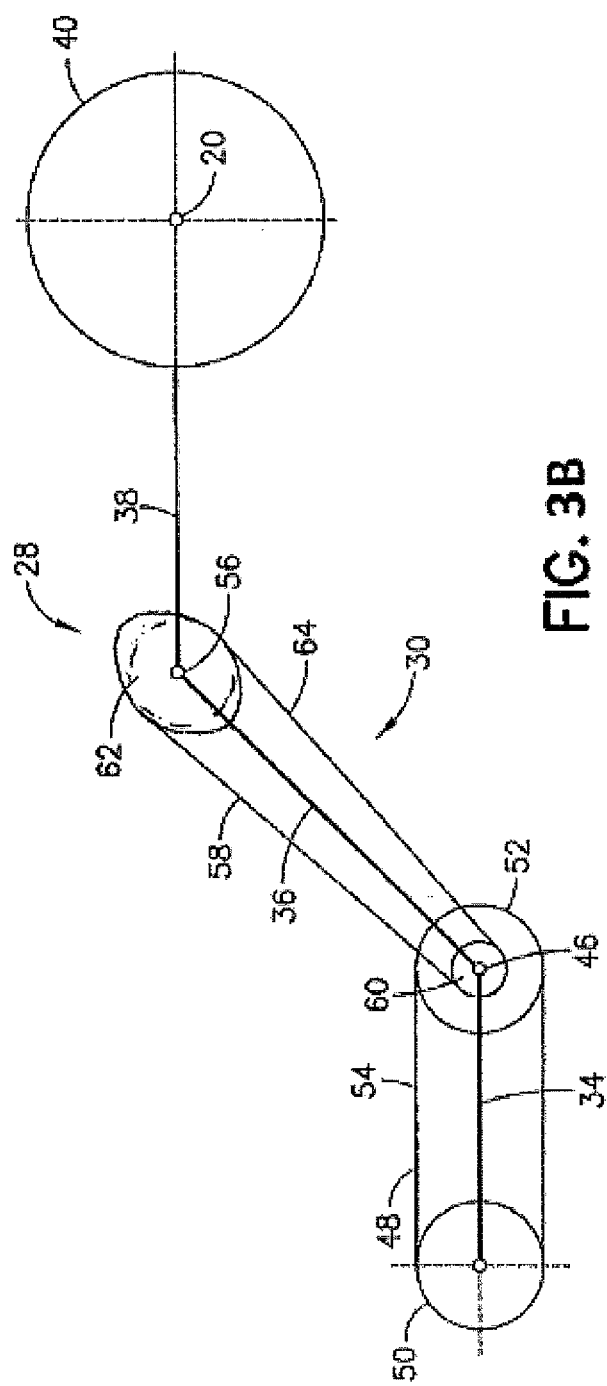
FIG. 3B is a top view of the transport apparatus of FIG. 3A.

FIGS. 2, 3A and 3B show diagrams of the top and side views of a robot arm mechanism 30 according to the disclosed embodiment installed on a robot drive unit 32. The arm mechanism may consist of a first link (upper arm) 34 a second link (forearm) 36 and a third link (end-effector) 38 supporting substrate 40. An example internal arrangement of the robot 28 is depicted diagrammatically in FIG. 3A. The arm mechanism may be driven by a two-axis spindle with two coaxial shafts, e.g., an outer T1 shaft 42 and an inner T2 shaft 44. The inner T2 shaft 44 may be partially within the outer T1 shaft 42 such that the inner T2 shaft 44 is rotatable within the outer T1 shaft 42. The first link 34 of the robot arm mechanism may be attached directly to the T1 shaft 42. The second link 36 may be coupled to the first link 34 via a rotary joint 46, and actuated by the T2 shaft 44 using a band arrangement 48. The band arrangement 48 may comprise a shoulder pulley 50, which may be attached to the T2 shaft 44, an elbow pulley 52, which may be attached to the second link 36, and a band, belt or cable 54, which may transmit motion between the two pulleys 50, 52. The belt arrangement may feature a constant transmission ratio, for instance, 1:1 ratio may be conveniently used. However, any other suitable arrangement may be used. The third link 38 may be coupled to the second link 36 via a rotary joint 56, and its orientation may be constrained by another band arrangement 58. The band arrangement 58 may comprise an elbow pulley 60, which may be connected to the first link 34, a wrist pulley 62, which may be connected to the third link 38, and a band, belt or cable 64, which may transmit motion between the two pulleys. The band arrangement may feature a variable transmission ratio. The variable transmission ratio may be implemented, for instance, using at least one pulley with a non-circular profile. As an example, referring to FIG. 3B, the wrist pulley may feature a non-circular profile. An example of an arm that utilizes non circular pulleys is disclosed in U.S. patent application Ser. No. 13/833,732 filed Mar. 15, 2013 and entitled "Robot Having Arm With Unequal Link Lengths" which is hereby incorporated by reference herein in its entirety.

Figure 4:
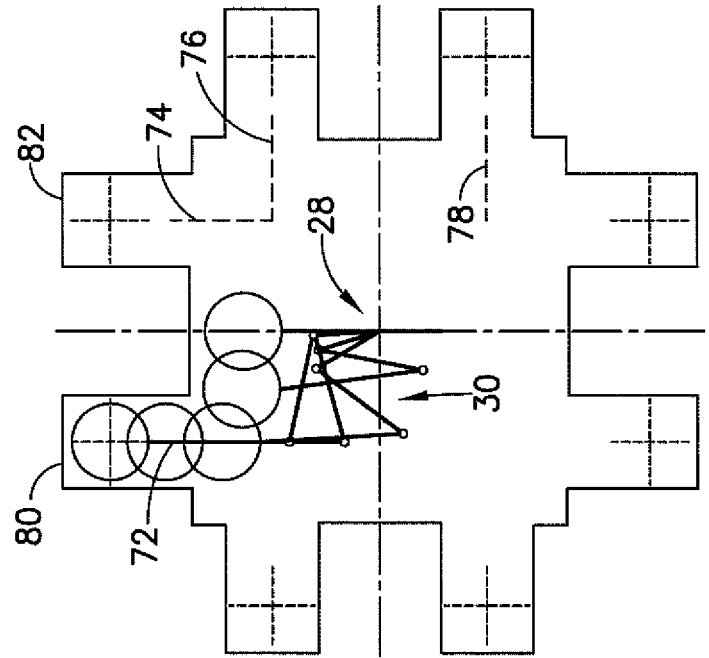
FIG. 4 is a top view of a transport apparatus.
Figure 6:
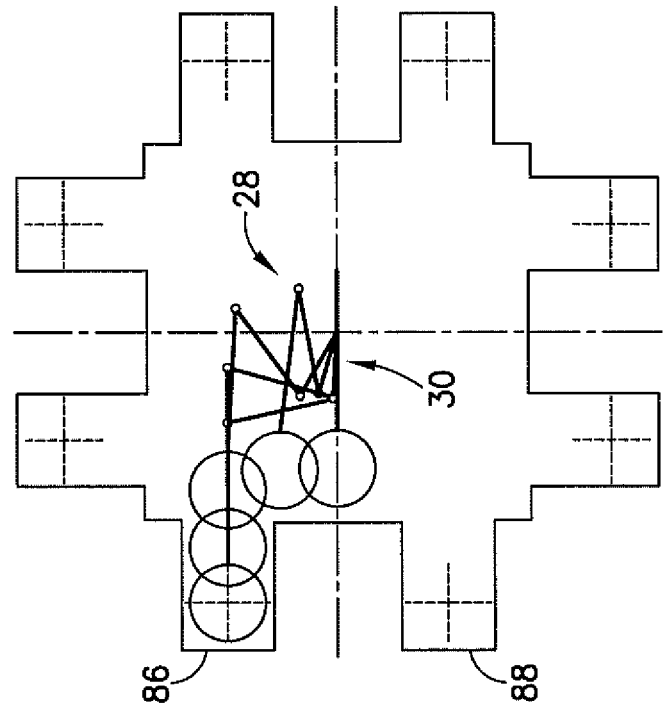
FIG. 6 is a top view of a transport apparatus.
Figure 5:
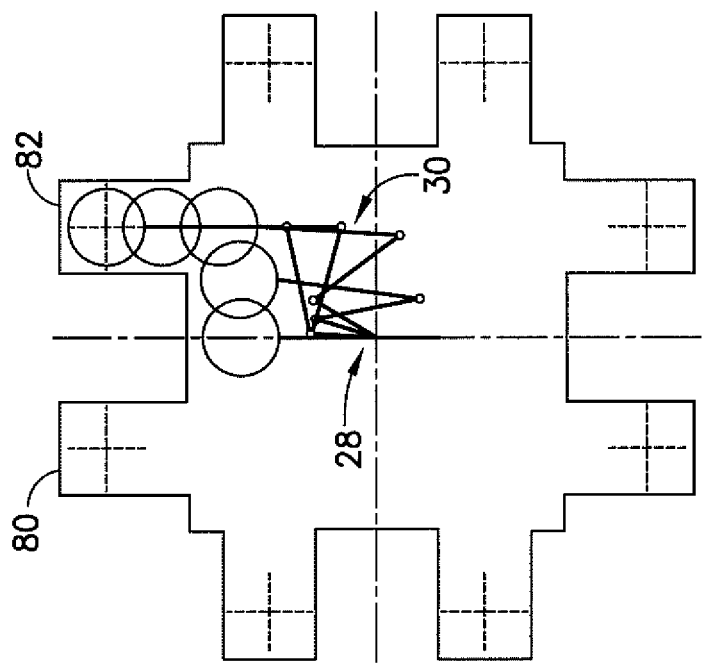
FIG. 5 is a top view of a transport apparatus.
Figure 7:
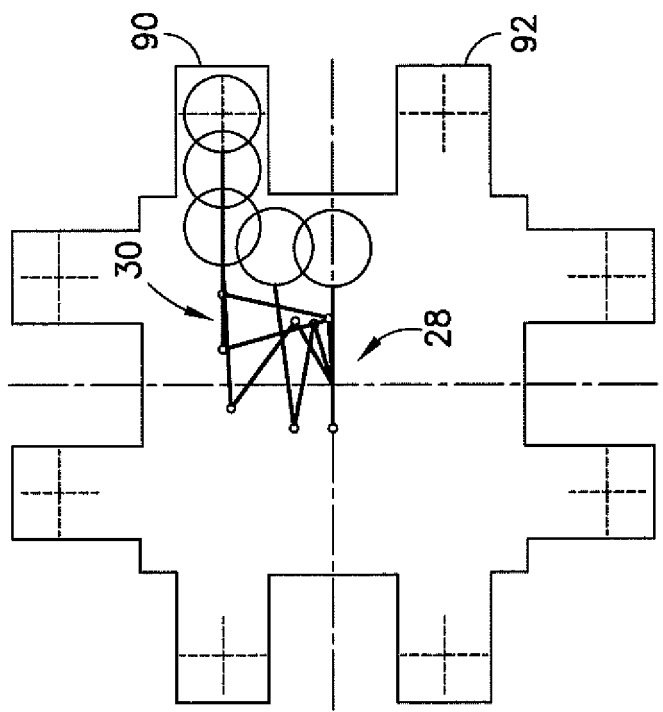
FIG. 7 is a top view of a transport apparatus.

The variable transmission ratio may be selected so that the orientation of the third link (end-effector) 38 changes in a predefined manner as a function of the relative position of the first and the second links 34, 36. The relative position of the first and second links 34, 36 may be conveniently expressed in terms of the included angle between the two links. Alternately, the orientation of the third link (end-effector) 38 may change in a predefined manner as a function of the relative position of links, shafts or otherwise. By way of example, the transmission ratio may be selected in a manner that may allow a reference point on the third link (typically the nominal center 70 of the end-effector) to follow a predetermined path with a predetermined (but not necessarily constant) orientation of the third link (end-effector) when the first and second links are actuated accordingly. As an example, the path 72, 74, 76, 78 may be selected as an access path to one of the stations 82 of FIG. 1, as illustrated in FIG. 4. Furthermore, the transmission ratio may be selected so that the arm can access the neighboring station 82, as shown in FIG. 5. The T1 and T2 shafts 42, 44 may also rotate to reorient the arm mechanism to access another pair of stations 86, 88 or 90, 92, as illustrated in FIGS. 6 and 7.

Although the initial position of the robot arm mechanism is shown on the axis of symmetry between the neighboring side-by-side stations, it is noted that any other initial position may be used. It also is noted that the drive unit of the robot may feature an additional axis to facilitate vertical lift of the arm mechanism, e.g., to pick and place wafers carried by the end-effector. In alternate aspects, other additional rotary axis and/or arms may be provided. In alternate aspects, a band arrangement between the shoulder pulley attached to the T2 shaft and the elbow pulley attached to the second link features a variable transmission ratio, e.g., using at least one non-circular pulley. The variable transmission ratio is selected so that extension of the arm is driven by the T1 shaft while the T2 shaft remains stationary. In alternate aspects, the variable transmission ratio may be selected so that the T2 shaft follows a predetermined motion profile as the robot arm extends along the predefined path. In alternate aspects, the mechanism that constrains the orientation of the third link includes an additional band arrangement.

For example, as depicted diagrammatically in FIG. 8, the orientation of the third link 102 may be constrained by a band arrangement 104 that may comprise an elbow pulley 106, which may be coaxial with the elbow joint 108 (the rotary joint between the first link and the second link) and free to rotate with respect to the two first 110 and second 112 links, a wrist pulley 114, which may be connected to the third link 102, and a band, belt or cable 116, which may transmit motion between the two pulleys. The motion of the elbow pulley is constrained by another band arrangement 118 that may comprise a pulley 120 attached to the T2 shaft 122, a pulley 124 attached to the elbow pulley 106, and a band, belt or cable 126, which may transmit motion between the two pulleys. The two band arrangements may feature a constant or variable transmission ratio. As an example, if the two band arrangements feature a constant 1:1 ratio, and if the second link is coupled to the T2 shaft, the end-effector keeps a constant orientation as the arm extends and retracts by actuating the T1 shaft.

The disclosed aspects may similarly be applied to dual-end-effector arm mechanisms which may be used to transfer material to/from side-by-side (laterally offset) stations in a semiconductor wafer processing tool. Here, an example layout of a semiconductor wafer processing tool 210 is diagrammatically depicted in the top view of FIG. 10. In this particular example, the tool features 4 pairs of side-by-side stations, e.g., one pair of load locks 220 and 3 pairs of process module stations 230 and a transport chamber or module 232.

Figure 10:
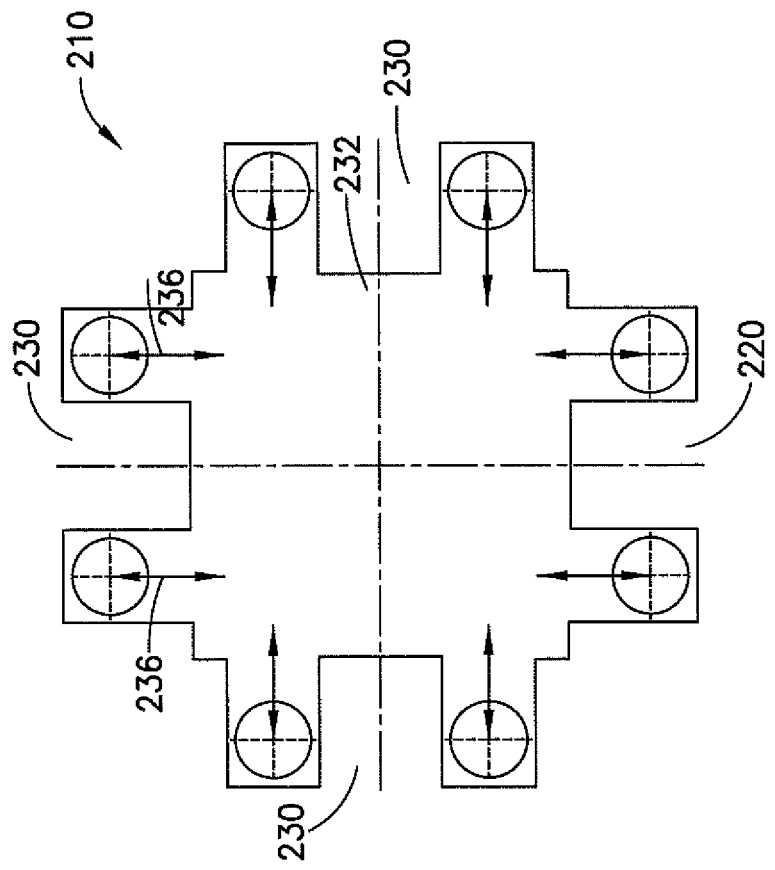
FIG. 10 is a top view of a transport apparatus.

The present embodiment arm mechanisms may be designed to provide access to each of the stations in the tool along a predefined path 236, e.g., substantially straight-line path, with predefined orientation of the end-effector, e.g., along the straight-line path, as illustrated in the example of FIG. 10.

Figure 11:
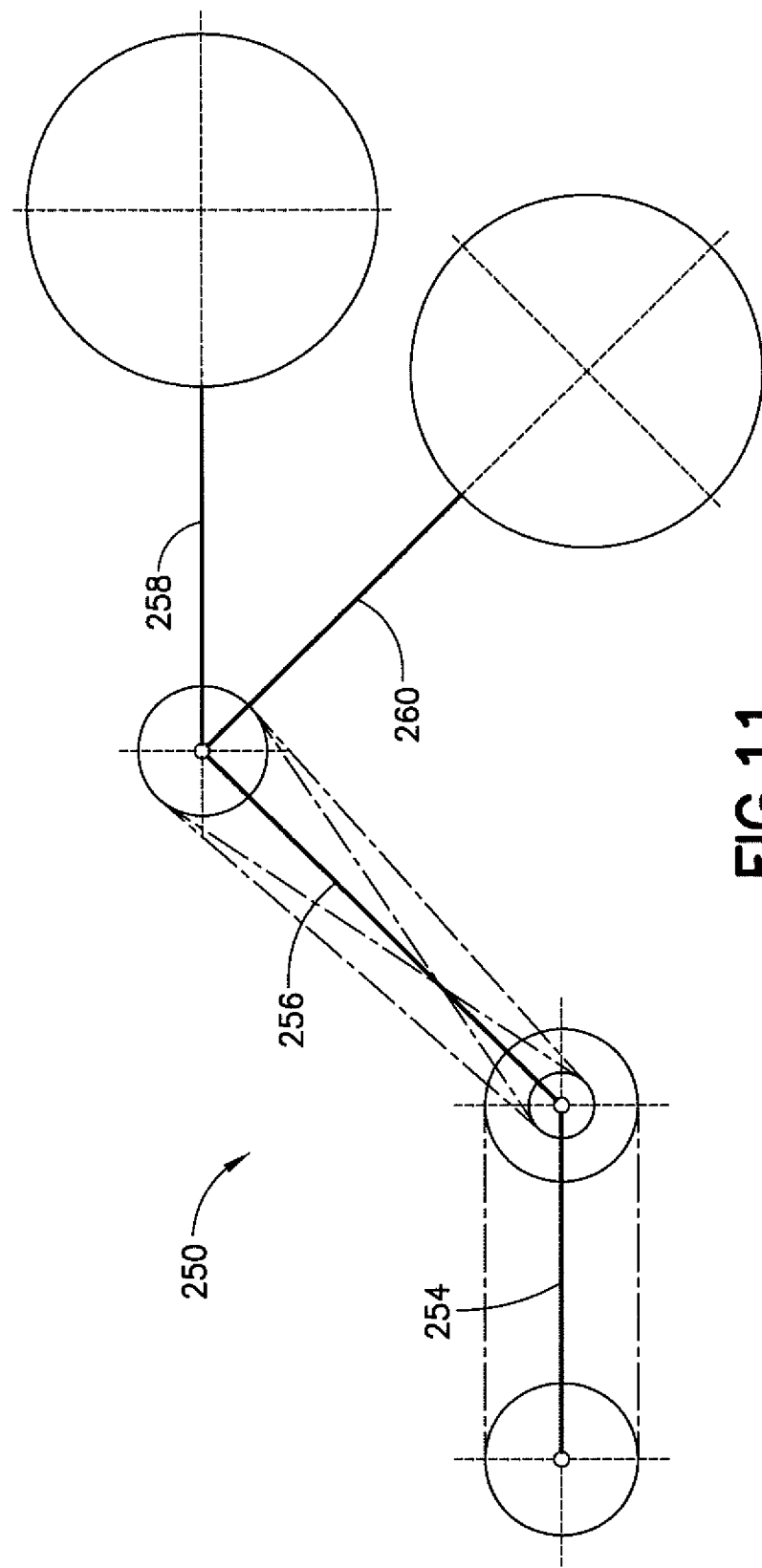
FIG. 11 is a top view of a transport apparatus.
Figure 12:
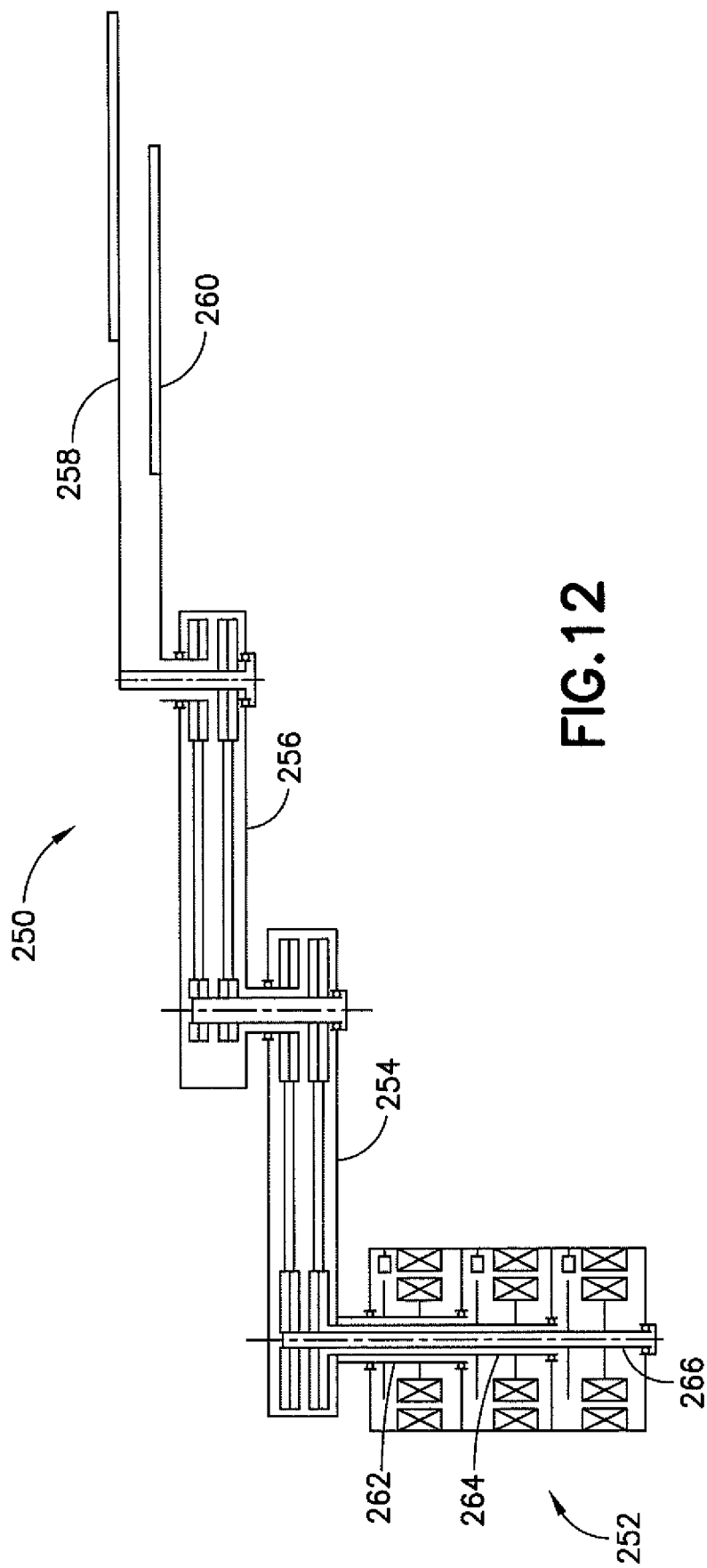
FIG. 12 is a side view of a transport apparatus.

FIGS. 11 and 12 show diagrams of the top and side views of the robot arm mechanism 250 installed on a robot drive unit 252. The arm mechanism may consist of a first link (upper arm) 254 a second link (forearm) 256, pivoting end-effector A and pivoting end-effector B 258, 260. An example internal arrangement of the robot is depicted diagrammatically in FIGS. 11 and 12. The arm mechanism may be driven by a three-axis spindle with three coaxial shafts, e.g., an outer T1 shaft 262, a T2 shaft 264 and an inner T3 shaft 266. The T2 shaft 264 may be partially within the outer T1 shaft 262, and the inner T3 shaft 266 may be partially within the T2 shaft 264. The first link of the robot arm mechanism may be attached directly to the T1 shaft. The second link may be coupled to the first ring via a rotary joint (elbow joint), and actuated by the T3 shaft using a band arrangement. The band arrangement may comprise a first shoulder pulley, which may be attached to the T3 shaft, a first elbow pulley, which may be attached to the second link, and a band, belt or cable, which may transmit motion between the two pulleys. The belt arrangement may feature a constant or variable transmission ratio, for instance, 1:1 ratio may be conveniently used. However, any other suitable arrangement may be used. End-effector A may be coupled to the second link via a rotary joint (wrist joint), and its orientation may be controlled by a two stage band arrangement. The first stage of the band arrangement may include a second shoulder pulley, which may be connected to the T2 shaft, a second elbow pulley and a band, belt or cable, which may transmit motion between the two pulleys. The first stage of the belt arrangement may feature a constant or variable transmission ratio, for instance, 1:1 ratio may be conveniently used. The second stage of the band arrangement may comprise a third elbow pulley, which may be connected to the second elbow pulley, a first wrist pulley, which may be connected to end-effector A, and a band, belt or cable, which may transmit motion between the two pulleys. The second stage of the band arrangement may feature a variable transmission ratio. The variable transmission ratio may be implemented, for instance, using at least one pulley with a non-circular profile. As an example, referring to FIGS. 11 and 12, the wrist pulley may feature a non-circular profile. An example of an arm that utilizes non circular pulleys is disclosed in U.S. patent application Ser. No. 13/833,732 filed Mar. 15, 2013 and entitled "Robot Having Arm With Unequal Link Lengths" which is hereby incorporated by reference herein in its entirety. Another example of an arm that utilizes non circular pulleys is disclosed in U.S. Provisional Patent Application No. 62/132,066 filed Mar. 12, 2015 and entitled "2-Degree-of-Freedom 3-Link Robot Arm Mechanisms" which is hereby incorporated by reference herein in its entirety.

Figure 13C:
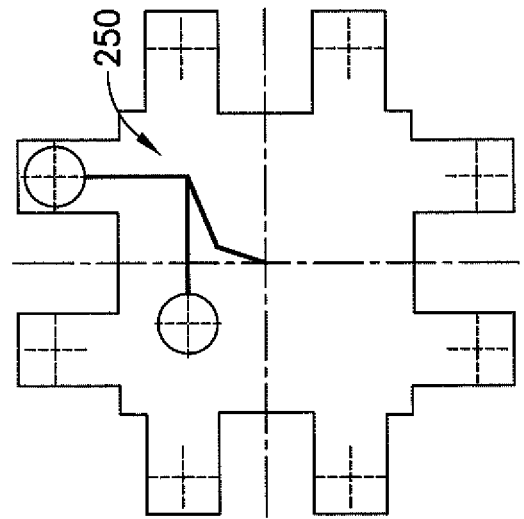
FIGS. 13A-13C are top views of a transport apparatus.
Figure 13B:
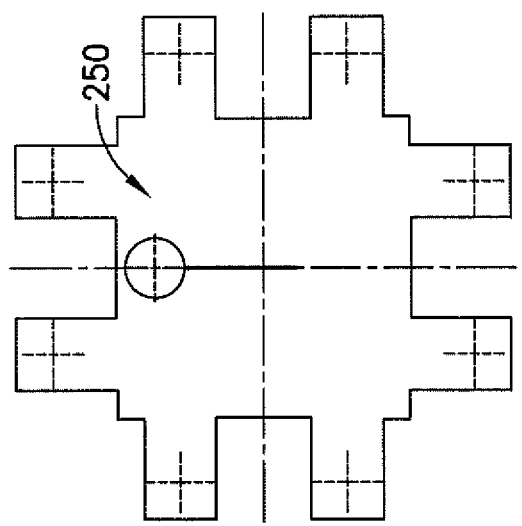
Figure 13A:
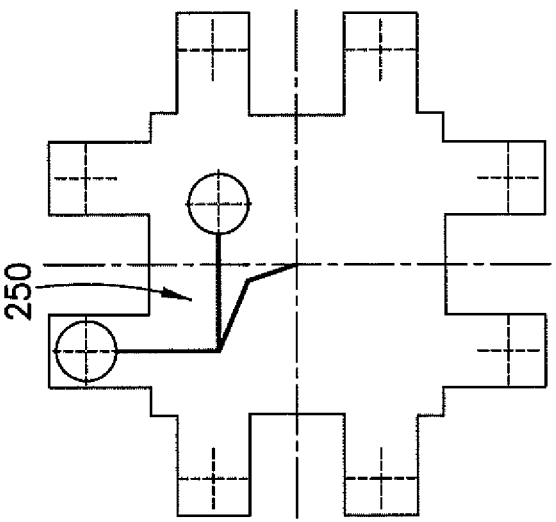

The variable transmission ratio may be selected so that the orientation of end-effector A changes in a predefined manner as a function of the relative position of the first and second links and the T2 shaft. For instance, it may be selected so that end-effector A may follow a path to a station, as illustrated in FIGS. 13A-13C, or, depending on the motion of the T2 shaft, fold to the side, as also shown in FIGS. 13A-13C. Similarly, end-effector B may be coupled to the second link via a rotary joint (wrist joint), and its orientation may be controlled by a two stage band arrangement. The first stage of the band arrangement is shared with end-effector A. The second stage of the band arrangement may comprise a fourth elbow pulley, which may be connected to the second elbow pulley, a second wrist pulley, which may be connected to end-effector B, and a band, belt or cable, which may transmit motion between the two pulleys. The second stage of the band arrangement may be configured in a crossover configuration, as illustrated in FIGS. 11 and 12, and may feature a variable transmission ratio. The variable transmission ratio may be implemented, for instance, using at least one pulley with a non-circular profile. As an example, referring to FIGS. 11 and 12, the wrist pulley may feature a non-circular profile. The variable transmission ratio may be selected so that the orientation of end-effector B changes in a predefined manner as a function of the relative position of the first and second links and the T2 shaft. For instance, it may be selected so that end-effector A may follow a path to a station, as illustrated in FIGS. 13A-13C, or, depending on the motion of the T2 shaft, fold to the side, as also shown in FIGS. 13A-13C.

Although the arm mechanism is shown as right-handed (the elbow joint is on the right-hand side of the line from the shoulder joint to the wrist joint) when it accesses the left station in FIGS. 13A-13C and left-handed when accessing the right station in FIGS. 13A-13C, in an alternative embodiment, the mechanism may be configured so that it is left-handed when accessing the left station and right-handed when accessing the right station.

Figure 14A:
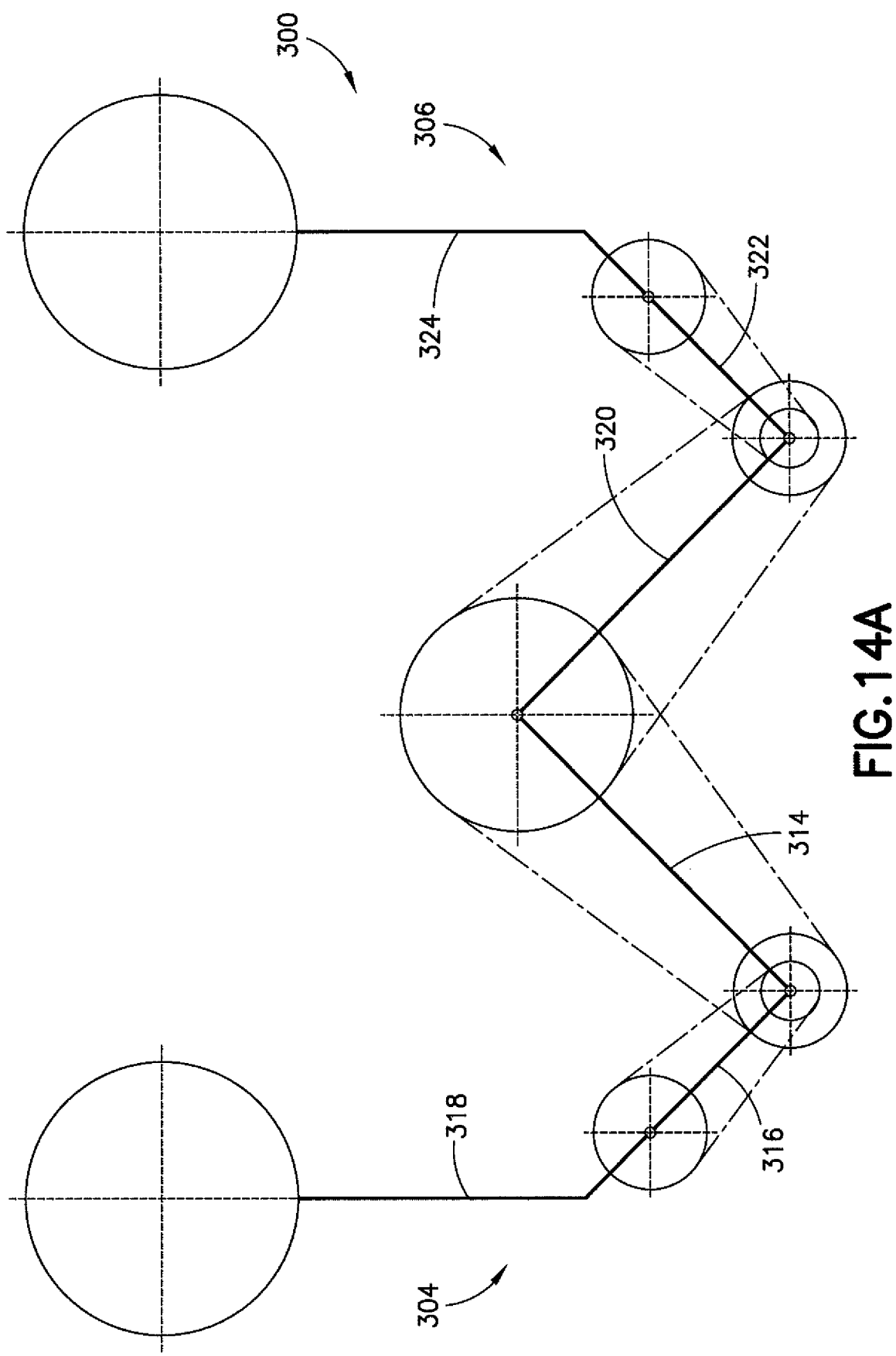
FIG. 14A is a top view of a transport apparatus.
Figure 14B:
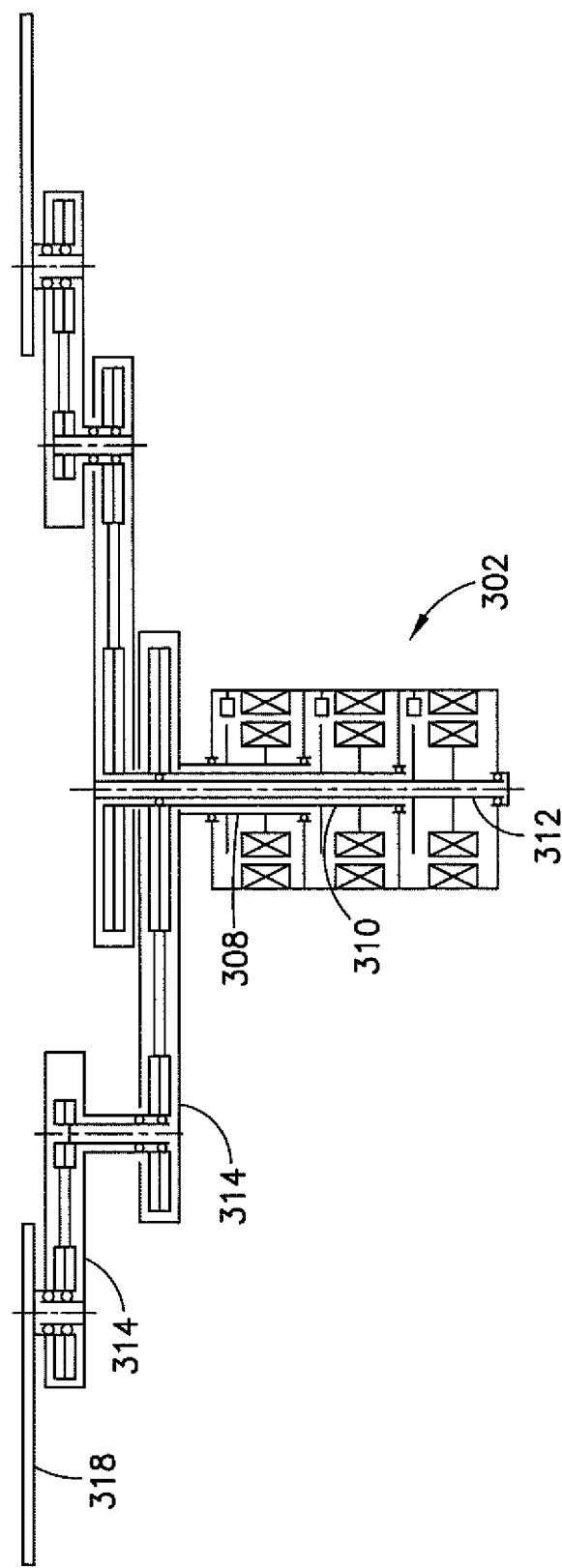
FIG. 14B is a side view of a transport apparatus.

In yet another alternative embodiment, the second link may be actuated by the T2 shaft and the orientation of the end-effectors may be controlled by the T3 shaft. Referring now to FIGS. 14A and 14B, there are shown diagrams of the top and side views of the robot arm mechanism 300 installed on a robot drive unit 302, including an example internal arrangement of the robot. The arm mechanism may consist of a left linkage 304 and a right linkage 306. The arm mechanism may be driven by a three-axis spindle with three coaxial shafts, e.g., an outer T1 shaft 308, a T2 shaft 310 and an inner T3 shaft 312. The T2 shaft 310 may be partially within the outer T1 shaft 308, and the inner T3 shaft 312 may be partially within the T2 shaft 310. The left linkage may consist of a left first link (upper arm) 314 a left second link (forearm) 316 and a left third link (end-effector) 318. The left first link of the may be attached directly to the T1 shaft. The left second link may be coupled to the left first ring via a rotary joint, and constrained by the T2 shaft using a band arrangement. The band arrangement may comprise a first shoulder pulley, which may be attached to the T2 shaft, a left elbow pulley, which may be attached to the second link, and a band, belt or cable, which may transmit motion between the two pulleys. The belt arrangement may feature a variable transmission ratio. However, any other suitable arrangement may be used. The left third link may be coupled to the left second link via a rotary joint, and its orientation may be constrained by another band arrangement. The band arrangement may comprise a left elbow pulley, which may be connected to the left first link, a left wrist pulley, which may be connected to the left third link, and a band, belt or cable, which may transmit motion between the two pulleys. The band arrangement may feature a variable transmission ratio. The variable transmission ratio may be implemented, for instance, using at least one pulley with a non-circular profile. As an example, referring to FIGS. 14A and 14B, the wrist pulley may feature a non-circular profile. The variable transmission ratio may be selected so that the orientation of the left third link (end-effector) changes in a predefined manner as a function of the relative position of the left first and left second links. The relative position of the left first and left second links may be conveniently expressed in terms of the included angle between the two links. For instance, the transmission ratios of the two band arrangements may be selected in a manner that may allow a reference point on the left third link (typically the nominal center of the end-effector) to follow a predetermined path with a predetermined (e.g., constant) orientation of the left third link (end-effector) when the left first link is actuated by the T1 shaft and the T2 shaft is kept stationary.

As an example, the path may be selected as an access path to one of the stations of FIG. 10, as illustrated in FIGS. 15A-15C. Referring to FIGS. 14A and 14B again, the right linkage may be configured substantially as a mirror image of the left linkage. It may consist of a right first link (upper arm) 320 a right second link (forearm) 322 and a right third link (end-effector) 324. The right first link may be attached directly to the T3 shaft. The right second link may be coupled to the right first ring via a rotary joint, and constrained by the T2 shaft using a band arrangement. The band arrangement may comprise a second shoulder pulley, which may be attached to the T2 shaft, a left elbow pulley, which may be attached to the second link, and a band, belt or cable, which may transmit motion between the two pulleys. Similarly to the left linkage, the belt arrangement may feature a variable transmission ratio. However, any other suitable arrangement may be used.

The remaining components of the right linkage may be configured substantially as a mirror image of the right linkage, and the operation of the right linkage is substantially equivalent to the left linkage in a mirrored manner. Further, the T1, T2 and T3 shafts may rotate in sync to reorient the arm mechanism to access another pair of stations.

Although the left linkage is shown as left-handed (the elbow joint is on the left-hand side of the line from the shoulder joint to the wrist joint) in FIGS. 15A-15C and the right linkage is depicted as right-handed in FIGS. 15A-15C, in an alternative embodiment, the mechanism may be configured so that the left linkage is right-handed and the right linkage is left-handed.

In yet another alternative embodiment, the right upper arm may be actuated by the T2 shaft and the orientation of the right and left forearms may be constrained by the T3 shaft.

The disclosed aspects may similarly be applied to dual-end-effector robot arm mechanisms which may be used to transfer material to/from side-by-side (laterally offset) stations in a semiconductor wafer processing tool. An example layout of a semiconductor wafer processing tool 410 is diagrammatically depicted in the top view of FIG. 16. In this particular example, the tool features 4 pairs of side-by-side stations, for example, one pair of load locks 412 and 3 pairs of process module stations 414 coupled to transport chamber 416.

Figure 16:
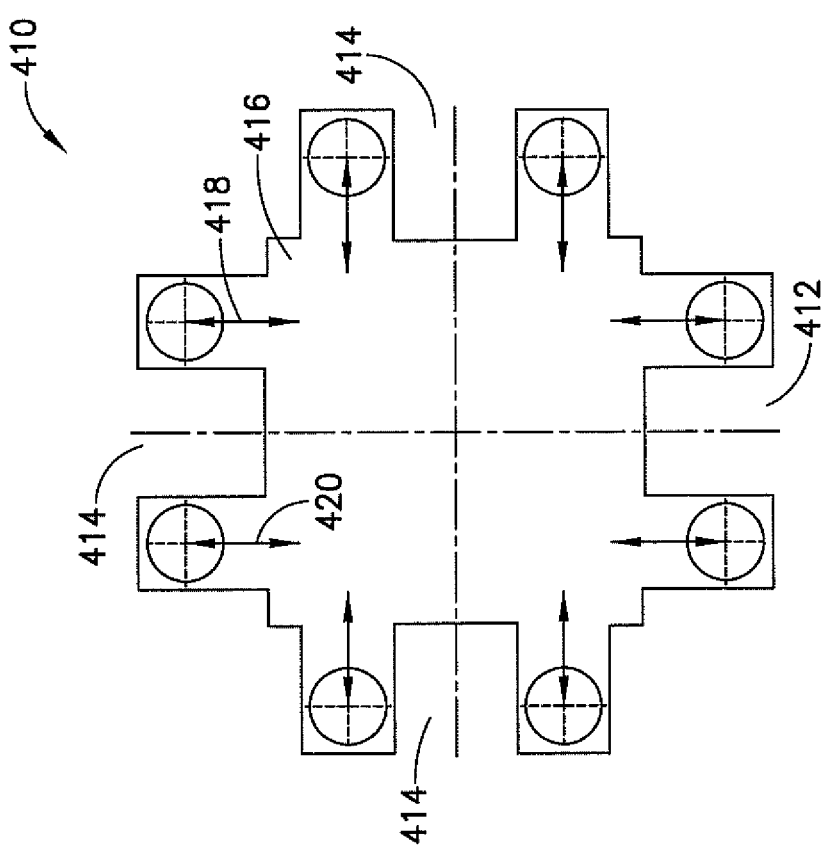
FIG. 16 is a top view of a transport apparatus.

The disclosed arm mechanisms may provide access to each of the stations in the tool along a predefined path, for example, substantially straight-line path 418, 420, with predefined orientation of the end-effector, for example, along the straight-line path 418, 420, as illustrated in the example of FIG. 16.

Figure 17:
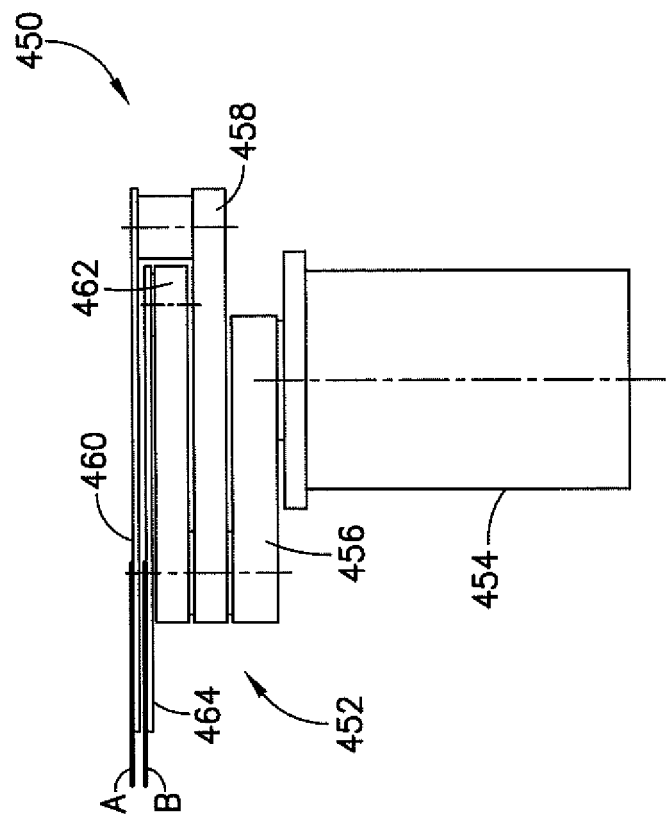
FIG. 17 is a side view of a transport apparatus.
Figure 18B:
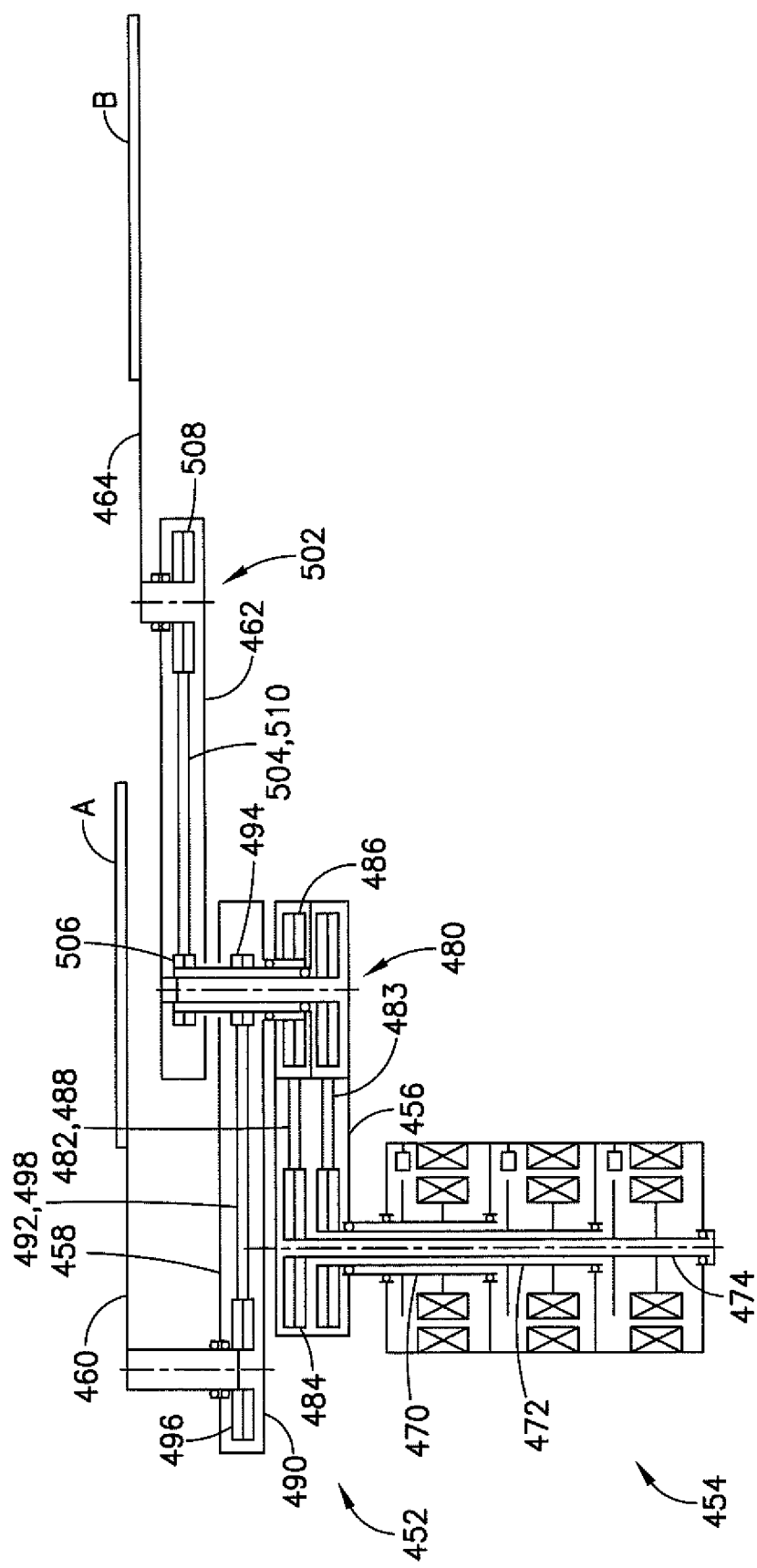
FIG. 18B is a side view of a transport apparatus.

FIG. 17 shows a diagram of a side view of robot 50 with an example robot arm mechanism 452 according to one embodiment installed on a robot drive unit 454. The arm mechanism may consist of a first link (upper arm) 456 a second link (forearm) A 458, end-effector A 460, second link (forearm) B 462 and end-effector B 464. An example internal arrangement of the robot 450 of FIG. 17 is depicted diagrammatically in FIGS. 18A and 18B. The arm mechanism may be driven by a three-axis spindle 454 with three coaxial shafts, for example, an outer T1 shaft 470, a T2 shaft 472 and an inner T3 shaft 474. The first link 456 of the robot arm mechanism may be attached directly to the T1 shaft 70. The second link A 458 may be coupled to the first link 456 via a rotary joint (elbow joint) 480, and actuated by the T3 shaft 474 using a band arrangement 482. The band arrangement may 482 comprise shoulder pulley A 484, which may be attached to the T3 shaft 474, an elbow pulley A 486, which may be attached to the second link A 458, and a band, belt or cable 488, which may transmit motion between the two pulleys. The belt arrangement may feature a constant or variable transmission ratio, for instance, 1:1 ratio may be conveniently used. However, any other suitable arrangement may be used. Similarly, the second link B 462 may be coupled to the first link 456 via a rotary joint (elbow joint) 480, and actuated by the T2 shaft 472 using a band arrangement 483. End-effector A 460 may be coupled to second link A 458 via a rotary joint (wrist joint) 490, and its orientation may be constrained by another band arrangement 492. The band arrangement may include an elbow pulley 494, which may be connected to the first link, and a wrist pulley 496, which may be connected to end-effector A 460, and a band 498, belt or cable, which may transmit motion between the two pulleys. The band arrangement may feature a variable transmission ratio. The variable transmission ratio may be implemented, for instance, using at least one pulley with a non-circular profile. As an example, referring to FIGS. 18A and 18B, the wrist pulley may feature a non-circular profile. An example of an arm that utilizes non circular pulleys is disclosed in U.S. patent application Ser. No. 13/833,732 filed Mar. 15, 2013 and entitled "Robot Having Arm With Unequal Link Lengths" which is hereby incorporated by reference herein in its entirety. Another example of an arm that utilizes non circular pulleys is disclosed in U.S. Provisional Patent Application No. 62/132,066 filed Mar. 12, 2015 and entitled "2-Degree-of-Freedom 3-Link Robot Arm Mechanisms" which is hereby incorporated by reference herein in its entirety. Another example of an arm that utilizes non circular pulleys is disclosed in U.S. Provisional Patent Application No. 62/135,490 filed Mar. 19, 2015 and entitled "Arm Mechanisms with Two End Effectors" which is hereby incorporated by reference herein in its entirety.

The variable transmission ratio may be selected so that the orientation of end-effector A 460 changes in a predefined manner as a function of the relative position of the first link 456 and second link A 458. For instance, it may be selected so that end-effector A 460 may follow a path to a station, as illustrated in FIGS. 19A-19C.

Similarly, end-effector B 464 may be coupled to second link B 462 via a rotary joint (wrist joint) 502, and its orientation may be constrained by yet another band arrangement 504. The band arrangement 504 may comprise an elbow pulley 506, which may be connected to the first link 56, a wrist pulley 508, which may be connected to end-effector B 464, and a band, belt or cable 510, which may transmit motion between the two pulleys. The band arrangement may feature a variable transmission ratio. The variable transmission ratio may be implemented, for instance, using at least one pulley with a non-circular profile. As an example, referring to FIGS. 18A and 18B, the wrist pulley may feature a non-circular profile. The variable transmission ratio may be selected so that the orientation of end-effector B changes in a predefined manner as a function of the relative position of the first link and second link B. For instance, it may be selected so that end-effector B may follow a path to a station, as illustrated in FIGS. 19A-19C.

Figure 19C:
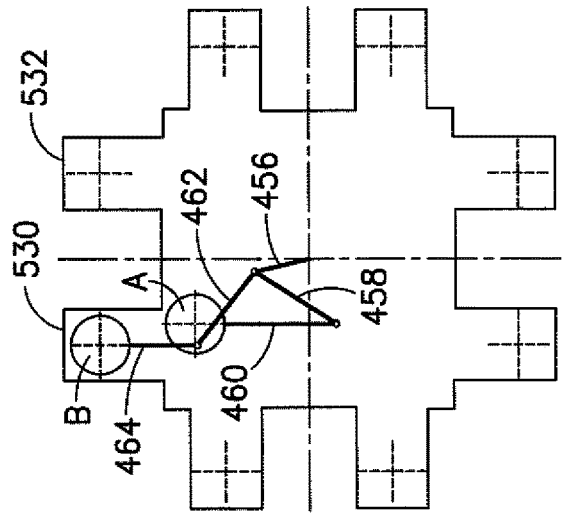
FIGS. 19A-19C are top views of a transport apparatus.
Figure 19B:
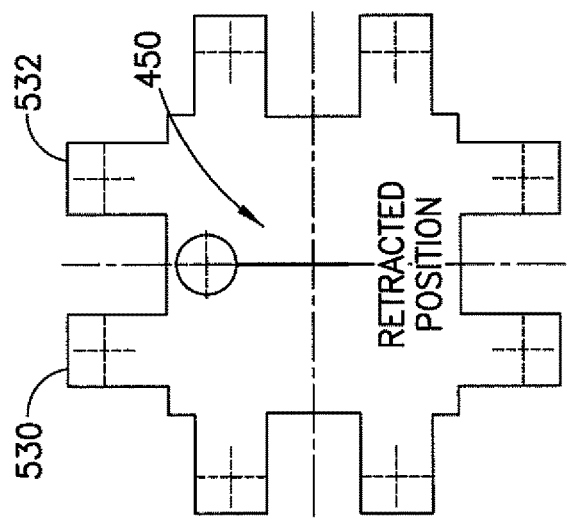
Figure 19A:
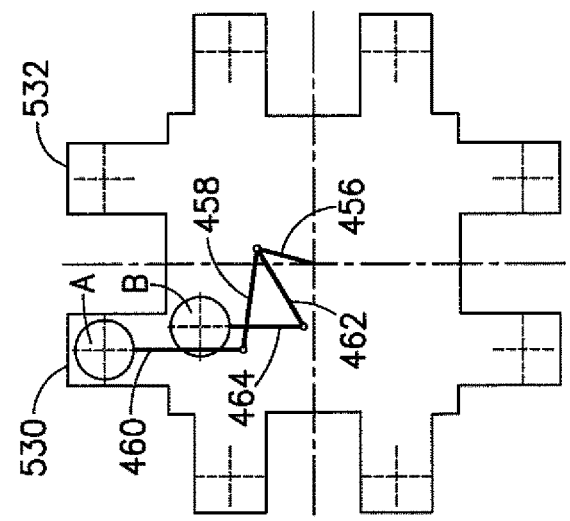
Figure 20C:
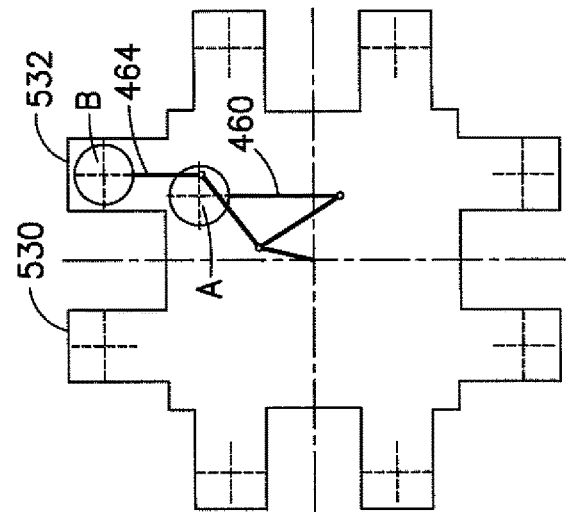
FIGS. 20A-20C are top views of a transport apparatus.
Figure 20B:
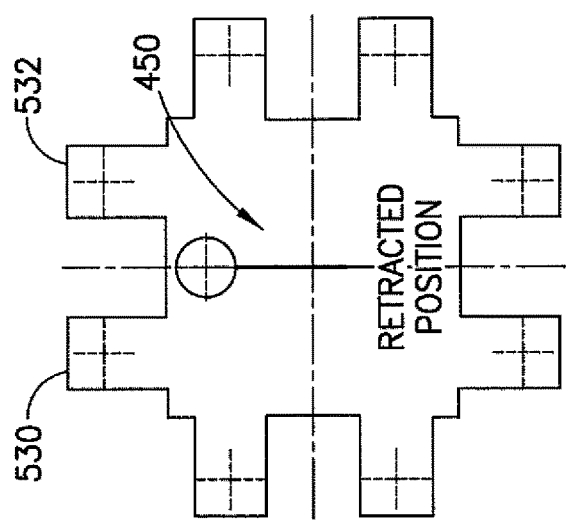
Figure 20A:
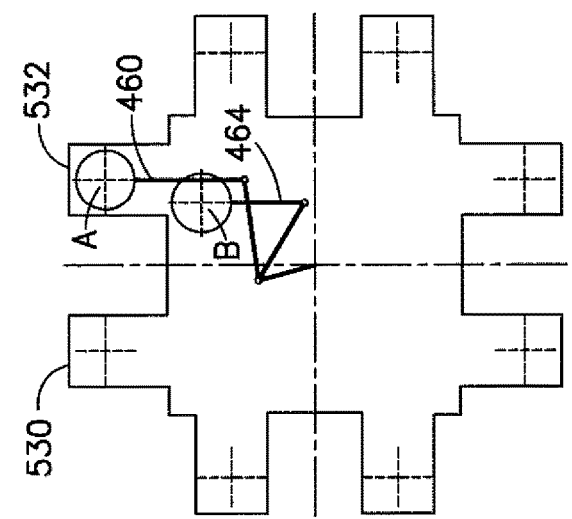
Figure 21C:
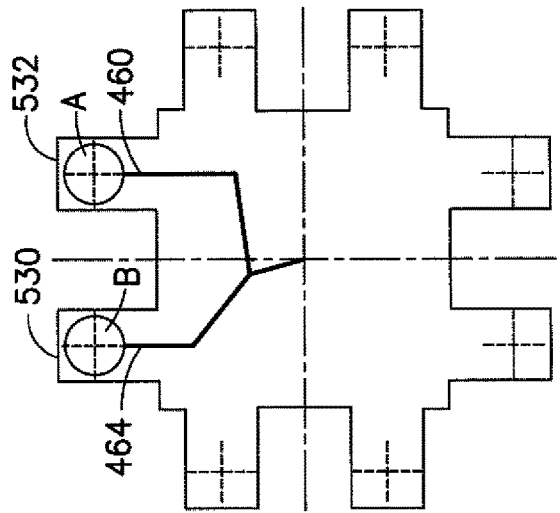
FIGS. 21A-21C are top views of a transport apparatus.
Figure 21B:
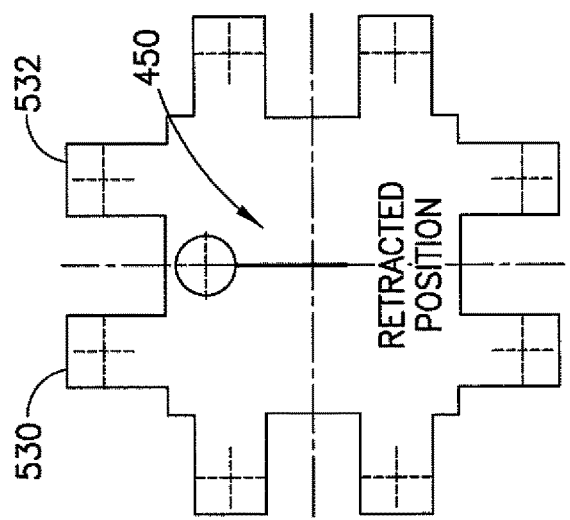
Figure 21A:
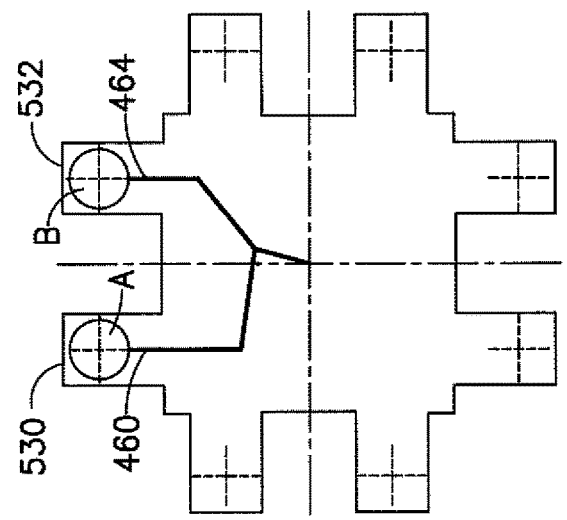

Typical operations of the robot are illustrated in FIGS. 19-21. FIGS. 19A-19C shows the robot 450 in the retracted position, accessing the left station 530 with end-effector A and accessing the same station using end-effector B. This allows the robot to perform rapid material exchange in the left station. Similarly, FIGS. 20A-20C depicts the robot 450 as it accesses station B 532 with end-effectors A and B, allowing the robot to perform rapid material exchange in station B. Finally, FIGS. 21A-21C illustrates that the robot may extend both end-effectors 460, 464 to access the left 530 and right 532 stations simultaneously. Further, the T1, T2 and T3 shafts may rotate in sync to reorient the arm mechanism to access another pair of stations or any suitable combination of location(s).

Figure 22:
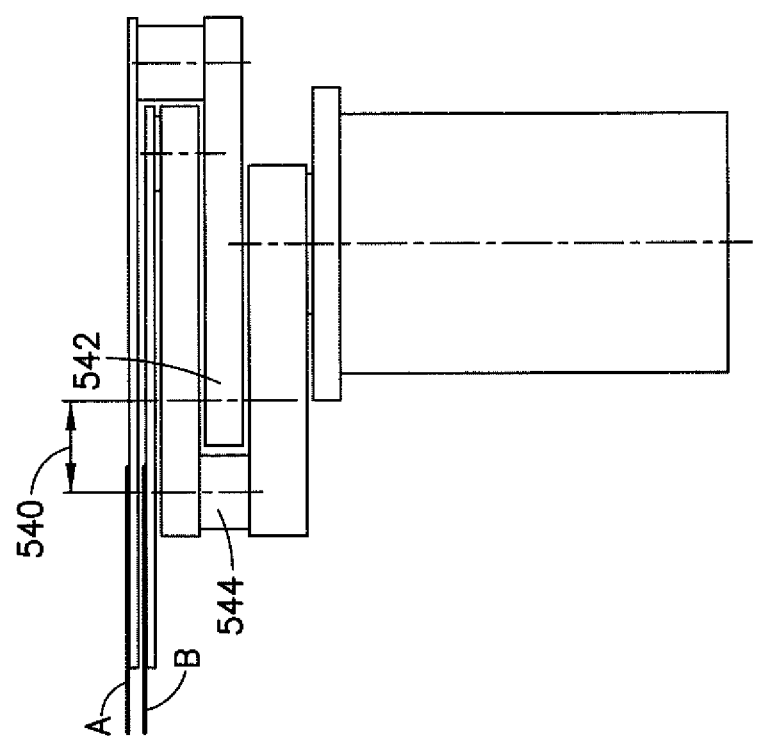
FIG. 22 is a side view of a transport apparatus.
Figures 23A, 23B:
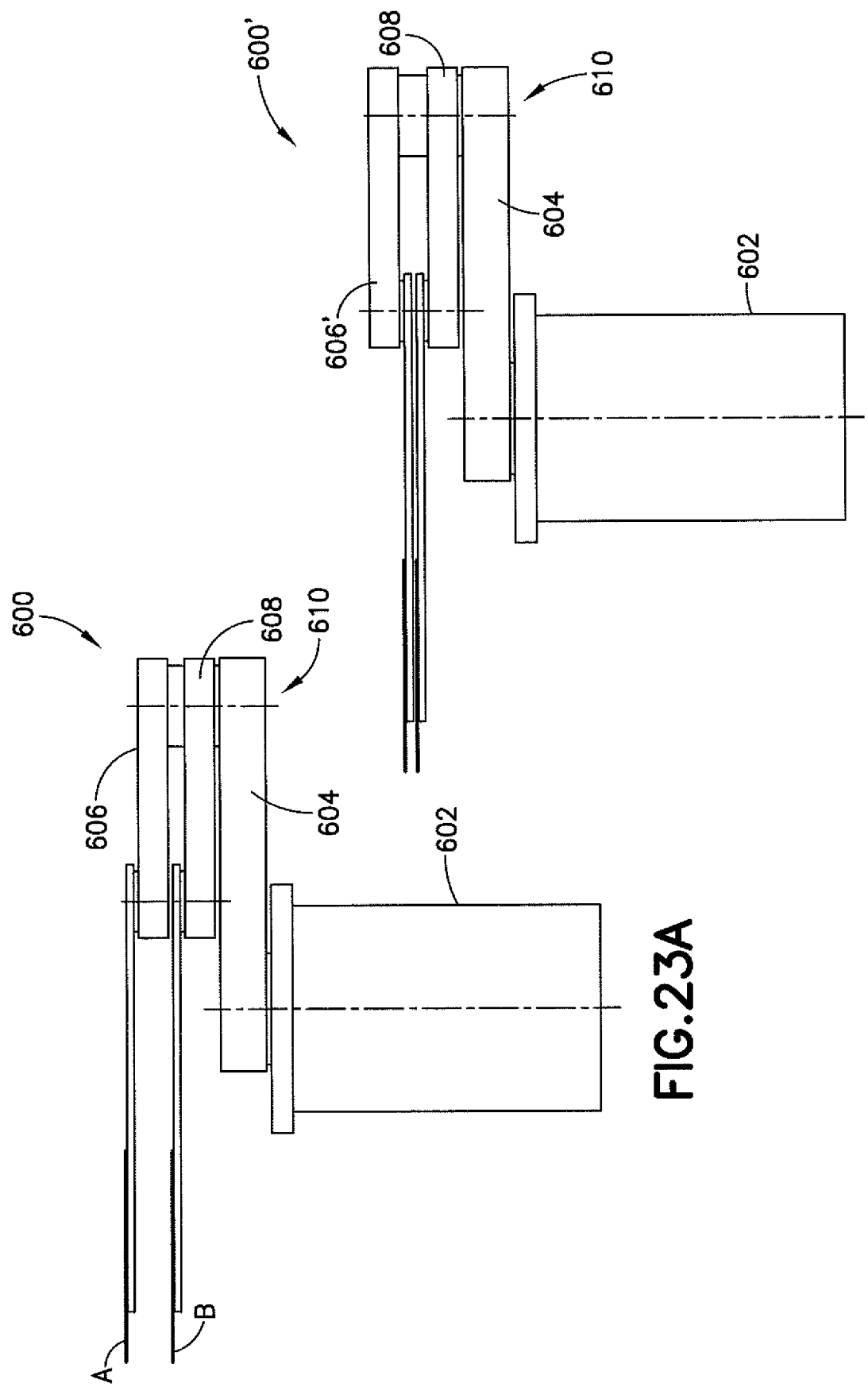
FIG. 23A is a side view of a transport apparatus.
FIG. 23B is a side view of a transport apparatus.

The examples of FIGS. 17 to 21 show the robot arm mechanism with the elbow joints configured in a coaxial manner. However, the elbow joints may be configured in an offset manner 540 as two separate joints 542, 544, as depicted diagrammatically in the example robot 450' of FIG. 22. Additional alternative example embodiments are shown diagrammatically in FIGS. 23A and 23B. FIG. 23A shows robot 600 having drive 602, common upper arm 604, forearm A 606 and forearm B 608 having common elbow 610. Here, robot 600 is shown with end effectors mounted to the top surface of forearms 604, 606 at respective wrist joints where robot 600 may be driven and utilized in a similar fashion as robot 450. FIG. 23B shows robot 600' having drive 602, common upper arm 604, forearm A 606' and forearm B 608 having common elbow 610. Here, robot 600' is shown with end effectors mounted to the top and bottom surfaces respectively of forearms 604, 606' at respective wrist joints where robot 600' may be driven and utilized in a similar fashion as robot 450.

Figure 24:
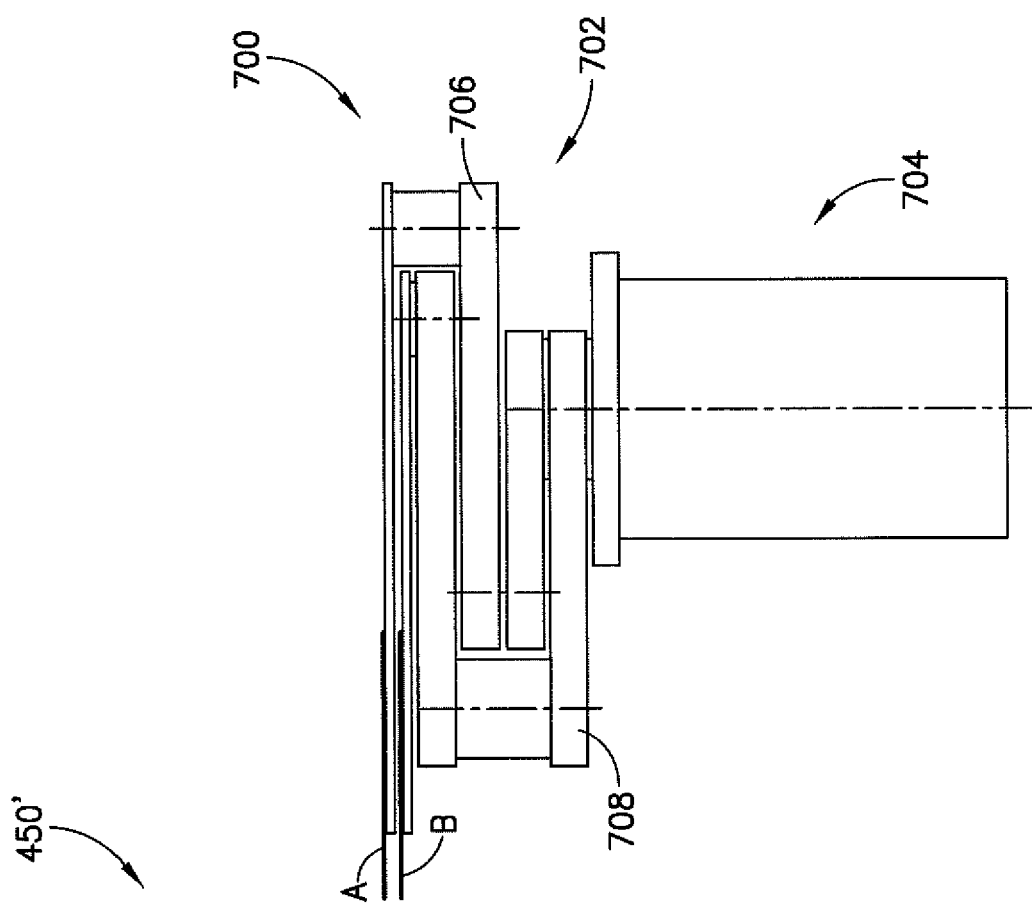
FIG. 24 is a side view of a transport apparatus.

FIG. 24 shows a diagram of a side view robot of the robot arm mechanism 702 according to an embodiment installed on a robot drive unit 704. The arm mechanism may consist of linkage A 706 and linkage B 708. An example internal arrangement of the robot 700 of FIG. 24 is depicted diagrammatically in FIGS. 25A and 25B. The arm mechanism may be driven by a three-axis spindle 704 with three coaxial shafts, for example, an outer T1 shaft 710, a T2 shaft 712 and an inner T3 shaft 714. The T2 shaft 712 may be partially within the outer T1 shaft 710, and the inner T3 shaft 714 may be partially within the T2 shaft 712. Linkage A 706 may consist of a first link (upper arm) 716, a second link (forearm) 718 and third link (end-effector A) 720. The first link may be attached directly to the T3 shaft 714. The second link may be coupled to the first link via a rotary joint 722, and constrained by the T2 712 shaft using a band arrangement 724. The band arrangement may 724 comprise a shoulder pulley, which may be attached to the T2 shaft 712, an elbow pulley, which may be attached to the second link 718, and a band, belt or cable, which may transmit motion between the two pulleys. The belt arrangement may feature a variable transmission ratio. However, any other suitable arrangement may be used. The third link of linkage A 720 may be coupled to the second link 716 via a rotary joint 726, and its orientation may be constrained by another band arrangement 728. The band arrangement 728 may comprise a left elbow pulley, which may be connected to the first link 716, a wrist pulley, which may be connected to the third link 720, and a band, belt or cable, which may transmit motion between the two pulleys. The band arrangement may feature a variable transmission ratio. The variable transmission ratio may be implemented, for instance, using at least one pulley with a non-circular profile. As an example, referring to FIGS. 25A and 25B, the wrist pulley may feature a non-circular profile. The variable transmission ratio may be selected so that the orientation of the third link (end-effector A) of linkage A changes in a predefined manner as a function of the relative position of the first and second links. The relative position of the first and second links may be conveniently expressed in terms of the included angle between the two links. By way of example, the transmission ratios of the two band arrangements of linkage A 706 may be selected in a manner that may allow a reference point on the third link (typically the nominal center of end-effector A) to follow a predetermined path with a predetermined (for example, constant) orientation of the left third link (end-effector A) when the first link is actuated by the T3 shaft and the T2 shaft is kept stationary.

Figure 26C:
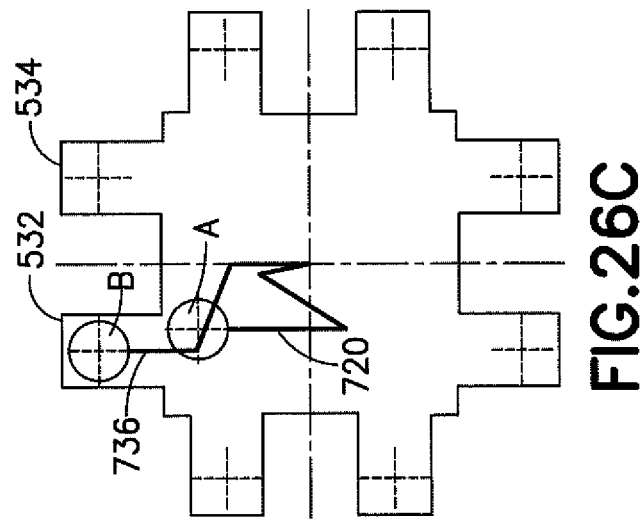
FIGS. 26A-26C are top views of a transport apparatus.
Figure 26B:
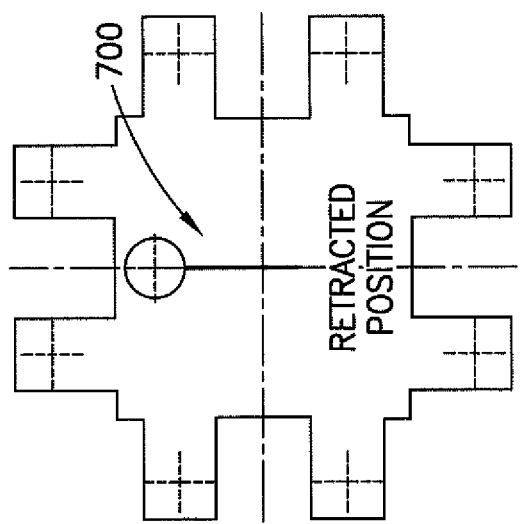
Figure 26A:
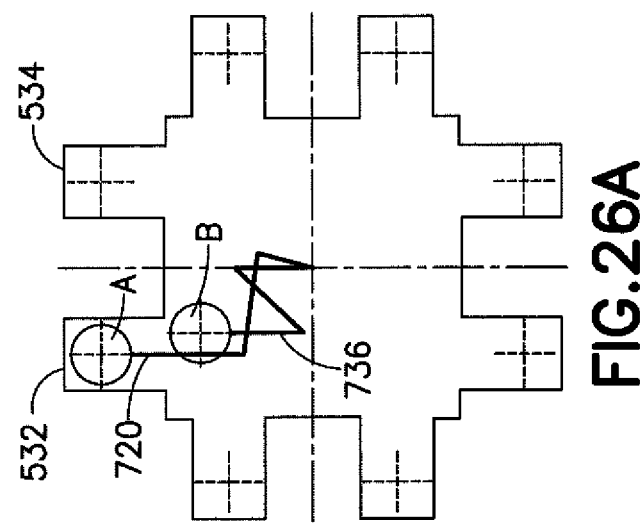

As an example, the path may be selected as an access path to one of the stations 132 of FIG. 16, as illustrated in FIGS. 26A-26C. Referring to FIGS. 25A and 25B again, linkage B 708 may consist of a first link (upper arm) 732 a second link 734 (forearm) and a right third link (end-effector B) 736. The first link 732 may be attached directly to the T1 shaft 710. The second link 734 may be coupled to the first link 732 via a rotary joint 738, and constrained by the T2 shaft 312 using a band arrangement 740. The band arrangement may comprise another shoulder pulley, which may be attached to the T2 shaft 712, an elbow pulley, which may be attached to the second link 734, and a band, belt or cable, which may transmit motion between the two pulleys. Similarly to left linkage A, the belt arrangement may feature a variable transmission ratio. However, any other suitable arrangement may be used. The remaining components of linkage B may be configured in a manner similar to linkage A, and the operation of the linkage B is also substantially equivalent to linkage A except that the T1 shaft 310 takes the role of the T3 shaft 314.

Figure 28C:
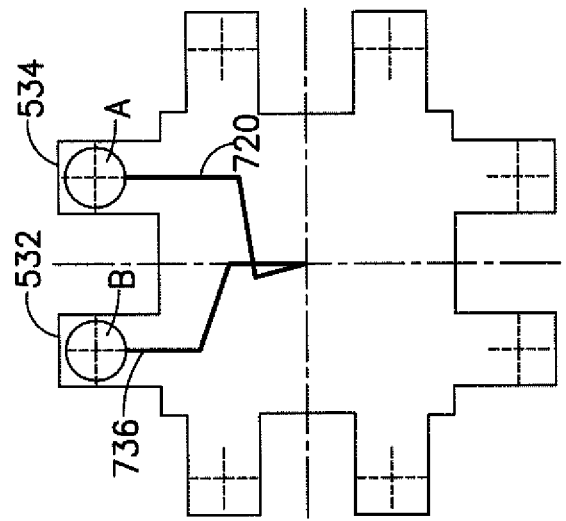
FIGS. 28A-28C are top views of a transport apparatus.
Figure 28B:
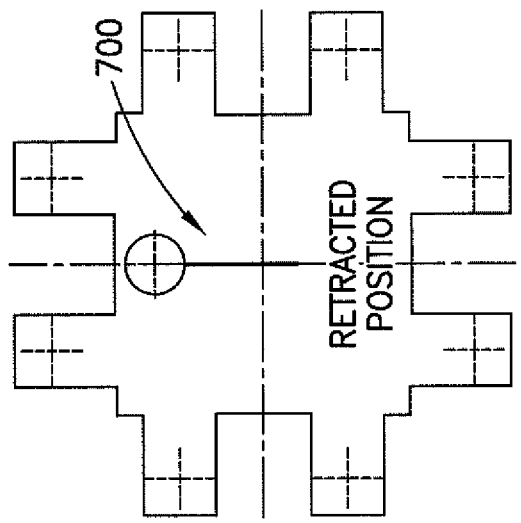
Figure 28A:
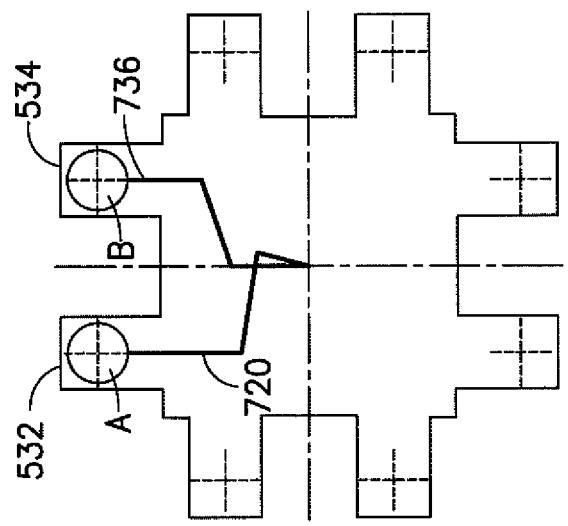

Typical operations of the robot are illustrated in FIGS. 26 to 28. FIGS. 26A-26C shows the robot 700 in the retracted position, accessing the left station 532 with end-effector A 720 and accessing the same station using end-effector B 736. This allows the robot 700 to perform rapid material exchange in the left station 532. Similarly, FIGS. 27A-27C depicts the robot 700 as it accesses station B 534 with end-effectors A 720 and B 736, allowing the robot to perform rapid material exchange in station B 534. Further, FIGS. 28A-28C illustrate that the robot may extend both end-effectors to access the left and right stations simultaneously. Further, the T1, T2 and T3 shafts may rotate in sync to reorient the arm mechanism to access another pair of stations or any suitable position.

As seen in FIGS. 29A and 29B, alternatively, the arm mechanism may be driven by a four-axis spindle 750 with four coaxial shafts, for example, an outer T1 752 shaft, a T2 shaft 754, a T3 shaft 756 and an inner T4 shaft 758, as illustrated in the example of FIG. 29. In this particular example, the T1 shaft 352 may be connected to the first link 760 of linkage A, the T2 shaft 754 may actuate the second link 762 of linkage A, the T3 756 may actuate the second link 764 of linkage B, and the T4 shaft 758 may be connected to the first link 766 of linkage B. However, any suitable configuration of the four shafts may be used.

Additional alternative example embodiments are shown diagrammatically in FIGS. 30A and 30B. FIG. 30A shows robot 780 with drive 782, arm A 784 and arm B 786 nested as shown. Robot 780 may have features and be driven similar to robots 700, 750 or otherwise. Here, robot 780 is shown with end effectors mounted to the top surface of respective forearms at respective wrist joints where robot 780 may be driven and utilized in a similar fashion. FIG. 30B shows robot 780' with drive 782, arm A 784' and arm B 786 nested as shown. Robot 780 may have features and be driven similar to robots 700, 750 or otherwise. Here, robot 780' is shown with end effectors mounted to the bottom and top surfaces of respective forearms at respective wrist joints where robot 780' may be driven and utilized in a similar fashion.

The disclosed aspects may similarly be applied to dual-end-effector robot arm mechanisms which may be used to transfer material to/from side-by-side (laterally offset) stations in a semiconductor wafer processing tool. An example layout of a semiconductor wafer processing tool 810 is diagrammatically depicted in the top view of FIG. 31. In this particular example, the tool features 4 pairs of side-by-side stations, for example, one pair of load locks 812 and 3 pairs of process module stations 814 coupled to transport chamber 816.

Figure 31:
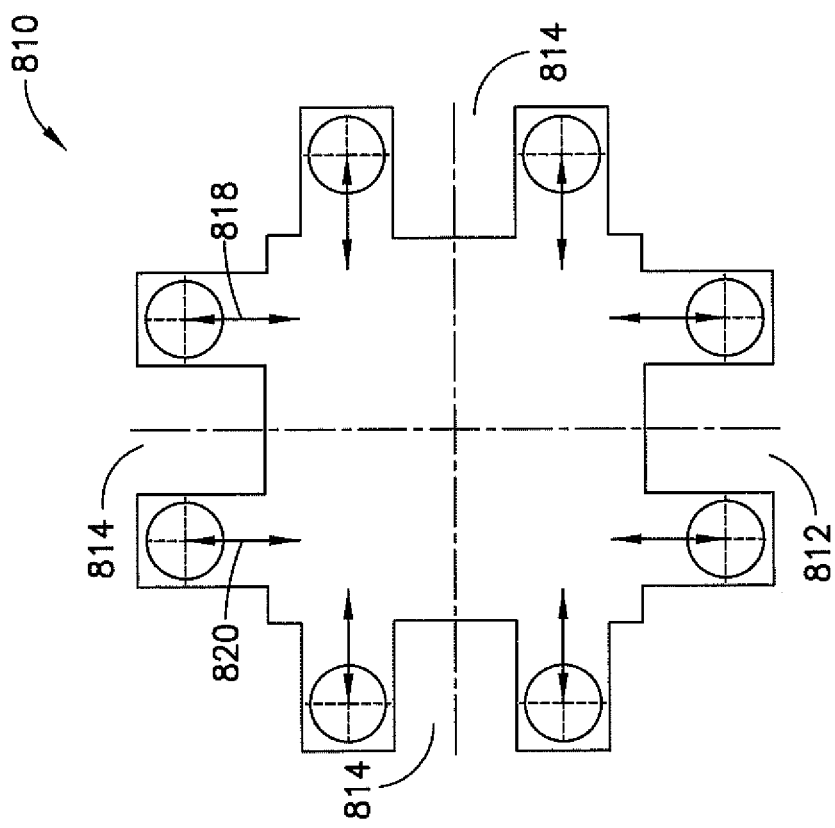
FIG. 31 is a top view of a transport apparatus.

The present arm mechanisms may provide access to each of the stations in the tool along a predefined path, for example, substantially straight-line path 818, 820, with predefined orientation of the end-effector, for example, along the straight-line path 818, 820, as illustrated in the example of FIG. 31.

Figure 32:
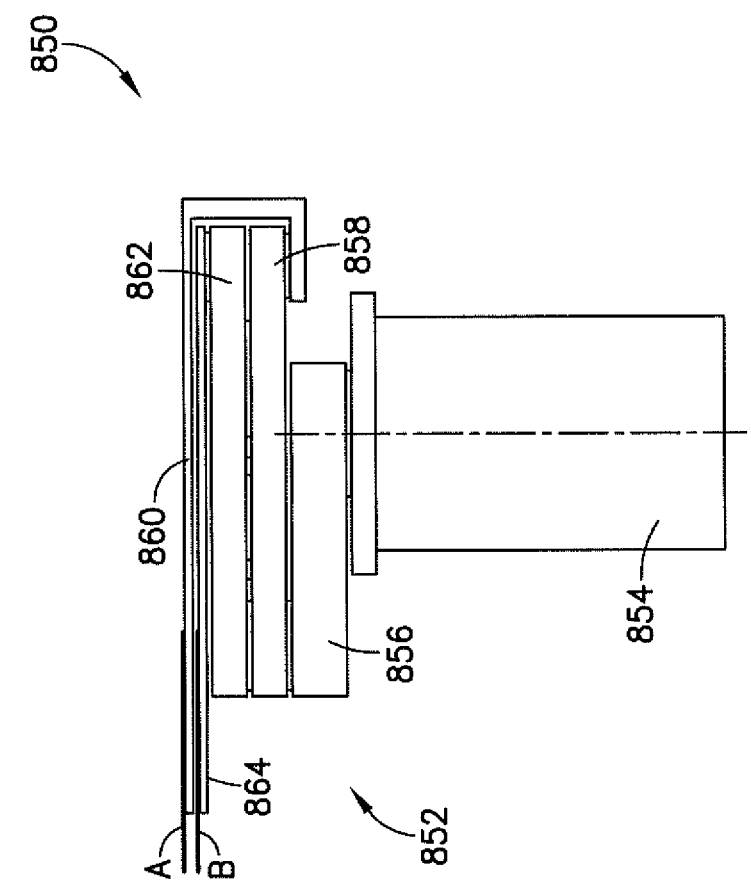
FIG. 32 is a side view of a transport apparatus.
Figure 33A:
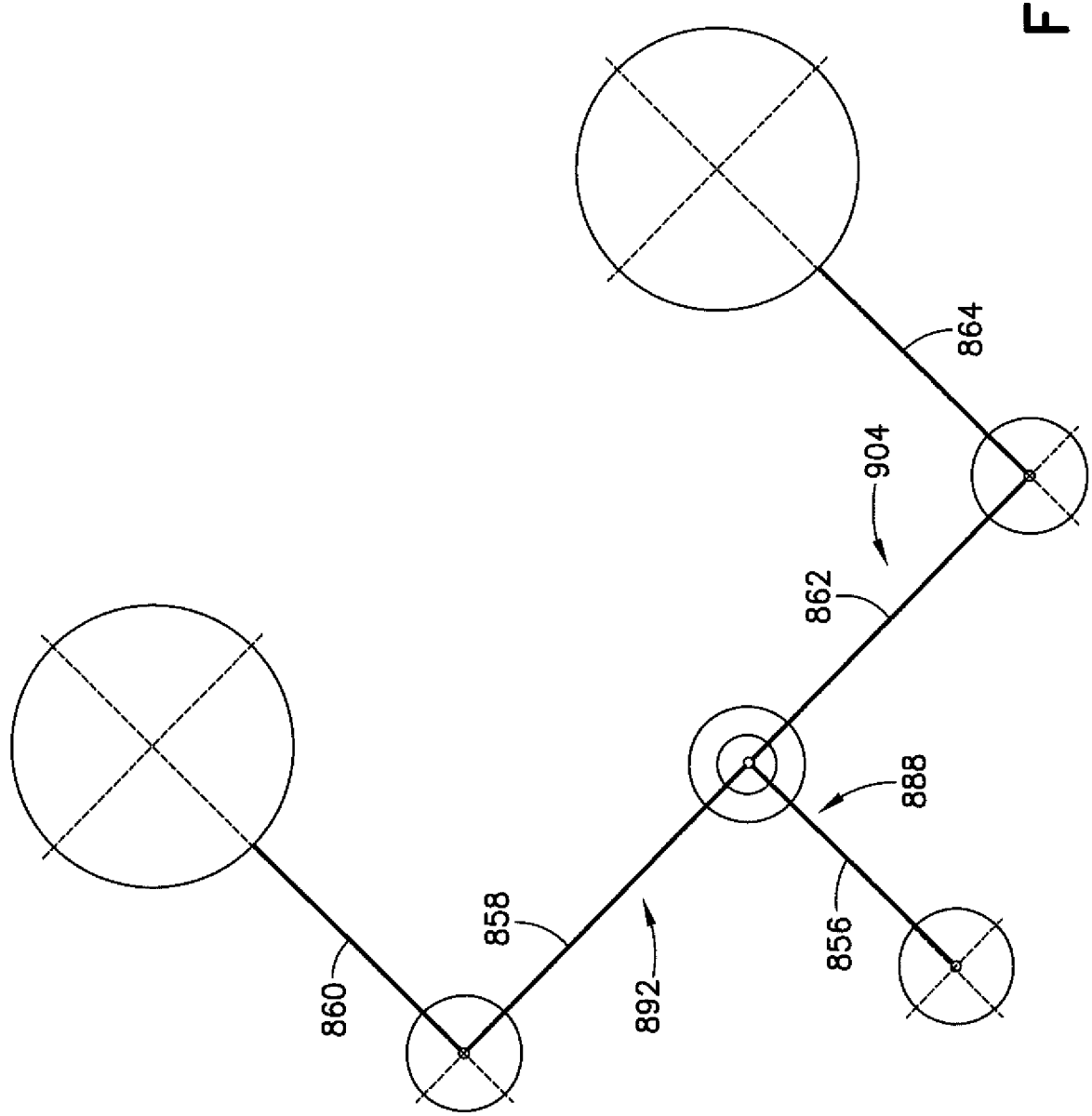
FIG. 33A is a top view of a transport apparatus.
Figure 33B:
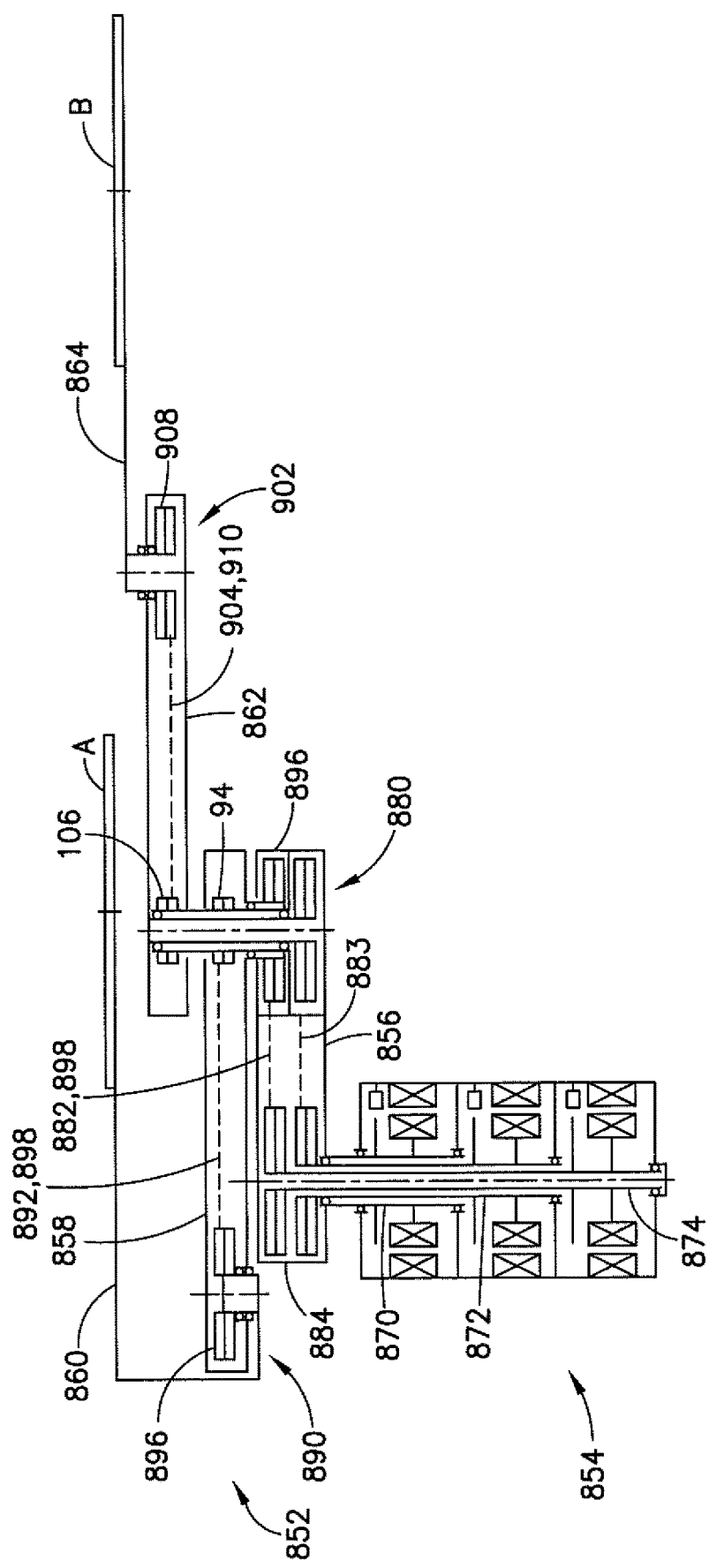
FIG. 33B is a side view of a transport apparatus.

FIG. 32 shows a diagram of a side view of robot 850 with an example robot arm mechanism 852 according to one embodiment installed on a robot drive unit 854. The arm mechanism may consist of a first link (upper arm) 856 a second link (forearm) A 858, end-effector A 860, second link (forearm) B 862 and end-effector B 864. An example internal arrangement of the robot 850 of FIG. 32 is depicted diagrammatically in FIGS. 33A and 33B. The arm mechanism may be driven by a three-axis spindle 854 with three coaxial shafts, for example, an outer T1 shaft 870, a T2 shaft 872 and an inner T3 shaft 874. The first link 856 of the robot arm mechanism may be attached directly to the T1 shaft 870. The second link A 858 may be coupled to the first link 856 via a rotary joint (elbow joint) 880, and actuated by the T3 shaft 874 using a band arrangement 882. The band arrangement 882 may comprise shoulder pulley A 884, which may be attached to the T3 shaft 874, an elbow pulley A 886, which may be attached to the second link A 858, and a band, belt or cable 888, which may transmit motion between the two pulleys. The band arrangement may feature a constant or variable transmission ratio, for instance, 1:1 ratio may be conveniently used. However, any other suitable arrangement may be used. Similarly, the second link B 862 may be coupled to the first link 856 via a rotary joint (elbow joint) 880, and actuated by the T2 shaft 872 using a band arrangement 883. End-effector A 860 may be coupled to second link A 858 via a support structure 861 and a rotary joint (wrist joint) 890. As depicted in the example of FIG. 32, support structure 861 may be attached to rotary joint 890 below second link A 858 and shaped to avoid mechanical interference, for instance, with second link A 858 and second link B 862, during operation. Support structure 861 may be formed by one or multiple components, integrated with end-effector A 860 or rotary joint 890, or implemented in any other suitable manner. Orientation of end-effector A 860 may be constrained by band arrangement 892. The band arrangement may include an elbow pulley 894, which may be connected to the first link, and a wrist pulley 896, which may be connected to support structure 861 with end-effector A 860, and a band, belt or cable 898, which may transmit motion between the two pulleys. The band arrangement may feature a variable transmission ratio. The variable transmission ratio may be implemented, for instance, using at least one pulley with a non-circular profile. As an example, referring to FIGS. 33A and 33B, the wrist pulley may feature a non-circular profile. An example of an arm that utilizes non circular pulleys is disclosed in U.S. patent application Ser. No. 13/833,732 filed Mar. 15, 2013 and entitled "Robot Having Arm With Unequal Link Lengths" which is hereby incorporated by reference herein in its entirety. Another example of an arm that utilizes non circular pulleys is disclosed in U.S. Provisional Patent Application No. 62/132,066 filed Mar. 12, 2015 and entitled "2-Degree-of-Freedom 3-Link Robot Arm Mechanisms" which is hereby incorporated by reference herein in its entirety. Another example of an arm that utilizes non circular pulleys is disclosed in U.S. Provisional Patent Application No. 62/135,490 filed Mar. 19, 2015 and entitled "Arm Mechanisms with Two End Effectors" which is hereby incorporated by reference herein in its entirety. Another example of an arm that utilizes non circular pulleys is disclosed in U.S. Provisional Patent Application No. 62/137,458 filed Mar. 24, 2015 and entitled "Robot Arm Mechanisms with Two End Effectors" which is hereby incorporated by reference herein in its entirety.

Figure 34C:
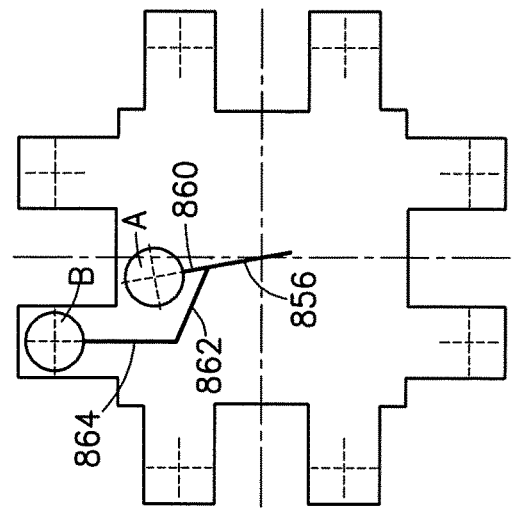
FIGS. 34A-34C are top views of a transport apparatus.
Figure 34B:
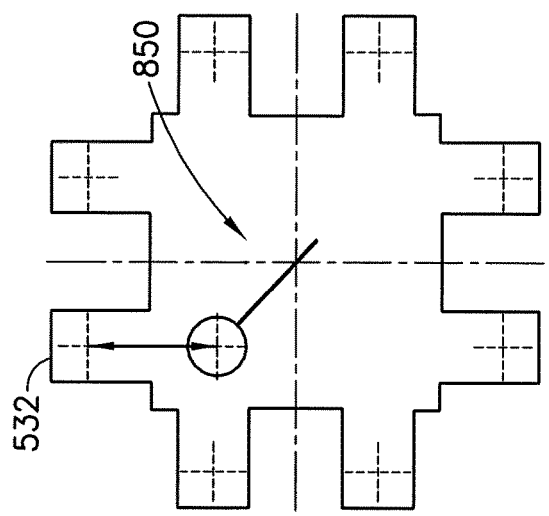
Figure 34A:
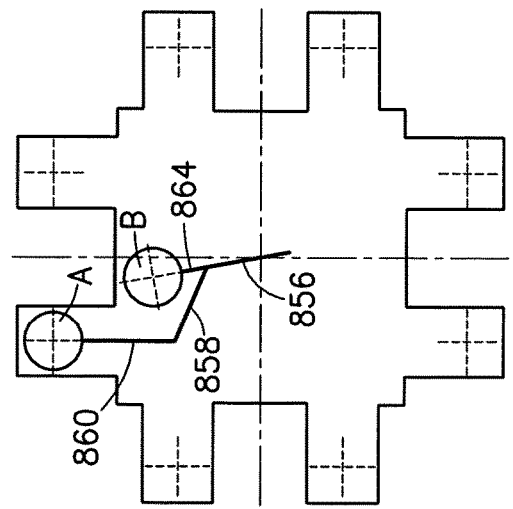

The variable transmission ratio may be selected so that the orientation of end-effector A 860 changes in a predefined manner as a function of the relative position of the first link 856 and second link A 858. For instance, it may be selected so that end-effector A 860 may follow a path to a station, as illustrated in FIGS. 34A-34C. End-effector B 864 may be coupled to second link B 862 via a rotary joint (wrist joint) 902, and its orientation may be constrained by yet another band arrangement 904. The band arrangement 904 may comprise an elbow pulley 906, which may be connected to the first link 856, a wrist pulley 908, which may be connected to end-effector B 864, and a band, belt or cable 910, which may transmit motion between the two pulleys. The band arrangement may feature a variable transmission ratio. The variable transmission ratio may be implemented, for instance, using at least one pulley with a non-circular profile. As an example, referring to FIGS. 33A and 33B, the wrist pulley may feature a non-circular profile.

The variable transmission ratio may be selected so that the orientation of end-effector B changes in a predefined manner as a function of the relative position of the first link and second link B. For instance, it may be selected so that end-effector B may follow a path to a station, as illustrated in FIGS. 34A-34C. Example operations of the robot are illustrated in FIGS. 34 and 35. FIGS. 34A-34C shows the robot 850 in the retracted position in front of the left station 530, accessing the left station 530 with end-effector A and accessing the same station using end-effector B. This allows the robot to perform rapid material exchange in the left station. Referring still to FIGS. 34A-34C, end-effector A 860 may be extended to left station 530 along a desired path, for instance, a substantially straight-line path 820, by rotating T3 shaft 874 in the clockwise direction while the rotation of T1 shaft 870 is coordinated with the rotation of T3 shaft 74 so that end-effector A 860 follows the desired straight-line path 820. At the same time, end-effector B 864 may be kept folded on top of second link B 862 by rotating T2 shaft 862 in sync with T1 shaft 870. Similarly, end-effector A 860 may be retracted from left station 530 along a desired path, for instance, the same substantially straight-line path 820, by rotating T3 shaft 874 in the counterclockwise direction while the rotation of T1 shaft 870 is coordinated with the rotation of T3 shaft 874 so that end-effector A 860 follows the desired straight-line path 820. Again, end-effector B 864 may be kept folded on top of second link B 862 by rotating T2 shaft 862 in sync with T1 shaft 870. End-effector B 864 may then be extended to left station 530 along a desired path, for instance, a substantially straight-line path 820, by rotating T2 shaft 872 in the clockwise direction while the rotation of T1 shaft 870 is coordinated with the rotation of T2 shaft 872 so that end-effector B 864 follows the desired straight-line path 820. At the same time, end-effector A 60 may be kept folded on top of second link A 858 by rotating T3 shaft 874 in sync with T1 shaft 870. Further, end-effector B 864 may be retracted from left station 530 along a desired path, for instance, the same substantially straight-line path 820, by rotating T2 shaft 872 in the counterclockwise direction while the rotation of T1 shaft 870 is coordinated with the rotation of T2 shaft 872 so that end-effector B 864 follows the desired straight-line path 820. Again, end-effector A 860 may be kept folded on top of second link A 58 by rotating T3 shaft 874 in sync with T1 shaft 870. Further, the T1, T2 and T3 shafts may be rotated in sync to reorient the arm mechanism to access another location, for instance, right station 532.

FIGS. 35A-35C depict the robot 850 as it accesses the right station 532 with end-effectors A and B, allowing the robot to perform rapid material exchange in the right station 532. In FIGS. 35A-35C, end-effector A 860 may be extended to right station 532 along a desired path, for instance, a substantially straight-line path 818, by rotating T3 shaft 74 in the counterclockwise direction while the rotation of T1 shaft 870 is coordinated with the rotation of T3 shaft 874 so that end-effector A 860 follows the desired straight-line path 818. At the same time, end-effector B 864 may be kept folded on top of second link B 862 by rotating T2 shaft 862 in sync with T1 shaft 870. Similarly, end-effector A 860 may be retracted from right station 532 along a desired path, for instance, the same substantially straight-line path 818, by rotating T3 shaft 874 in the clockwise direction while the rotation of T1 shaft 870 is coordinated with the rotation of T3 shaft 874 so that end-effector A 860 follows the desired straight-line path 818. Again, end-effector B 864 may be kept folded on top of second link B 862 by rotating T2 shaft 862 in sync with T1 shaft 870. End-effector B 864 may then be extended to right station 532 along a desired path, for instance, a substantially straight-line path 818, by rotating T2 shaft 872 in the counterclockwise direction while the rotation of T1 shaft 870 is coordinated with the rotation of T2 shaft 872 so that end-effector B 864 follows the desired straight-line path 818. At the same time, end-effector A 860 may be kept folded on top of second link A 858 by rotating T3 shaft 874 in sync with T1 shaft 870. Further, end-effector B 864 may be retracted from right station 532 along a desired path, for instance, the same substantially straight-line path 818, by rotating T2 shaft 872 in the clockwise direction while the rotation of T1 shaft 870 is coordinated with the rotation of T2 shaft 872 so that end-effector B 864 follows the desired straight-line path 818. Again, end-effector A 860 may be kept folded on top of second link A 858 by rotating T3 shaft 874 in sync with T1 shaft 870.

The operations and motions of FIGS. 34 and 35 represent examples, and the arm mechanism may perform any other desired operations and suitable motions. For instance, rotations of some or all shafts 870, 872 and 874 may be defined and coordinated so that the amount of motion of the retracted end-effector, for instance, end-effector A 860, during the extension and retraction of the other end-effector, for instance, end-effector B 864, is minimized. As another example, individual moves, such as extensions, retractions and rotations, may be blended and/or overlapped to achieve smooth motion paths and to reduce the overall duration of motion.

Figure 36:
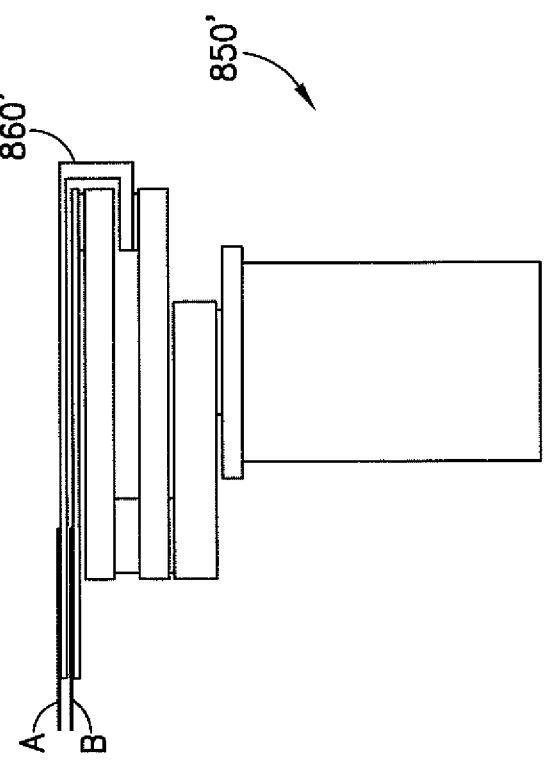
FIG. 36 is a side view of a transport apparatus.
Figure 37A:
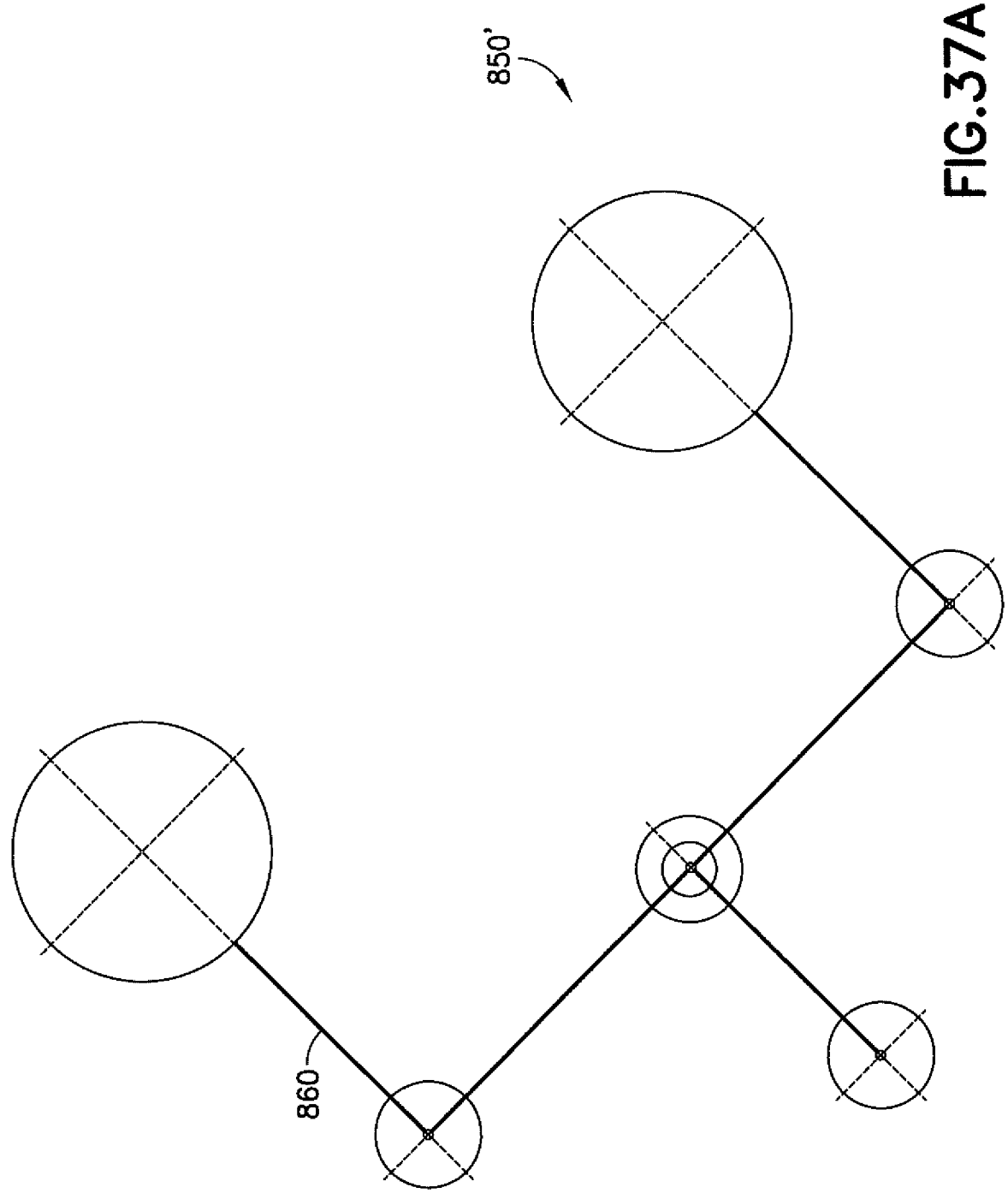
FIG. 37A is a top view of a transport apparatus.

The examples of FIGS. 32 and 33 show the robot arm mechanism with the support structure 861 attached to rotary joint 890 below second link A 858. However, support structure 861 may be attached to rotary joint 890 above second link A 858, as shown diagrammatically in FIG. 36. An example internal arrangement of the example embodiment of FIG. 36 is depicted diagrammatically in FIGS. 37A and 37B. Alternatively, support structure 861 may be attached to rotary joint 90 in any suitable manner and may have any suitable shape.

The examples of FIGS. 32 to 37 depict the robot arm mechanism with second link A 858 and second link B 862 having equal lengths. However, second link A 858 and second link B 862 may have any suitable overall and joint-to-joint lengths. Similarly, although end-effector A 860 and end-effector B 864 are shown with equal lengths in the examples of FIGS. 32 to 37, the end-effectors may have any suitable lengths.

Although the example embodiments of FIGS. 32 to 37 are described with band arrangements 882 and 883, any other suitable single- or multi-stage transmission arrangements with fixed or variable transmission ratios, including but not limited to chains and gears, may be used. Similarly, any other suitable single- or multi-stage transmission arrangements with appropriate variable transmission ratios, including but not limited to chains and gears, may be employed in place of band arrangements 92 and 104. Furthermore, chains (e.g., in place of or in conjunction with bands, belts, or cables) as well as gears may be used in any embodiment disclosed herein.

One example of a suitable arrangement is shown in FIGS. 36 and 37 where robot 850' is shown with end effector 860' having a bridge that is mounted on an upper surface of a wrist joint as opposed to a bottom surface of a wrist joint as shown in FIG. 32. Another example of a suitable arrangement is shown in FIGS. 38A and 38B where robot 850" is shown with offset shoulder joints 897, 899.

Figure 39:
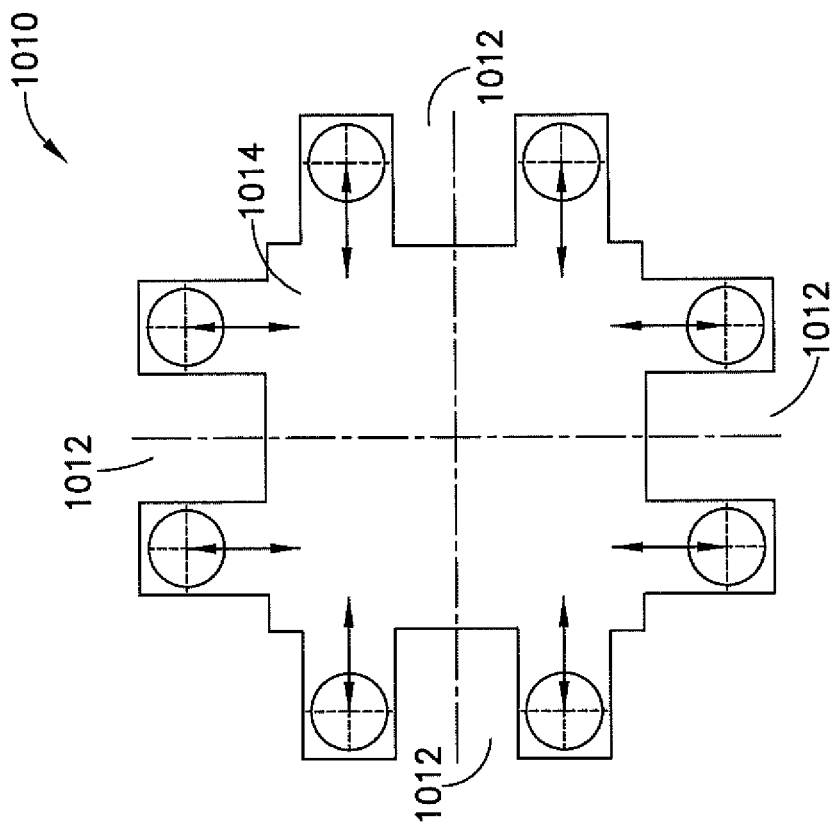
FIG. 39 is a top view of a transport apparatus.
Figure 40:
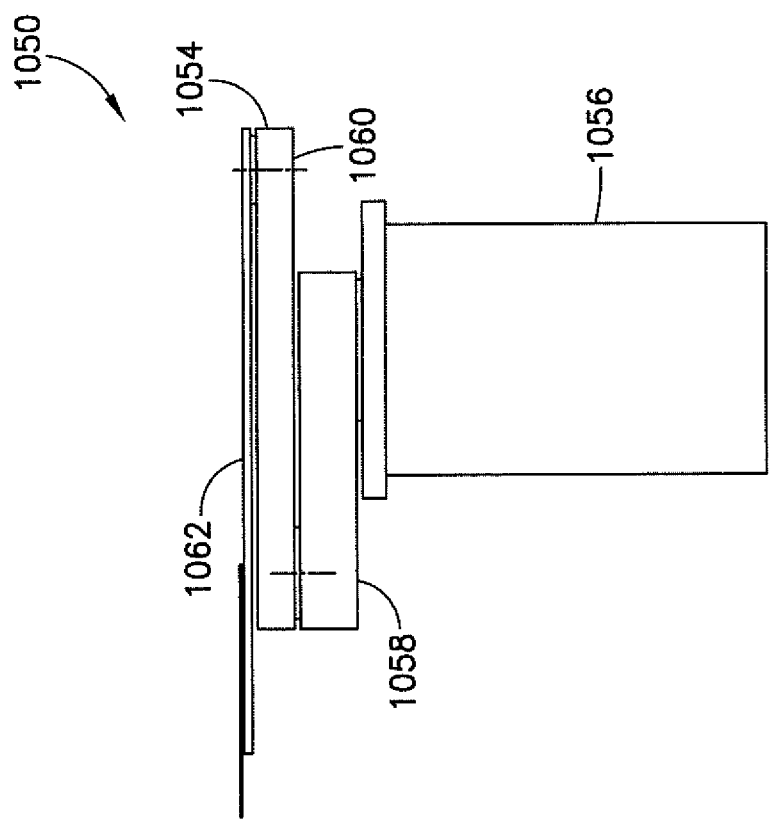
FIG. 40 is a side view of a transport apparatus.
Figure 41A:
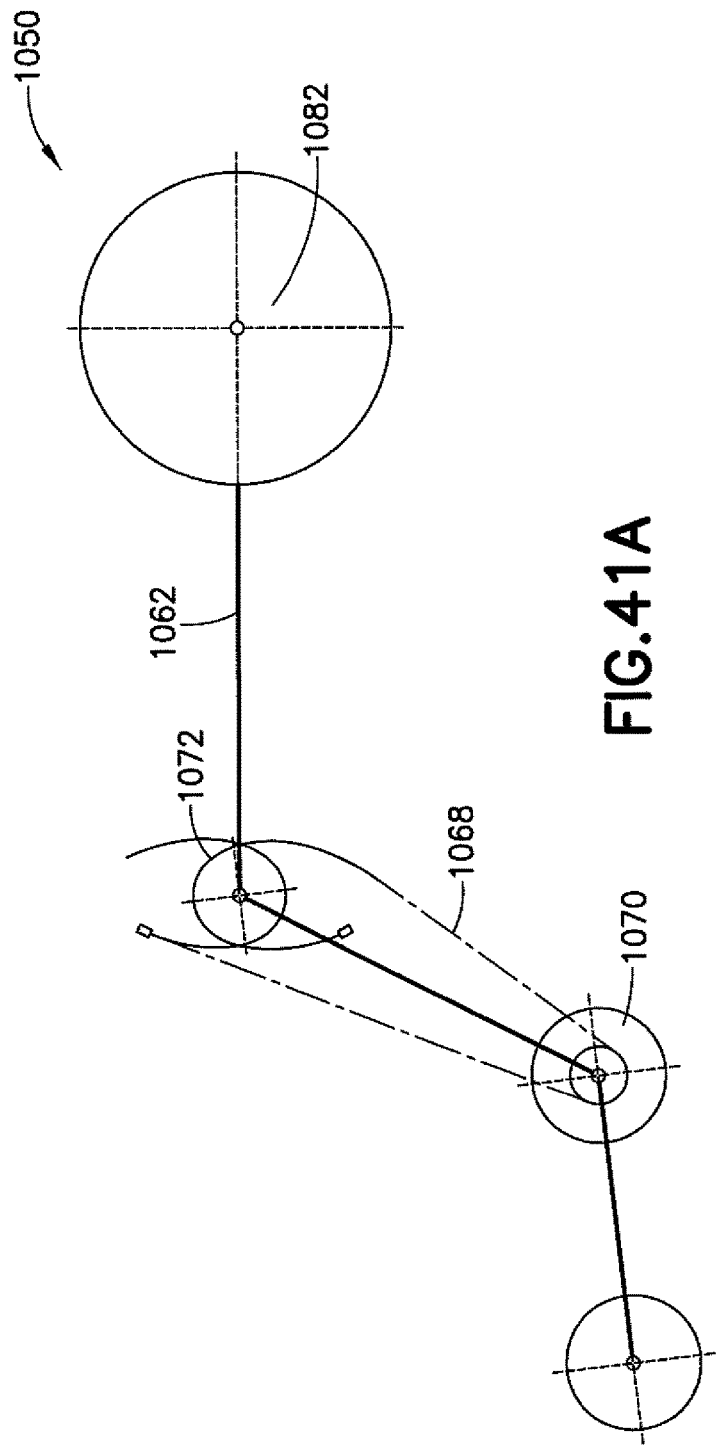
FIG. 41A is a top view of a transport apparatus.
Figure 41B:
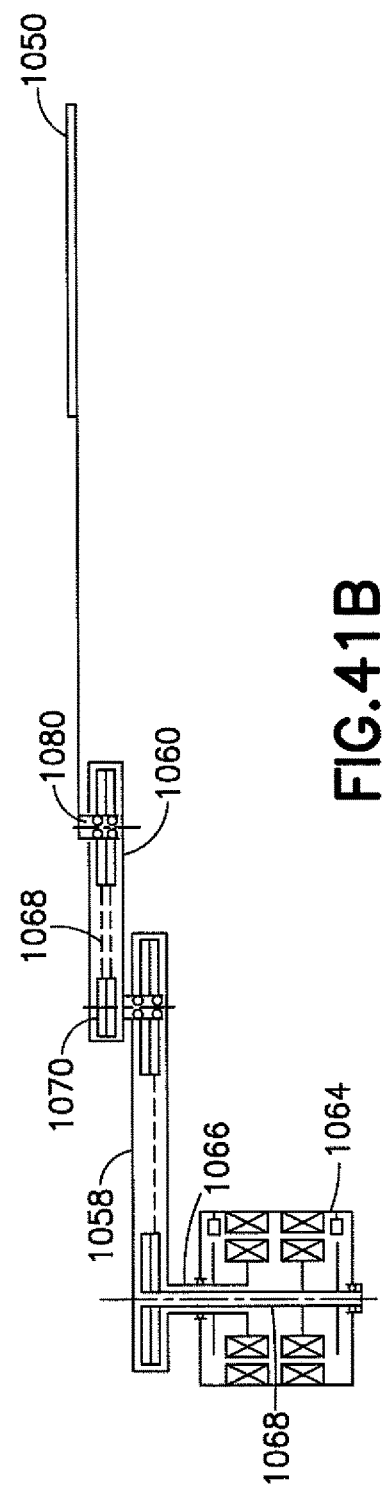
FIG. 41B is a side view of a transport apparatus.

An example layout of a semiconductor wafer processing tool 1010 is diagrammatically depicted in the top view of FIG. 39. In this example, the tool features 4 pairs of side-by-side stations 1012, for example, one pair of load locks and 3 pairs of process module stations 1012 coupled to the transport chamber 1014. FIG. 40 shows a diagram of a side view of a robot 1050 with an example 2-degree-of-freedom 3-link robot arm mechanism 1054 installed on a robot drive unit 1056. The arm mechanism 1054 may consist of a first link (upper arm) 1058, a second link (forearm) 1060 and a third link (end-effector) 1062. An example internal arrangement of the robot 1050 of FIG. 40 is depicted diagrammatically in FIGS. 41A and 41B. The arm mechanism may be driven by a two-axis spindle 1064 with two coaxial shafts, for example, an outer T1 shaft 1066 and an inner T2 shaft 1068. As illustrated in FIGS. 41A and 41B, orientation of the end-effector 1062 may be constrained by a band arrangement 1068. The band arrangement 1068 may include an elbow pulley 1070, which may be connected to the first link 1058, and a wrist pulley 1072, which may be connected to the end-effector 1062 and a band, belt or cable, which may transmit motion between the two pulleys. The band arrangement may feature a variable transmission ratio. The variable transmission ratio may be implemented, for instance, using at least one pulley with a non-circular profile. As an example, referring to FIGS. 41A and 41B, the wrist pulley 1072 may feature a non-circular profile and the elbow pulley 1070 may have a substantially circular profile. The variable transmission ratio may be selected so that the orientation of the end-effector changes in a predefined manner as a function of the relative position of the first link and the second link. For instance, it may be selected so that the end-effector may follow a path to a station, as illustrated in FIG. 39.

An example arrangement with a variable transmission ratio that provides such functionality will be discussed, for example, see FIGS. 42A to 45. A suitable geometry of the arm mechanism, i.e., the joint-to-joint link and end-effector lengths, may be conveniently derived from the location of the station(s), the required reach of the end-effector, and the constraints and obstacles in the work space (which may determine the allowable swing radius of the arm mechanism in its retracted pose).

Determining an example length of the third link 1062: The length of the third link, L3, may be conveniently defined as the distance between the axis of rotation of the wrist joint 1080 and a reference point on the third link 1082 (typically the nominal center of the end-effector). When the end-effector is extended to a station, there are three constraints in effect: 1) the position of the reference point on the third link (typically the nominal center of the end-effector) should be substantially aligned with the station location, 2) the end-effector should have a desired orientation, for instance, it may point straight along the access path to the station, and 3) the wrist joint should be far back enough so that it does not collide with any obstacles in the path to the station. The above constraints may be used to determine the length of the third link (end-effector), for instance, as the minimum value that complies with the constraints. As an example, the following expression may be used:

$$L_3 = Y_{stn} - \sqrt{R_s^2 - X_{stn}^2} \tag{1}$$

where $X_{stn}$ and $Y_{stn}$ represent respectively the x- and y-axis offsets of the station location in a Cartesian coordinate system centered on the robot, i.e., the robot center (shoulder joint) is at (0, 0), and where $R_s$ denotes the allowable swing radius $R_s$, which defines a circular space where the retracted robot arm mechanism can rotate freely.

Determining an example length of the second link: The joint-to-joint length of the second link, L2, may be defined as the distance between the axis of rotation of the elbow joint and the axis of rotation of the wrist joint. For a semiconductor wafer processing tool with pairs of side-by-side stations, such as the example layout of FIG. 39, the length of the forearm may be conveniently selected to be equal to or, if necessary, larger than the offset of the station locations from the axis of symmetry of the side-by-side stations, i.e., as half of the distance between the station locations:

$$L_2 \geq X_{stn} \quad (2)$$

An L2 larger than $X_{stn}$ may be required to allow the end-effector of the arm mechanism to reach the required extension to a station without overextending its elbow joint.

Determining an example length of the first link: The joint-to-joint length of the first link, L1, may be defined as the distance between the axis of rotation of the shoulder joint and the axis of rotation of the elbow joint. Given the values of L2 and L3, the length of the first link may be determined, for instance, so that the arm mechanism fits within the allowable swing radius when it is retracted:

$$L_1 = R_s - R_w + L_2 - L_3 \quad (3)$$

Here, $R_w$ represents radius of a circular payload, such as a wafer, carried by the end-effector.

As an example, a station location may be selected with an x-axis offset $X_{stn}$ of 388.6 mm and a y-axis offset $Y_{stn}$ of 1,030.2 mm. The allowable swing radius $R_s$, which defines a circular space where the retracted robot arm mechanism can rotate freely, may be selected, for example, as 605.8 mm. The payload carried by the arm mechanism may be, for example, a circular wafer with a radius $R_w$ of 150 mm. Based on the above example guidelines, the geometry of a suitable example arm mechanism, i.e., the joint-to-joint link and end-effector lengths, may be determined as follows: L3=565.5 mm, L2=397.6 mm>$X_{stn}$=388.6 mm and L1=287.9 mm.

Figure 42A:
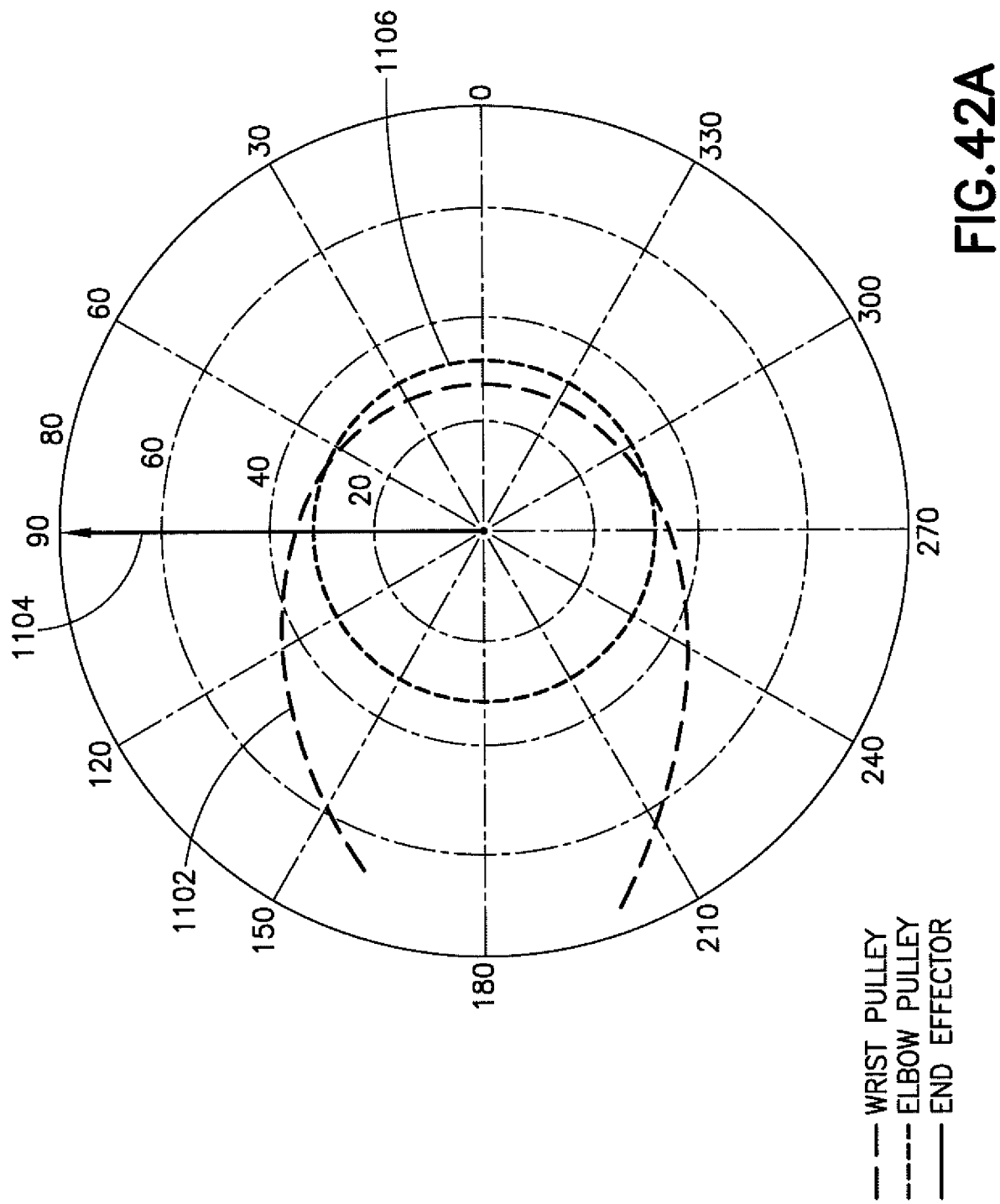
FIG. 42A is a diagram of a partial pulley profile.

Considering the example arm mechanism of FIGS. 40 and 41 where the orientation of the end-effector may be constrained, for instance, by a band arrangement with a circular elbow pulley and a non-circular wrist pulley, and assuming the above example station locations and arm mechanism geometry, the wrist pulley may have a profile as depicted by the line 1102 in FIG. 42A (the figure shows one half of the profile for clarity). The relative orientation of the wrist pulley with respect to the third link (end-effector) is illustrated by the solid arrow 1104, which points from the axis (center) of the wrist joint along the longitudinal axis of the third link toward the center of the end-effector. For comparison, the circular elbow is represented by the line 1106.

FIGS. 42B-42E illustrates how the orientation of the end-effector 1062 of the above example arm mechanism with the wrist pulley profile defined according to FIG. 4A is constrained as a function of the relative angle of the second link 1060 with respect to the first link 1058 (i.e., relative angle between the first and second links).

Figure 43:
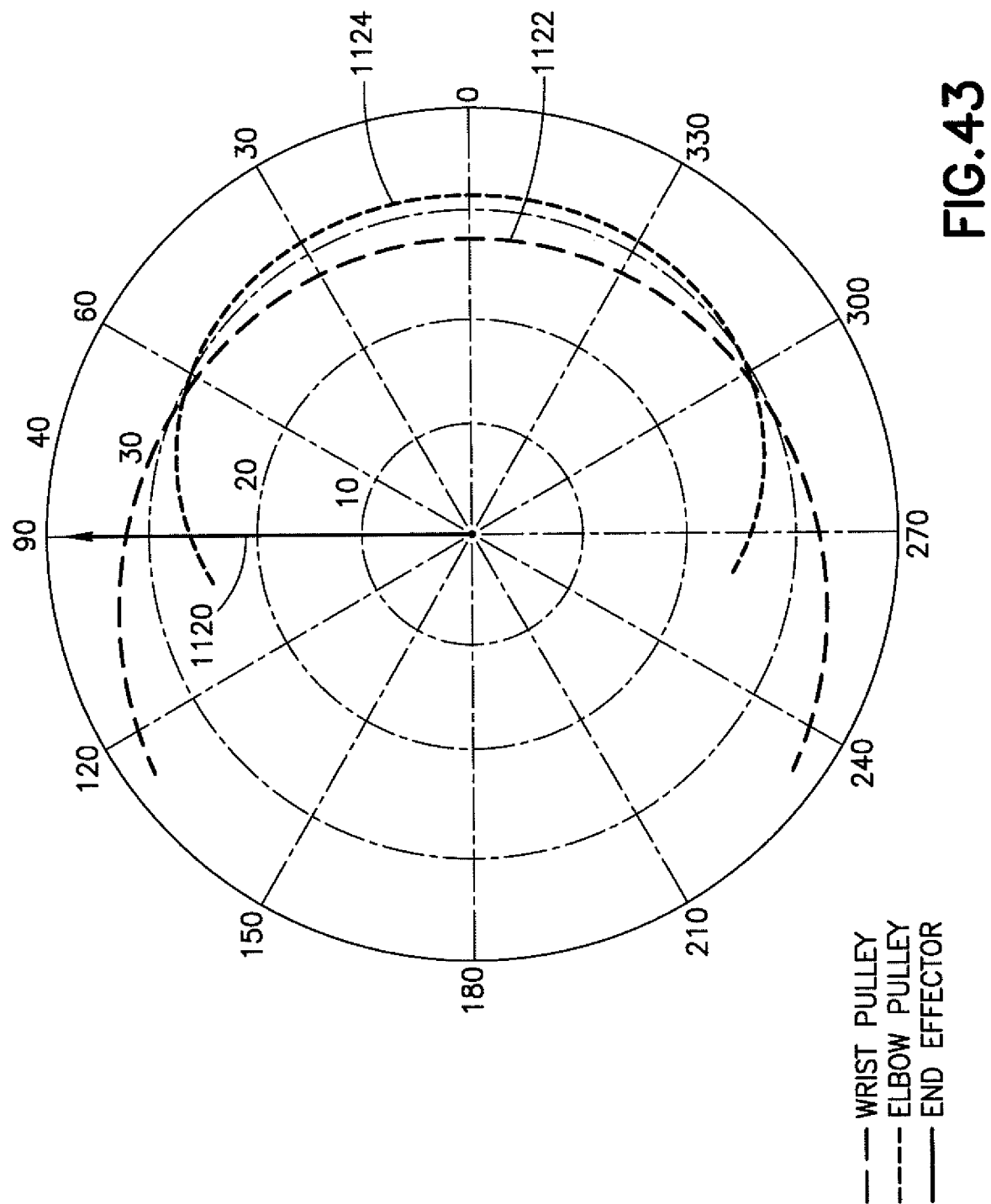
FIG. 43 is a diagram of a partial pulley profile.

FIG. 43 shows a pulley profiles that may be used for the same arm geometry as the previous pulley profile example, and may produce the same or similar motion. Here, end effector orientation 1120 is shown by the black arrow and elbow pulley profile 1124 and wrist pulley profile 1122 are shown as non-circular.

A belt/band/cable arrangement may be provided that constraints the orientation of the end-effector using two non-circular pulleys. For example, this may be applied both to the single end-effector configuration (FIGS. 42A-42E or otherwise) as well as the two end-effector configurations (FIGS. 32 and 36 or otherwise), which all may share substantially the same kinematics. In this additional example, the elbow pulley connected to the upper arm is non-circular and so is the wrist pulley connected to the end-effector. This may be provided as an alternative to examples of pulley profiles for a special case where the elbow pulley was circular and the wrist pulley was non-circular. By way of example, pulley profiles are shown in the FIG. 43. Similarly to FIG. 42A, only one half of each non-circular pulley is shown. Here, the profiles are generated for the same arm geometry (link lengths) as the previous example of non-circular pulley.

Figure 44:
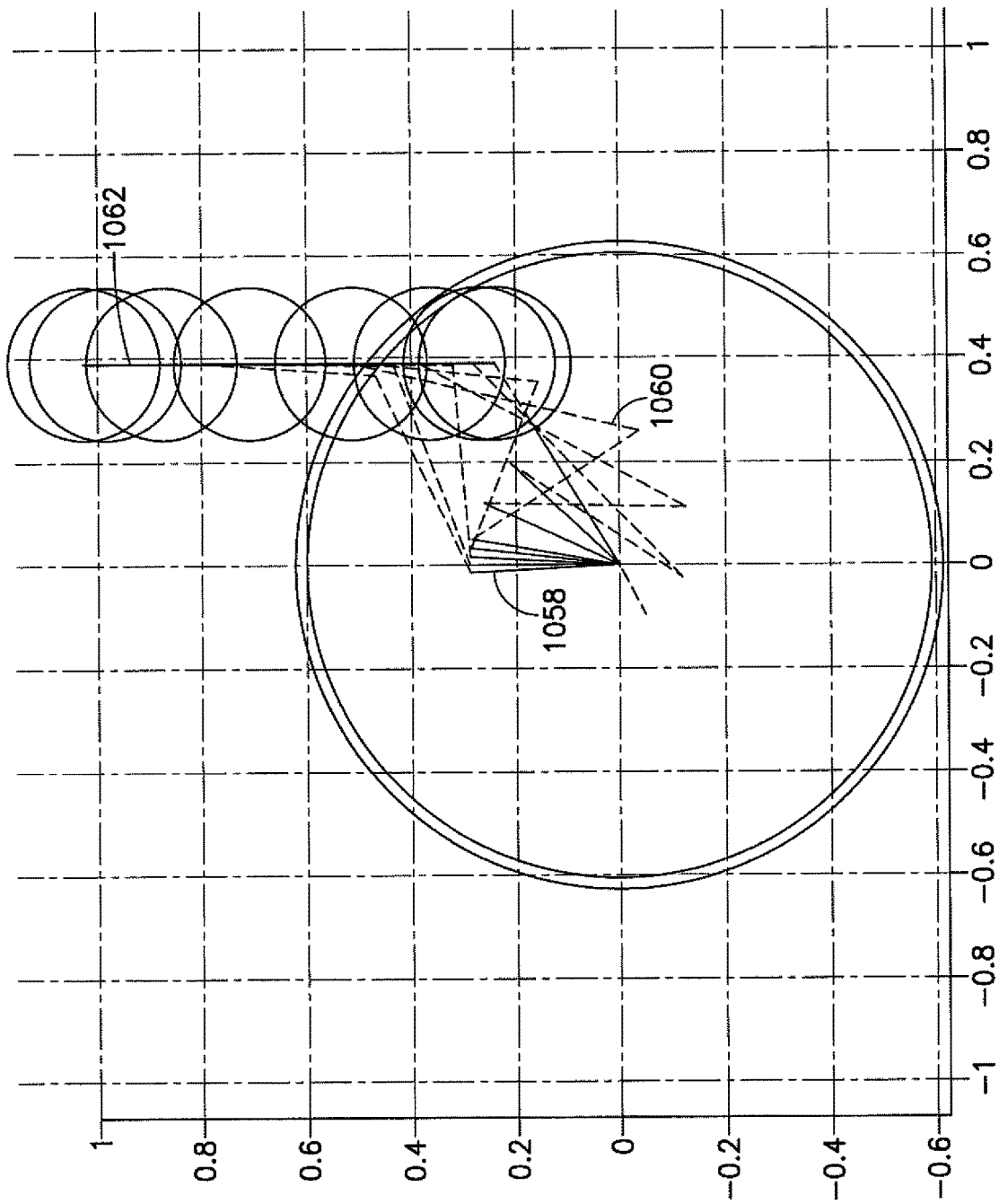
FIG. 44 is a top view of a transport apparatus.

An example phased motion of the robot arm mechanism as the end-effector of the robot arm mechanism extends along a straight path to the above example station is depicted in FIG. 44. In order for the end-effector of the robot arm mechanism to follow the example motion of FIG. 44, the shafts of the robot drive unit may be actuated as shown in the diagram 1150 in FIG. 45 showing T1 shaft position vs time 1152 and T2 shaft position vs time 1154.

Figure 46:
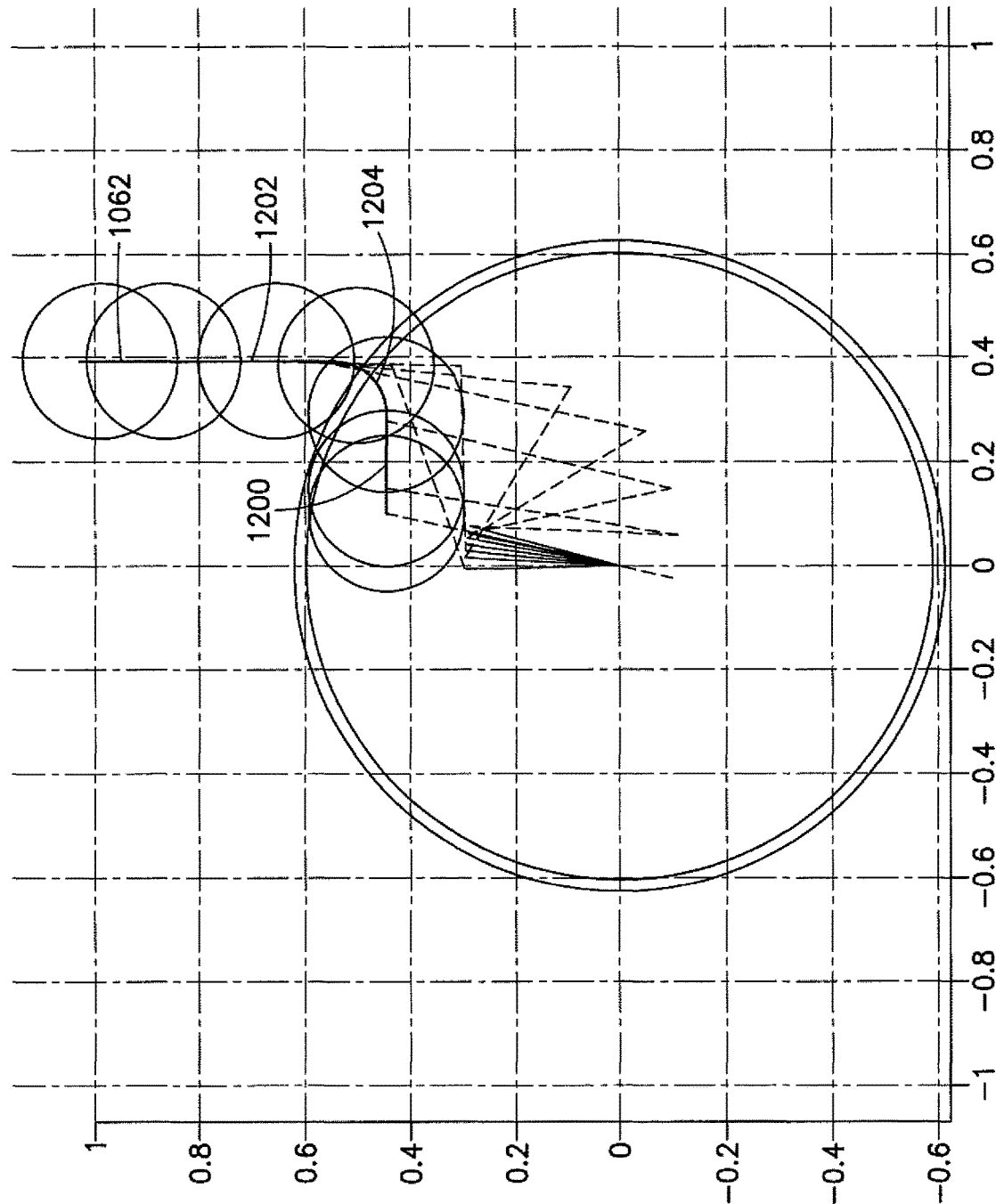
FIG. 46 is a top view of a transport apparatus.

Another example phased motion of the robot arm mechanism as the end-effector extends to the same example station, this time along a path formed by two segments 1200, 1202 blended around a common via-point 1204, is depicted in FIG. 46. In order to achieve the example motion of FIG. 46, the shafts of the robot drive unit may be rotated as shown in diagram 1250 in FIG. 47 showing T1 shaft position vs time 1252 and T2 shaft position vs time 1254.

Figure 45:
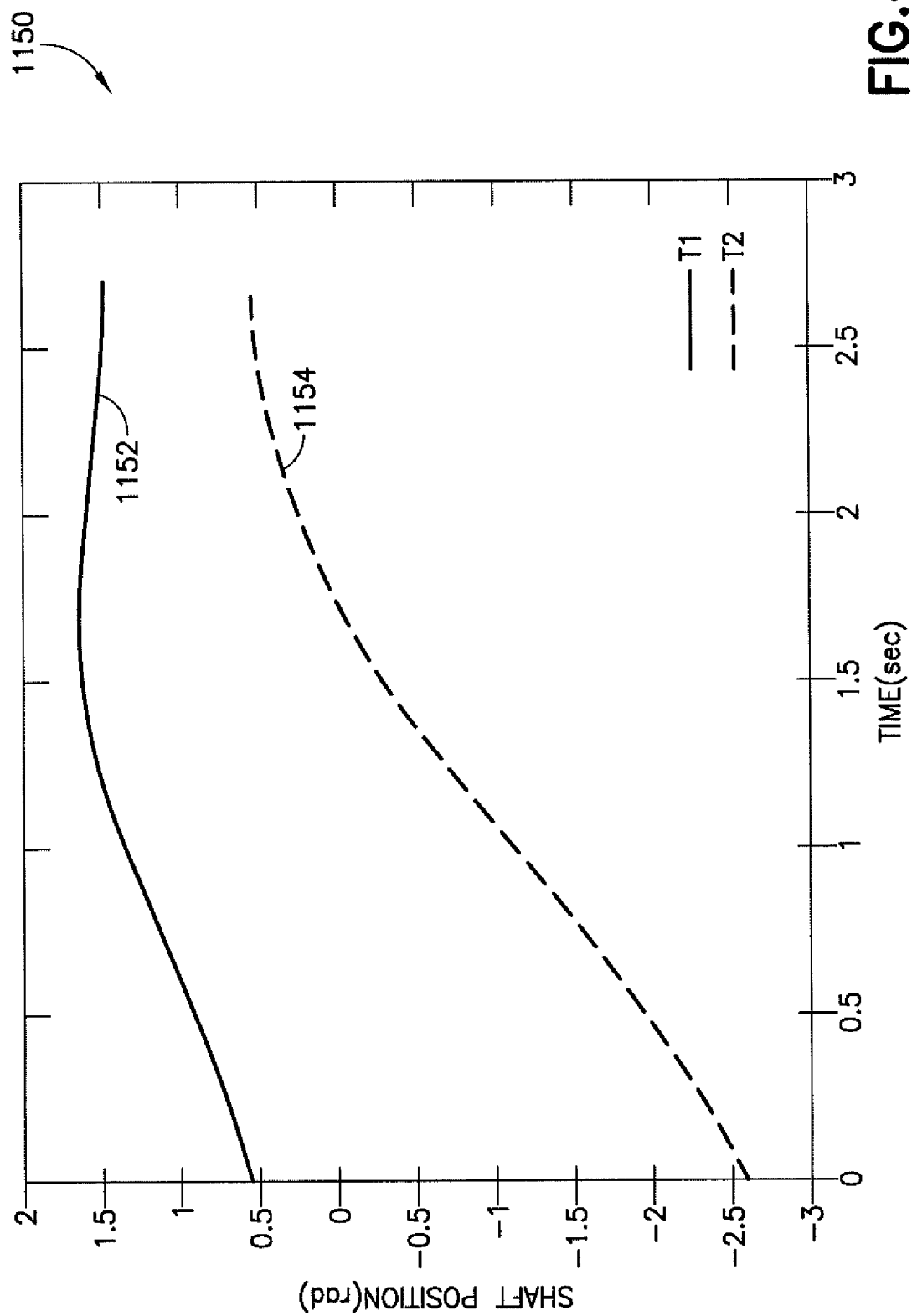
FIG. 45 is a diagram of shaft position trajectories.
Figure 47:
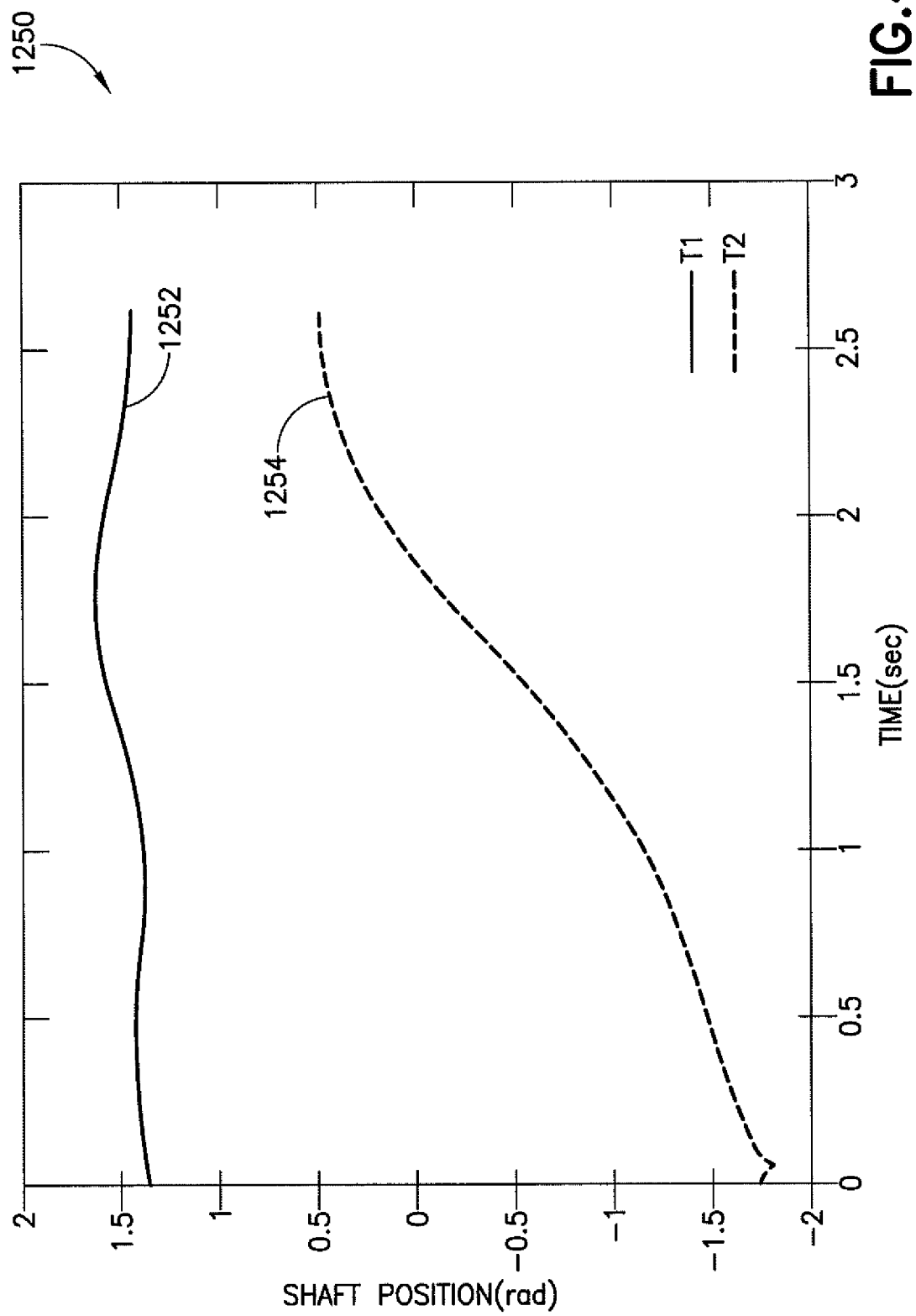
FIG. 47 is a diagram of shaft position trajectories.

In FIGS. 45 and 47, the zero point for the angles of the shafts of the robot drive unit is defined as follows: when the arm mechanism is in the folded pose (retracted pose) with the third link (end-effector) pointing along the x-axis (i.e., pointed at 3 o'clock), the T1 shaft angle is 0 deg and the T2 shaft angle is at 180 deg. The angle of the first link is 0 deg, the angle of the second link is 180 deg, and the angle of the third link (end-effector) is 0 deg in this situation.

Figure 48:
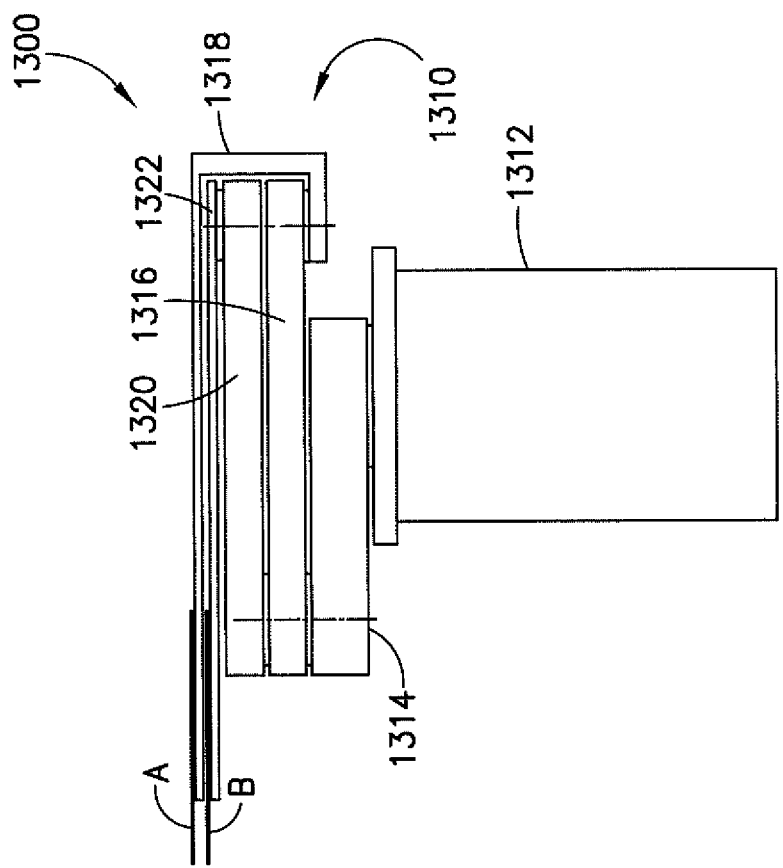
FIG. 48 is a side view of a transport apparatus.

FIG. 48 shows a diagram of a side view of a robot 300 with an example robot arm mechanism 1310 with two end-effectors installed on a robot drive unit 1312. The arm mechanism may consist of a first link 1314 (upper arm), a second link 1316 (forearm) A, a third link 1318 (end-effector) A, a second link 1320 (forearm) B and a third link 1322 (end-effector) B.

Figure 49A:
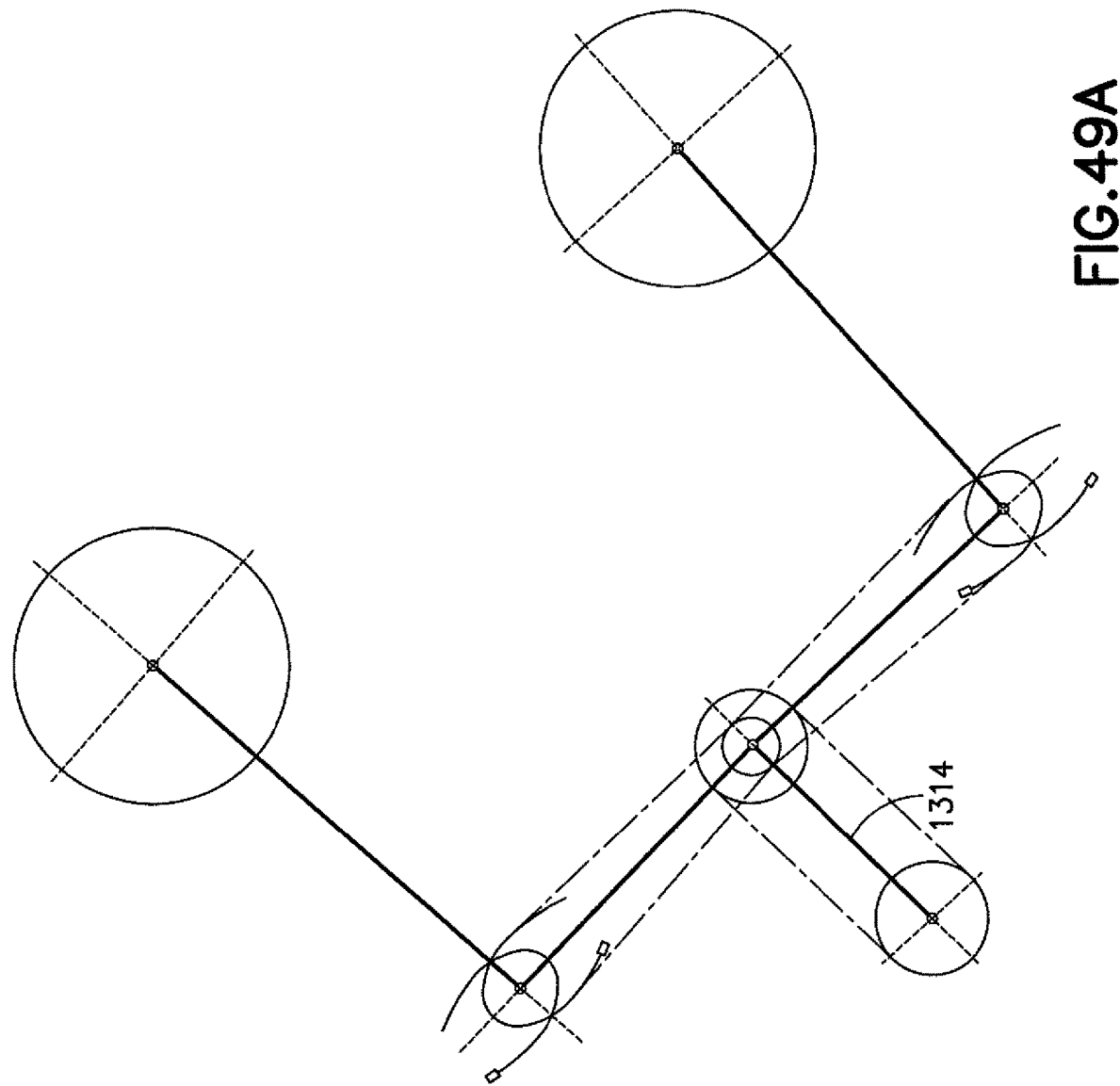
FIG. 49A is a top view of a transport apparatus.

An example internal arrangement of the robot of FIG. 48 is depicted diagrammatically in FIGS. 49A and 49B. The arm mechanism may be driven by a three-axis spindle with three coaxial shafts, for example, an outer T1 1340 shaft, a T2 shaft 1342 and an inner T3 shaft 1344. In some embodiments, the T2 shaft 1342 may be partially within the outer T1 1340 shaft, and the inner T3 shaft 1344 may be partially within the T2 shaft 1342. Orientation of end-effector A may be constrained by a band arrangement. The band arrangement may include an elbow pulley, which may be connected to the first link, and a wrist pulley, which may be connected to the support structure with end-effector A, and a band, belt or cable, which may transmit motion between the two pulleys. The band arrangement may feature a variable transmission ratio. The variable transmission ratio may be implemented, for instance, using at least one pulley with a non-circular profile. As an example, referring to FIG. 49, the wrist pulley may feature a non-circular profile and the elbow pulley may have a substantially circular profile. Similarly, orientation of end-effector B may be constrained by another band arrangement. The band arrangement may comprise an elbow pulley, which may be connected to the first link, a wrist pulley, which may be connected to end-effector B, and a band, belt or cable, which may transmit motion between the two pulleys. Again, the band arrangement may feature a variable transmission ratio. The variable transmission ratio may be implemented, for instance, using at least one pulley with a non-circular profile. As an example, referring to FIGS. 49A and 49B, the wrist pulley may feature a non-circular profile and the elbow pulley may have a substantially circular profile. The variable transmission ratios may be selected so that the orientation of each of the two the end-effectors changes in a predefined manner as a function of the relative position of the first link and the corresponding second link. For instance, it may be selected so that the end-effectors may follow a path to a station, as illustrated in FIG. 39. An example is discussed below.

A suitable geometry of the arm mechanism of FIGS. 48 and 49, i.e., the joint-to-joint link and end-effector lengths, may be determined based on the same guidelines as described above for the example 2-degree-of-freedom 3-link robot arm mechanism of FIG. 40.

Similarly, considering the example arm mechanism of FIGS. 40 and 41 where the orientation of the end-effectors may be constrained, as an example, by band arrangements with circular elbow pulleys and non-circular wrist pulleys, and assuming the example station locations and arm mechanism geometry selected earlier ($X_{stn}$=388.6 mm, $Y_{stn}$=1, 030.2 mm, L1=287.9 mm, L2A=L2B=L2=397.6 mm and L3A=L3B=L3=565.5 mm), the same profile as discussed earlier with respect to FIG. 4 may be used for the two wrist pulleys.

An example phased motion of the robot arm mechanism as end-effector A extends along a straight path 1440 to the above example station is depicted in FIG. 50. In this particular example, end-effector B along with second link B remain folded on top of the first link so that they stay within the allowable swing radius of the robot arm mechanism. In order for the robot arm mechanism to follow the example motion of FIG. 50, the shafts of the robot drive unit may be actuated according to the example motion profiles of diagram 490 of FIG. 51 showing T1 shaft position vs time 1492 and T2 shaft position vs time 1494 and T3 shaft position vs time 1496.

Figure 52:
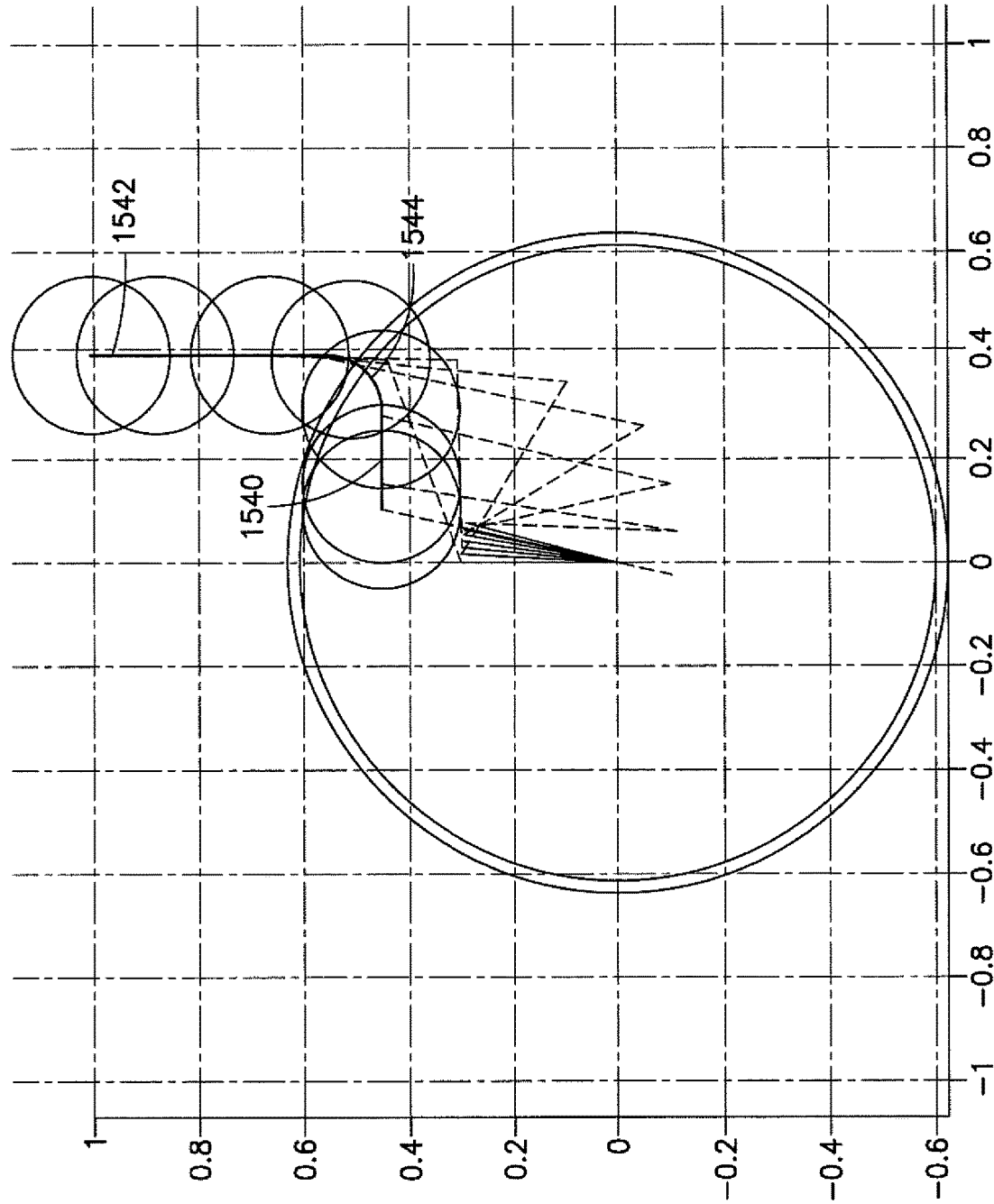
FIG. 52 is a top view of a transport apparatus.

Another example phased motion of the robot arm mechanism as end-effector A extends to the same example station, this time along a path formed by two segments 1540, 1542 blended around a common via-point 1544, is depicted in FIG. 52. In this example, the motion of second link B and, consequently, end-effector B, is controlled to limit the range of motion of the payload carried on end-effector B. In order to achieve the example motion of FIG. 52, the shafts of the robot drive unit may be rotated as shown in the example of diagram 1640 of FIG. 53 showing T1 shaft position vs time 1642 and T2 shaft position vs time 1644 and T3 shaft position vs time 1646.

Figure 51:
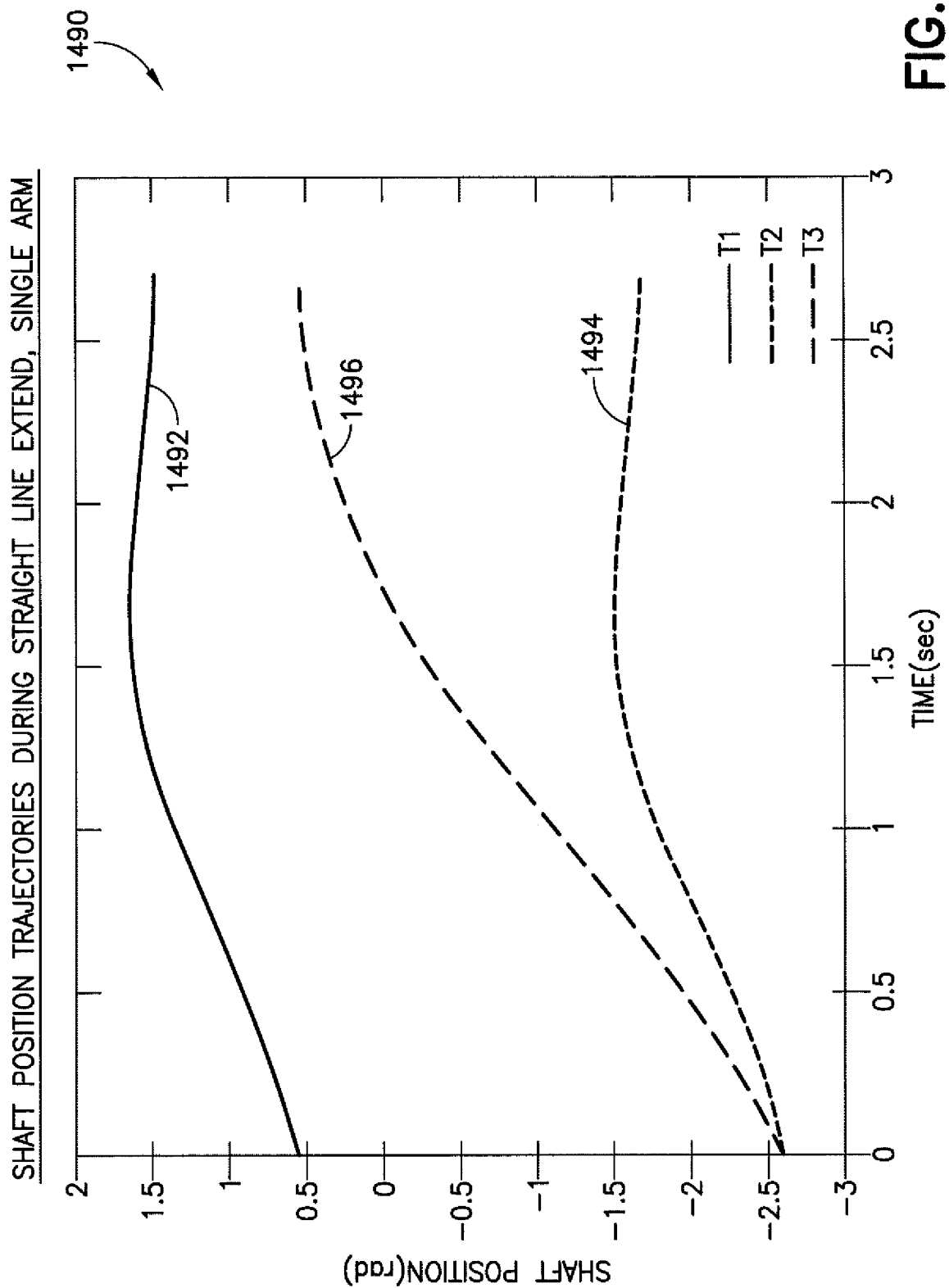
FIG. 51 is a diagram of shaft position trajectories.
Figure 53:
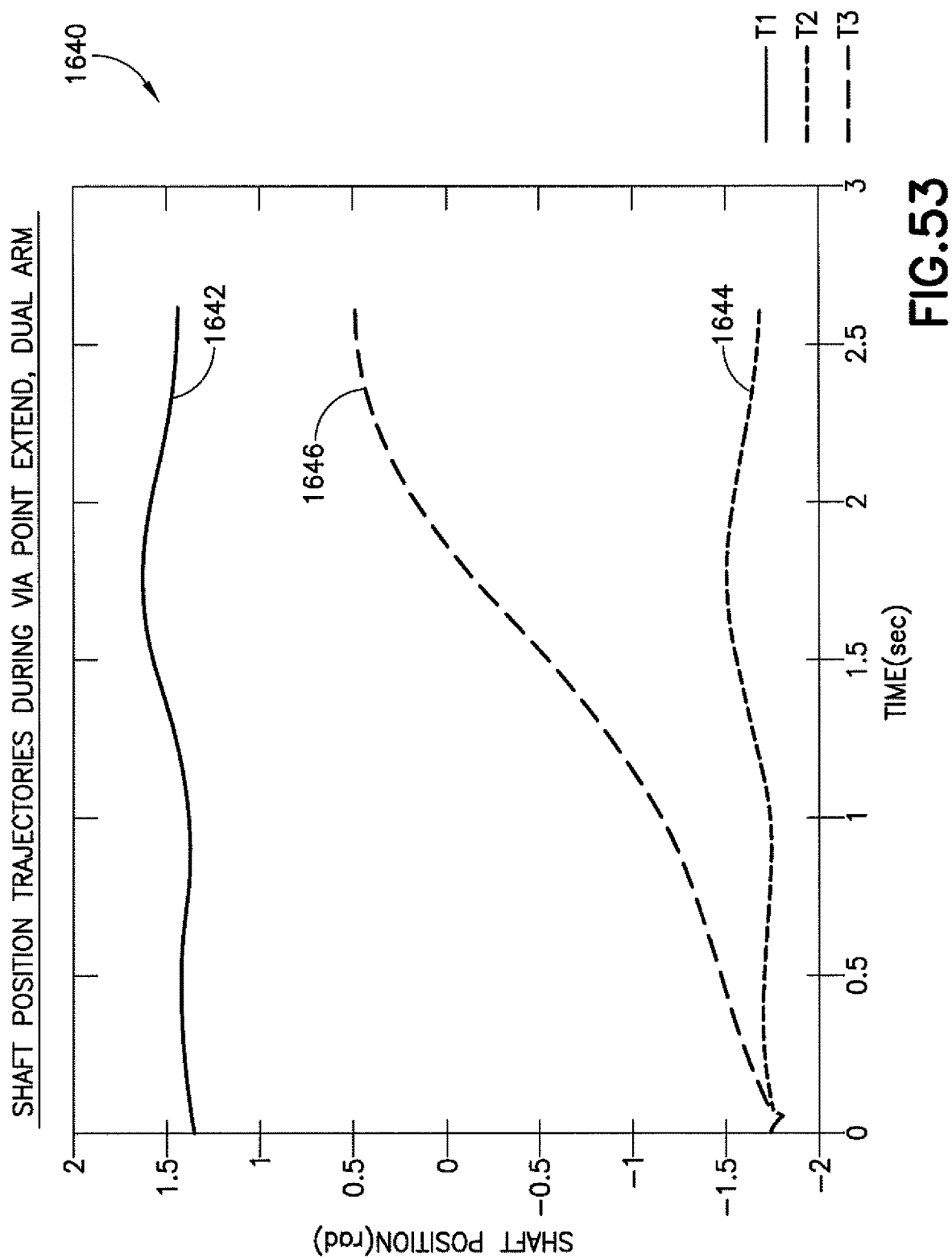
FIG. 53 is a diagram of shaft position trajectories.

In FIGS. 51 and 53, the zero point for the angles of the shafts of the robot drive unit is defined as follows: when the arm mechanism is in the folded pose (retracted pose) with the third links (end-effectors) A and B pointing along the x-axis (i.e., pointed at 3 o'clock), the T1 shaft angle is 0 deg while the T2 and T3 shaft angles are at 180 deg. The angle of the first link is 0 deg, the angles of the second links A and B are at 180 deg, and the angles of the third links (end-effectors) A and B are at 0 deg in this situation.

In accordance with one aspect, an apparatus has a drive unit having a first drive axis rotatable about a first axis of rotation and a second drive axis rotatable about a second axis of rotation, the second drive axis being coaxial with and partially within the first drive axis and axially rotatable within the first drive axis. A robot arm has an upper arm connected to the drive unit at the first drive axis, a forearm coupled to the upper arm, the forearm being coupled to the upper arm at a first rotary joint and rotatable about the first rotary joint, the first rotary joint being actuatable by a first band arrangement coupled to the second drive axis, and an end effector coupled to the forearm, the end effector being coupled to the forearm at a second rotary joint and rotatable about the second rotary joint, the second rotary joint being actuatable by a second band arrangement coupled to the first rotary joint. The second band arrangement is configured to provide a variable transmission ratio.

In accordance with another aspect, the first band arrangement comprises a shoulder pulley attached to the second drive axis, a first elbow pulley coupled to the forearm, and a band, belt, or cable arranged between the shoulder pulley and the first elbow pulley to transmit motion between the shoulder pulley and the first elbow pulley.

In accordance with another aspect, the second band arrangement comprises a second elbow pulley coupled to the upper arm, a wrist pulley coupled to the end effector, and a band, belt, or cable arranged between the second elbow pulley and the wrist pulley to transmit motion between the second elbow pulley and the wrist pulley.

In accordance with another aspect, at least one of the second elbow pulley and the wrist pulley have a non-circular profile to provide the variable transmission ratio.

In accordance with another aspect, the variable transmission ratio is selected such that orientation of the end effector changes in a predefined manner as a function of relative positions of the upper arm and forearm.

In accordance with another aspect, one or more of the first drive axis and the second drive axis are axially movable to facilitate vertical movement of the robot arm.

In accordance with another aspect, an apparatus has a drive unit having a first drive axis rotatable about a first axis of rotation, a second drive axis rotatable about a second axis of rotation, and a third drive axis rotatable about a third axis of rotation, the second drive axis being coaxial with and partially within the first drive axis and axially rotatable within the first drive axis, and the third drive axis being coaxial with and partially within the second drive axis and axially rotatable within the second drive axis. A robot arm has an upper arm connected to the drive unit at the first drive axis, a forearm coupled to the upper arm, the forearm being coupled to the upper arm at a first rotary joint and rotatable about the first rotary joint, the first rotary joint being actuatable by a single-stage band arrangement comprising a first shoulder pulley actuatable by the third drive axis, a first elbow pulley partially forming the first rotary joint, and a belt, band or cable configured to transmit motion between the first shoulder pulley and the first elbow pulley, a first end effector and a second end effector coupled to the forearm, the first end effector and the second end effector being coupled to the forearm at a second rotary joint, orientation of the first end effector and the second end effector being controlled via a two-stage band arrangement. A first stage of the two-stage band arrangement comprises a second shoulder pulley actuatable by the second drive axis, a second elbow pulley partially forming the first rotary joint, and an upper band, belt, or cable configured to transmit motion between the second shoulder pulley and the second elbow pulley. A second stage of the two-stage band arrangement comprises a third elbow pulley coupled to the second elbow pulley, a first wrist pulley coupled to the first end effector, and a first lower belt, band, or cable configured to transmit motion between the third elbow pulley and the first wrist pulley, and wherein the second stage of the two-stage band arrangement further comprises a fourth elbow pulley coupled to the second elbow pulley, a second wrist pulley coupled to the second effector, and a second lower belt, band, or cable configured to transmit motion between the fourth elbow pulley and the second wrist pulley. At least one of the motion between the first shoulder pulley and the first elbow pulley, the motion between the second shoulder pulley and the second elbow pulley, the motion between the third elbow pulley and the first wrist pulley, and the motion between the fourth elbow pulley and the second wrist pulley are at a variable transmission ratio.

In accordance with another aspect, at least one of the third elbow pulley and the first wrist pulley have a non-circular profile to provide the variable transmission ratio to the two-stage band arrangement.

In accordance with another aspect, at least one of the fourth elbow pulley and the second wrist pulley have a non-circular profile to provide the variable transmission ratio to the two-stage band arrangement.

In accordance with another aspect, at least one of the first lower belt, band, or cable and the second lower belt, band, or cable is configured in a crossover configuration.

In accordance with another aspect, the variable transmission ratio is selected such that orientations of the first end effector and the second end effector change in predefined manners as a function of relative positions of the upper arm and forearm and the second drive axis.

In accordance with another aspect, the first rotary joint is one of on a right hand side of an imaginary line extending from the first shoulder pulley to the first wrist pulley and on a left hand side of an imaginary line extending from the first shoulder pulley to the first wrist pulley.

In accordance with another aspect, an apparatus has a drive unit having a first drive axis rotatable about a first axis of rotation, a second drive axis rotatable about a second axis of rotation, and a third drive axis rotatable about a third axis of rotation, the second drive axis being coaxial with and partially within the first drive axis and axially rotatable within the first drive axis, and the third drive axis being coaxial with and partially within the second drive axis and axially rotatable within the second drive axis. A first robot arm has a first upper arm connected to the drive unit at the first drive axis, a first forearm coupled to the first upper arm, the first forearm being coupled to the first upper arm at a first rotary joint, the first rotary joint being actuatable by the second drive axis using a first band arrangement, and a first end effector coupled to the first forearm, the first end effector being coupled to the first forearm at a third rotary joint, the third rotary joint being actuatable by the first rotary joint using a third band arrangement. A second robot arm has a second upper arm connected to the drive unit at the third drive axis, a second forearm coupled to the second upper arm, the second forearm being coupled to the second upper arm at a second rotary joint, the second rotary joint being actuatable by the second drive axis using a second band arrangement, and a second end effector coupled to the second forearm, the second end effector being coupled to the second forearm at a fourth rotary joint, the fourth rotary joint being actuatable by the second rotary joint using a fourth band arrangement. At least one of the first band arrangement, the second band arrangement, the third band arrangement, and the fourth band arrangement has a variable transmission ratio.

In accordance with another aspect, the first band arrangement comprises a first shoulder pulley attached to the first drive axis, a first elbow pulley attached to the first forearm, and a first band, belt, or cable configured to transmit motion between the first shoulder pulley and the first elbow pulley.

In accordance with another aspect, at least one of the first shoulder pulley and the first elbow pulley have a non-circular profile to provide the variable transmission ratio to the first band arrangement.

In accordance with another aspect, the third band arrangement comprises a second elbow pulley operable with the first elbow pulley, a first wrist pulley coupled to the first end effector, and a third band, belt, or cable configured to transmit motion between the second elbow pulley and the first wrist pulley.

In accordance with another aspect, at least one of the second elbow pulley and the first wrist pulley have a non-circular profile to provide the variable transmission ratio to the third band arrangement.

In accordance with another aspect, the second band arrangement comprises a second shoulder pulley attached to the third drive axis, a third elbow pulley attached to the second forearm, and a second band, belt, or cable configured to transmit motion between the second shoulder pulley and the third elbow pulley.

In accordance with another aspect, at least one of the second shoulder pulley and the third elbow pulley have a non-circular profile to provide the variable transmission ratio to the second band arrangement.

In accordance with another aspect, the fourth band arrangement comprises a fourth elbow pulley operable with the third elbow pulley, a second wrist pulley coupled to the second end effector, and a fourth band, belt, or cable configured to transmit motion between the fourth elbow pulley and the second wrist pulley.

In accordance with another aspect, at least one of the fourth elbow pulley and the second wrist pulley have a non-circular profile to provide the variable transmission ratio to the fourth band arrangement.

In accordance with another aspect, the variable transmission ratio is selected such that orientations of the first end effector change in predefined manners as a function of relative positions of the first upper arm and first forearm.

In accordance with another aspect, a transmission ratio of the first band arrangement and a transmission ratio of the third band arrangement are selected such that a center point on the first end effector is configured to follow a predetermined path with a predetermined orientation of the first end effector when the first upper arm is actuated by the first drive axis and the second drive axis is stationary.

In accordance with another aspect, the variable transmission ratio is selected such that orientations of the second end effector change in predefined manners as a function of relative positions of the second upper arm and second forearm.

In accordance with another aspect, a transmission ratio of the second band arrangement and a transmission ratio of the fourth band arrangement are selected such that a center point on the second end effector is configured to follow a predetermined path with a predetermined orientation of the second end effector when the second upper arm is actuated by the third drive axis and the second drive axis is stationary.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A transport apparatus, comprising:
a drive unit having a first drive axis rotatable about a first axis of rotation and a second drive axis rotatable about a second axis of rotation, the second drive axis being coaxial with and partially within the first drive axis and axially rotatable within the first drive axis;
a robot arm comprising:
an upper arm connected to the drive unit at the first drive axis,
a forearm coupled to the upper arm, the forearm being coupled to the upper arm at a first rotary joint and rotatable about the first rotary joint, the first rotary joint being actuatable by a first band arrangement coupled to the second drive axis, and
an end effector coupled to the forearm, the end effector being coupled to the forearm at a second rotary joint and rotatable about the second rotary joint, the second rotary joint being actuatable by a second band arrangement which comprises at least one pulley with a non-circular profile and is coupled to the first rotary joint, wherein the second band arrangement is configured to provide a variable transmission ratio,
where the variable transmission ratio is selected so that the orientation of the end-effector is configured to change in a predefined manner as a function of position of the forearm relative to the upper arm, and where the variable transmission ratio is selected in a manner that allow a reference point on the end effector to follow a predetermined path with a predetermined and changed orientation of the end effector when the upper arm and the forearm are actuated accordingly.

2. The apparatus of claim 1, wherein the first band arrangement comprises a shoulder pulley attached to the second drive axis, a first elbow pulley coupled to the forearm, and a band, belt, or cable arranged between the shoulder pulley and the first elbow pulley to transmit motion between the shoulder pulley and the first elbow pulley.

3. The apparatus of claim 1, wherein the second band arrangement comprises a second elbow pulley coupled to the upper arm, a wrist pulley coupled to the end effector, and a band, belt, or cable arranged between the second elbow pulley and the wrist pulley to transmit motion between the second elbow pulley and the wrist pulley.

4. The apparatus of claim 3, wherein at least one of the second elbow pulley and the wrist pulley have a non-circular profile to provide the variable transmission ratio.

5. The apparatus of claim 1, wherein the variable transmission ratio is selected such that orientation of the end effector changes in a predefined manner as a function of relative positions of the upper arm and forearm.

6. The apparatus of claim 1, wherein one or more of the first drive axis and the second drive axis are axially movable to facilitate vertical movement of the robot arm.

7. A transport apparatus, comprising:
a drive unit having a first drive axis rotatable about a first axis of rotation, a second drive axis rotatable about a second axis of rotation, and a third drive axis rotatable about a third axis of rotation, the second drive axis being coaxial with and partially within the first drive axis and axially rotatable within the first drive axis, and the third drive axis being coaxial with and partially within the second drive axis and axially rotatable within the second drive axis;
a first robot arm comprising:
a first upper arm connected to the drive unit at the first drive axis,
a first forearm coupled to the first upper arm, the first forearm being coupled to the first upper arm at a first rotary joint, the first rotary joint being actuatable by the second drive axis using a first band arrangement, and
a first and effector coupled to the first forearm, the first end effector being coupled to the first forearm at a third rotary joint, the third rotary joint being actuatable by the first rotary joint using a third band arrangement; and
a second robot arm comprising:
a second upper arm connected to the drive unit at the third drive axis,
a second forearm coupled to the second upper arm, the second forearm being coupled to the second upper arm at a second rotary joint, the second rotary joint being actuatable by the second drive axis using a second band arrangement, and
a second end effector coupled to the second forearm, second end effector being coupled to the second forearm at a fourth rotary joint, the fourth rotary joint being actuatable by the second rotary joint using a fourth band arrangement,
wherein at least one of the first band arrangement, the second band arrangement, the third band arrangement, and the fourth band arrangement comprises at least one pulley with a non-circular profile and has a variable transmission ratio.

8. The apparatus of claim 7, wherein the first band arrangement comprises a first shoulder pulley attached to the first drive axis, a first elbow pulley attached to the first forearm, and a first band, belt, or cable configured to transmit motion between the first shoulder pulley and the first elbow pulley.

9. The apparatus of claim 8, wherein at least one of the first shoulder pulley and the first elbow pulley have a non-circular profile to provide the variable transmission ratio to the first band arrangement.

10. The apparatus of claim 8, wherein the third band arrangement comprises a second elbow pulley operable with the first elbow pulley, a first wrist pulley coupled to the first end effector, and a third band, belt, or cable configured to transmit motion between the second elbow pulley and the first wrist pulley.

11. The apparatus of claim 10, wherein at least one of the second elbow pulley and the first wrist pulley have a non-circular profile to provide the variable transmission ratio to the third band arrangement.

12. The apparatus of claim 7, wherein the second band arrangement comprises a second shoulder pulley attached to the third drive axis, a third elbow pulley attached to the second forearm, and a second band, belt, or cable configured to transmit motion between the second shoulder pulley and the third elbow pulley.

13. The apparatus of claim 12, wherein at least one of the second shoulder pulley and the third elbow pulley have a non-circular profile to provide the variable transmission ratio to the second band arrangement.

14. The apparatus of claim 12, wherein the fourth band arrangement comprises a fourth elbow pulley operable with the third elbow pulley, a second wrist pulley coupled to the second end effector, and a fourth band, belt, or cable configured to transmit motion between the fourth elbow pulley and the second wrist pulley.

15. The apparatus of claim 14, wherein at least one of the fourth elbow pulley and the second wrist pulley have a non-circular profile to provide the variable transmission ratio to the fourth band arrangement.

16. The apparatus of claim 7, wherein the variable transmission ratio is selected such that orientations of the first end effector change in predefined manners as a function of relative positions of the first upper arm and first forearm.

17. The apparatus of claim 16, wherein a transmission ratio of the first band arrangement and a transmission ratio of the third band arrangement are selected such that a center point on the first end effector is configured to follow a predetermined path with a predetermined orientation of the first end effector when the first upper arm is actuated by the first drive axis and the second drive axis is stationary.

18. The apparatus of claim 7, wherein the variable transmission ratio is selected such that orientations of the second end effector change in predefined manners as a function of relative positions of the second upper arm and second forearm.

19. The apparatus of claim 18, wherein a transmission ratio of the second band arrangement and a transmission ratio of the fourth band arrangement are selected such that a center point on the second end effector is configured to follow a predetermined path with a predetermined orientation of the second end effector when the second upper arm is actuated by the third drive axis and the second drive axis is stationary.

\* \* \* \* \*